US012660656B2

(12) United States Patent
Chang et al.

(10) Patent No.: US 12,660,656 B2
(45) Date of Patent: Jun. 16, 2026

(54) PACKAGED INTERCONNECT STRUCTURES

(71) Applicant: Taiwan Semiconductor Manufacturing Company, Ltd., Hsinchu (TW)

(72) Inventors: Kai-Fung Chang, Taipei City (TW); Chin-Wei Liang, Zhubei City (TW); Sheng-Feng Weng, Taichung City (TW); Ming-Yu Yen, Miaoli County (TW); Cheyu Liu, Hsinchu County (TW); Hung-Chih Chen, Hsinchu City (TW); Yi-Yang Lei, Taichung (TW); Ching-Hua Hsieh, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 444 days.

(21) Appl. No.: 18/306,702

(22) Filed: Apr. 25, 2023

(65) Prior Publication Data

US 2024/0113032 A1     Apr. 4, 2024

Related U.S. Application Data

(60) Provisional application No. 63/377,858, filed on Sep. 30, 2022.

(51) Int. Cl.
*H10W 70/65*          (2026.01)
*H10W 70/05*          (2026.01)
(Continued)

(52) U.S. Cl.
CPC ......... *H10W 70/65* (2026.01); *H10W 70/093* (2026.01); *H10W 70/095* (2026.01);
(Continued)

(58) Field of Classification Search
CPC . H01L 2221/68331; H01L 2221/68345; H01L 2221/68359; H01L 2924/1533;
(Continued)

(56) References Cited

U.S. PATENT DOCUMENTS

| 11,756,933 B2 | 9/2023 | Chen et al. |
| 2012/0326319 A1* | 12/2012 | Yu ..................... H01L 21/76877 |
| | | 257/E21.597 |

(Continued)

FOREIGN PATENT DOCUMENTS

TW          202232613 A        8/2022

*Primary Examiner* — Marlon T Fletcher
*Assistant Examiner* — Christina A Sylvia
(74) *Attorney, Agent, or Firm* — Harrity & Harrity, LLP

(57)          ABSTRACT

Interconnect structure packages (e.g., through silicon vias (TSV) packages, through interlayer via (TIV) packages) may be pre-manufactured as opposed to forming TIVs directly on a carrier substrate during a manufacturing process for a semiconductor die package at backend packaging facility. The interconnect structure packages may be placed onto a carrier substrate during manufacturing of a semiconductor device package, and a semiconductor die package may be placed on the carrier substrate adjacent to the interconnect structure packages. A molding compound layer may be formed around and in between the interconnect structure packages and the semiconductor die package.

20 Claims, 58 Drawing Sheets

(51) Int. Cl.

| | |
|---|---|
| *H10W 70/60* | (2026.01) |
| *H10W 70/69* | (2026.01) |
| *H10W 74/01* | (2026.01) |
| *H10W 74/10* | (2026.01) |
| *H10W 90/00* | (2026.01) |

(52) U.S. Cl.

CPC .......... *H10W 70/611* (2026.01); *H10W 70/69* (2026.01); *H10W 74/016* (2026.01); *H10W 74/117* (2026.01); *H10W 74/121* (2026.01); *H10W 90/00* (2026.01); *H10W 90/401* (2026.01); *H10W 90/701* (2026.01); *H10W 70/60* (2026.01); *H10W 90/722* (2026.01)

(58) Field of Classification Search

CPC ..... H01L 2225/1023; H01L 2225/1041; H01L 2225/1058; H01L 2225/1035; H01L 24/24; H01L 24/19; H01L 24/20; H01L 21/4853; H01L 21/486; H01L 21/565; H01L 21/6835; H01L 23/5386; H01L 23/3128; H01L 23/5389; H01L 23/3135; H01L 23/49816; H01L 23/49833; H01L 23/49838; H01L 23/49894; H01L 23/5385; H01L 23/49827

See application file for complete search history.

(56) References Cited

U.S. PATENT DOCUMENTS

| | | | | |
|---|---|---|---|---|
| 2014/0103527 A1* | 4/2014 | Marimuthu | ........... | H01L 21/486 257/737 |
| 2017/0148674 A1* | 5/2017 | Lu | ........................ | H01L 21/3212 |
| 2018/0122764 A1* | 5/2018 | Chen | ........................ | H01L 24/18 |
| 2019/0047845 A1* | 2/2019 | Lin | ........................ | H01L 23/552 |

\* cited by examiner

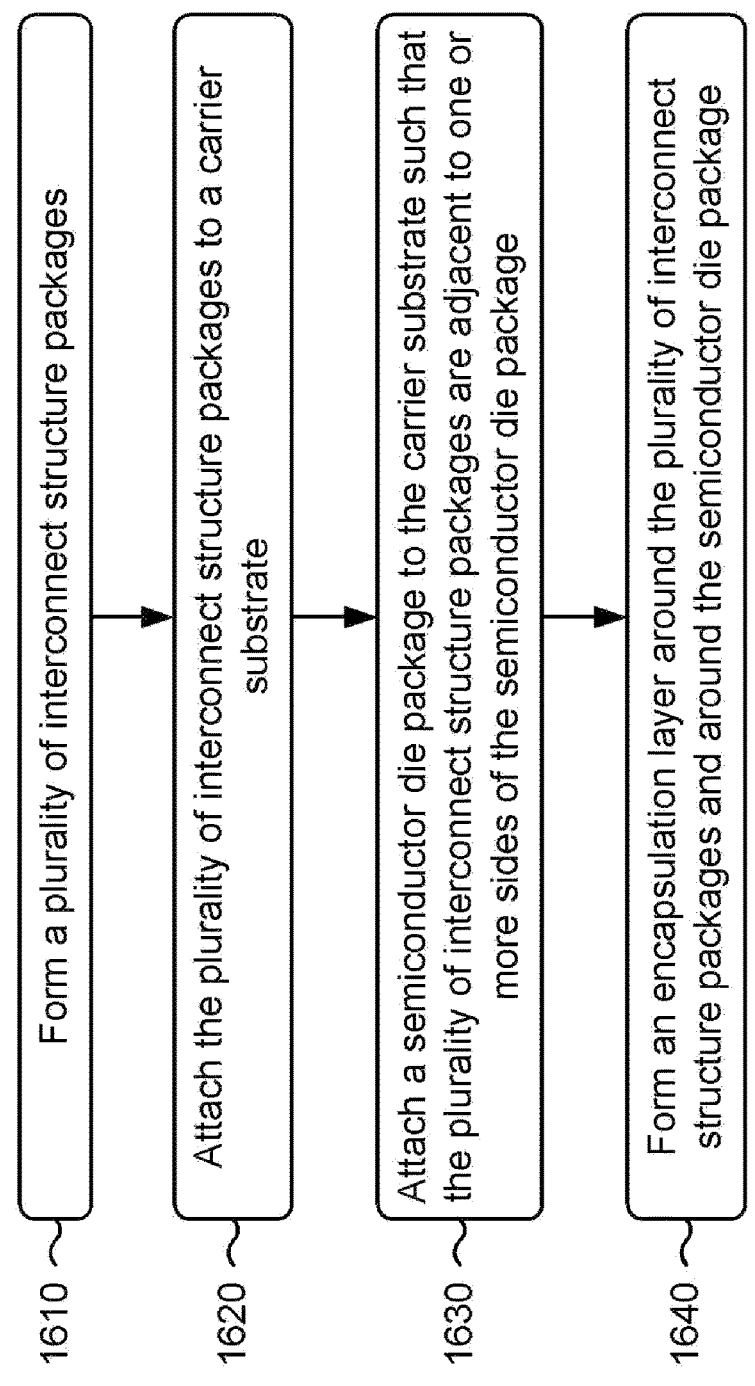

1610    Form a plurality of interconnect structure packages

1620    Attach the plurality of interconnect structure packages to a carrier substrate 1630    Attach a semiconductor die package to the carrier substrate such that the plurality of interconnect structure packages are adjacent to one or more sides of the semiconductor die package 1640    Form an encapsulation layer around the plurality of interconnect structure packages and around the semiconductor die package

PACKAGED INTERCONNECT STRUCTURES

CROSS-REFERENCE TO RELATED APPLICATION

This patent application claims priority to U.S. Provisional Patent Application No. 63/377,858, filed on Sep. 30, 2022, entitled "PACKAGED INTERCONNECT STRUC-TURES," which is hereby expressly incorporated by reference herein.

BACKGROUND

Various semiconductor device packing techniques may be used to incorporate one or more semiconductor dies into a semiconductor device package. In some cases, semiconductor dies may be stacked in a semiconductor device package to achieve a smaller horizontal or lateral footprint of the semiconductor device package and/or to increase the density of the semiconductor device package. Semiconductor device packing techniques that may be performed to integrate a plurality of semiconductor dies in a semiconductor device package may include integrated fanout (InFO), package on package (PoP), chip on wafer (CoW), wafer on wafer (WoW), and/or chip on wafer on substrate (CoWoS), among other examples.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 6A and 6B are diagrams of example implementations of a semiconductor device package described herein.

FIG. 16 is a flowchart of an example process associated with forming a semiconductor device package that includes a plurality of interconnect structure packages.

DETAILED DESCRIPTION

Figure 1:
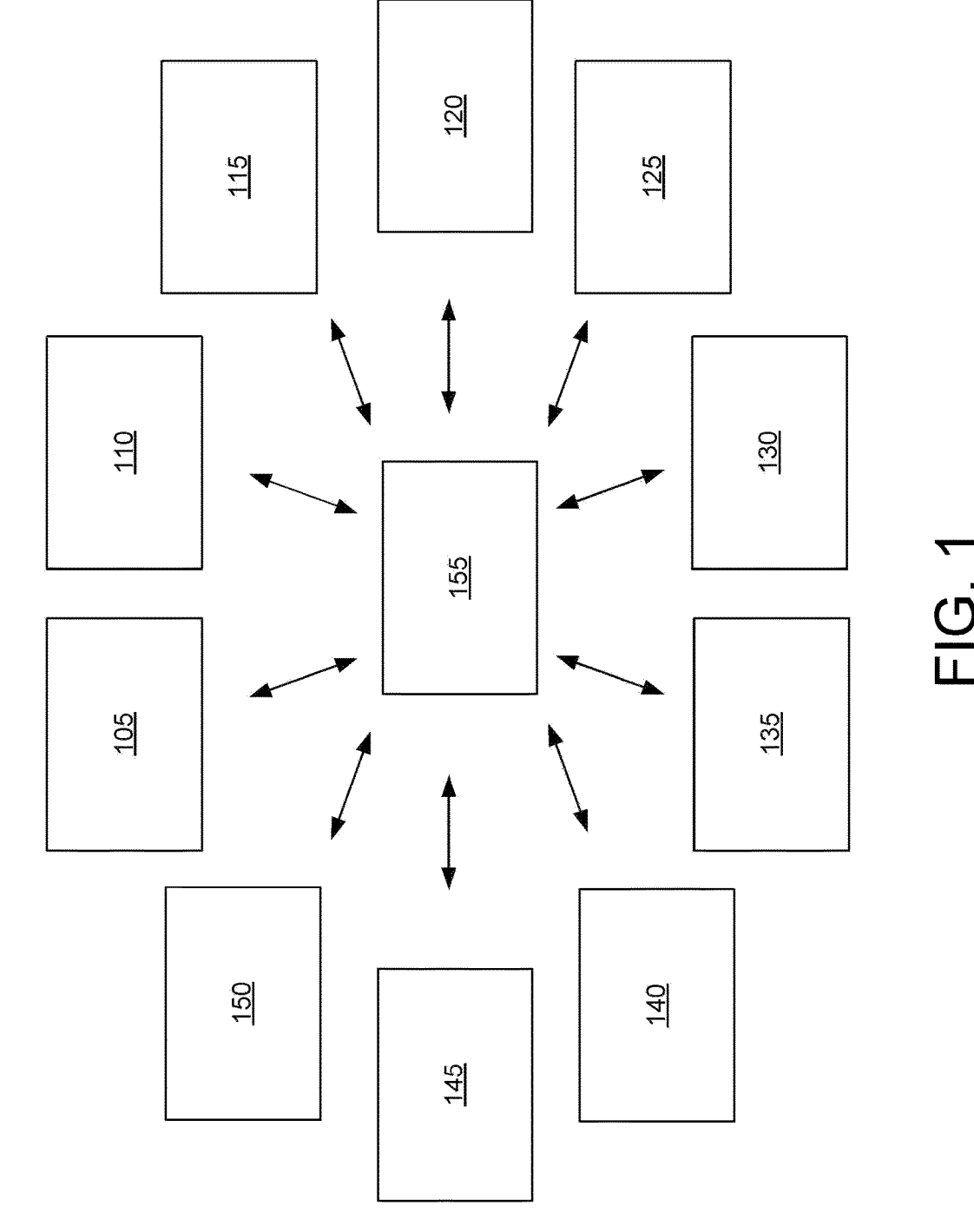
FIG. 1 is a diagram of an example environment in which systems and/or methods described herein may be implemented.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In a package on package (PoP) process flow for forming a semiconductor device package, a bottom semiconductor die package may be attached to a redistribution structure. A top semiconductor die package may be mounted above the bottom semiconductor die package to (either directly or by another redistribution structure) by through interlayer via vias (TIVs). The TIVs may expend through an encapsulation layer (e.g., molding compound layer) that surrounds the bottom semiconductor die package.

In some cases, voids may occur in the encapsulation layer due to the tight spacing of adjacent TIVs. The likelihood of voids may increase as the spacing between adjacent TIVs is reduced to enable increased density in the semiconductor device package. Moreover, voids may occur in a die attach film that is used to attach the bottom semiconductor die package to the redistribution structure, which may result in reduced structural integrity for the semiconductor device package, reduced heat dissipation in the semiconductor device package, and/or increased operating temperatures for the bottom semiconductor die package, among other examples.

In some implementations described herein, interconnect structure packages (e.g., through silicon vias (TSV) packages, TIV packages) may be pre-manufactured as opposed to forming TIVs directly on a carrier substrate during a manufacturing process for a semiconductor die package at backend packaging facility. The interconnect structure packages may be placed onto a carrier substrate during manufacturing of a semiconductor device package, and a bottom semiconductor die package may be placed on the carrier substrate adjacent to the interconnect structure packages. A molding compound layer may be formed around and in between the interconnect structure packages and the bottom semiconductor die package.

Pre-manufacturing the interconnect structure packages may enable the interconnects of the interconnect structure packages to be formed to smaller dimensions and greater density in that pre-manufacturing the interconnect structure packages is not subjected to process variations that may occur in backend packaging. Moreover, pre-manufacturing the interconnect structure packages may enable the interconnects of the interconnect structure packages to be formed using more precise processing techniques and, in some cases, frontend semiconductor processing techniques, which may reduce the likelihood of void formation (and other defect formation) between the interconnect structures. In addition, pre-manufacturing the interconnect structure packages may reduce processing times and cost for manufacturing a semiconductor device package in that fewer processing operations are needed to place the interconnect structure packages in the semiconductor device package than forming interconnect structures in the semiconductor device package.

FIG. 1 is a diagram of an example environment 100 in which systems and/or methods described herein may be implemented. As shown in FIG. 1, environment 100 may include a plurality of semiconductor processing tool sets 105-150 and a transport tool set 155. The plurality of semiconductor processing tool sets 105-150 may include a redistribution layer (RDL) tool set 105, a planarization tool set 110, an connection tool set 115, an automated test equipment (ATE) tool set 120, a singulation tool set 125, a die-attach tool set 130, an encapsulation tool set 135, a printed circuit board (PCB) tool set 140, a surface mount (SMT) tool set 145, and a finished goods tool set 150. The semiconductor processing tool sets 105-150 of example environment 100 may be included in one or more facilities, such as a semiconductor clean or semi-clean room, a semiconductor foundry, a semiconductor processing facility, an outsourced assembly and test (OSAT) facility, and/or a manufacturing facility, among other examples.

In some implementations, the semiconductor processing tool sets 105-150, and operations performed by the semiconductor processing tool sets 105-150, are distributed across multiple facilities. Additionally, or alternatively, one or more of the semiconductor processing tool sets 105-150 may be subdivided across the multiple facilities. Sequences of operations performed by the semiconductor processing tool sets 105-150 may vary based on a type of the semiconductor package or a state of completion of the semiconductor package.

One or more of the semiconductor processing tool sets 105-150 may perform a combination of operations to assemble a semiconductor package (e.g., attach one or more IC dies to a substrate, where the substrate provides an external connectivity to a computing device, among other examples). Additionally, or alternatively, one or more of the semiconductor processing tool sets 105-150 may perform a combination of operations to ensure a quality and/or a reliability of the semiconductor package (e.g., test and sort the one or more IC dies, and/or the semiconductor package, at various stages of manufacturing).

The semiconductor package may correspond to a type of semiconductor package. For example, the semiconductor package may correspond to a flipchip (FC) type of semiconductor package, a ball grid array (BGA) type of semiconductor package, a multi-chip package (MCP) type of semiconductor package, or a chip scale package (CSP) type of semiconductor package. Additionally, or alternatively, the semiconductor package may correspond to a plastic leadless chip carrier (PLCC) type of semiconductor package, a system-in-package (SIP) type of semiconductor package, a ceramic leadless chip carrier (CLCC) type of semiconductor package, or a thin small outline package (TSOP) type of semiconductor package, among other examples.

The RDL tool set 105 includes one or more tools capable of forming one or more layers and patterns of materials (e.g., dielectric layers, conductive redistribution layers, and/or vertical connection access structures (vias), among other examples) on a semiconductor substrate (e.g., a semiconductor wafer, among other examples). The RDL tool set 105 may include a combination of one or more photolithography tools (e.g., a photolithography exposure tool, a photoresist dispense tool, a photoresist develop tool, among other examples), a combination of one or more etch tools (e.g., a plasma-based etched tool, a dry-etch tool, or a wet-etch tool, among other examples), and one or more deposition tools (e.g., a chemical vapor deposition (CVD) tool, a physical vapor deposition (PVD) tool, an atomic layer deposition (ALD) tool, or a plating tool, among other examples). In some implementations, the example environment 100 includes a plurality of types of such tools as part of RDL tool set 105.

The planarization tool set 110 includes one or more tools that are capable of polishing or planarizing various layers of the semiconductor substrate (e.g., the semiconductor wafer). The planarization tool set 110 may also include tools capable of thinning the semiconductor substrate. The planarization tool set 110 may include a chemical mechanical planarization (CMP) tool or a lapping tool, among other examples. In some implementations, the example environment 100 includes a plurality of types of such tools as part of the planarization tool set 110.

The connection tool set 115 includes one or more tools that are capable of forming connection structures (e.g., electrically-conductive structures) as part of the semiconductor package. The connection structures formed by the connection tool set 115 may include a wire, a stud, a pillar, a bump, or a solderball, among other examples. The connection structures formed by the connection tool set 115 may include materials such as a gold (Au) material, a copper (Cu) material, a silver (Ag) material, a nickel (Ni) material, a tin (Sn) material, or a palladium (Pd) material, among other examples. The connection tool set 115 may include a bumping tool, a wirebond tool, or a plating tool, among other examples. In some implementations, the example environment 100 includes a plurality of types of such tools as part of the connection tool set 115.

The ATE tool set 120 includes one or more tools that are capable of testing a quality and a reliability of the one or more IC dies and/or the semiconductor package (e.g., the one or more IC dies after encapsulation). The ATE tool set 120 may perform wafer testing operations, known good die (KGD) testing operations, semiconductor package testing operations, or system-level (e.g., a circuit board populated with one or more semiconductor packages and/or one or more IC dies) testing operations, among other examples.

The ATE tool set 120 may include a parametric tester tool, a speed tester tool, and/or a burn-in tool, among other examples. Additionally, or alternatively, the ATE tool set 120 may include a prober tool, probe card tooling, test interface tooling, test socket tooling, a test handler tool, burn-in board tooling, and/or a burn-in board loader/unloader tool, among other examples. In some implementations, the example environment 100 includes a plurality of types of such tools as part of the ATE tool set 120.

The singulation tool set 125 includes one or more tools that are capable of singulating (e.g., separating, removing) the one or more IC dies or the semiconductor package from a carrier. For example, the singulation tool set 125 may include a dicing tool, a sawing tool, or a laser tool that cuts the one or more IC dies from the semiconductor substrate. Additionally, or alternatively, the singulation tool set 125 may include a trim-and-form tool that excises the semiconductor package from a leadframe. Additionally, or alternatively, the singulation tool set 125 may include a router tool or a laser tool that removes the semiconductor package from a strip or a panel of an organic substrate material, among other examples. In some implementations, the example environment 100 includes a plurality of types of such tools as part of the singulation tool set 125.

The die-attach tool set 130 includes one or more tools that are capable of attaching the one or more IC dies to the interposer, the leadframe, and/or the strip of the organic substrate material, among other examples. The die-attach tool set 130 may include a pick-and-place tool, a taping tool, a reflow tool (e.g., a furnace), a soldering tool, or an epoxy dispense tool, among other examples. In some implementations, the example environment 100 includes a plurality of types of such tools as part of the die-attach tool set 130.

The encapsulation tool set 135 includes one or more tools that are capable of encapsulating the one or more IC dies (e.g., the one or more IC dies attached to the interposer, the leadframe, or the strip of organic substrate material). For example, the encapsulation tool set 135 may include a molding tool that encapsulates the one or more IC dies in a plastic molding compound. Additionally, or alternatively, the encapsulation tool set 135 may include a dispense tool that dispenses an epoxy polymer underfill material between the one or more IC dies and an underlying surface (e.g., the interposer or the strip of organic substrate material, among other examples). In some implementations, the example environment 100 includes a plurality of types of such tools as part of the encapsulation tool set 135.

The PCB tool set 140 incudes one or more tools that are capable of forming a PCB having one or more layers of electrically-conductive traces. The PCB tool set 140 may form a type of PCB, such as a single layer PCB, a multi-layer PCB, or a high density interconnect (HDI) PCB, among other examples. In some implementations, the PCB tool set 140 forms the interposer and/or the substrate using one or more layers of a buildup film material and/or fiberglass reinforced epoxy material. The PCB tool set 140 may include a laminating tool, a plating tool, a photoengraving tool, a laser cutting tool, a pick-and-place tool, an etching tool, a dispense tool, a bonding tool, and/or a curing tool (e.g., a furnace) among other examples. In some implementations, the example environment 100 includes a plurality of types of such tools as part of the PCB tool set 140.

The SMT tool set 145 includes one or more tools that are capable of mounting the semiconductor package to a circuit board (e.g., a central processing unit (CPU) PCB, a memory module PCB, an automotive circuit board, and/or a display system board, among other examples). The SMT tool set 145 may include a stencil tool, a solder paste printing tool, a pick-and-place tool, a reflow tool (e.g., a furnace), and/or an inspection tool, among other examples. In some implementations, the example environment 100 includes a plurality of types of such tools as part of the SMT tool set 145.

The finished goods tool set 150 includes one or more tools that are capable of preparing a final product including the semiconductor package for shipment to a customer. The finished goods tool set 150 may include a tape-and-reel tool, a pick-and-place tool, a carrier tray stacking tool, a boxing tool, a drop-testing tool, a carousel tool, a controlled-environment storage tool, and/or a sealing tool, among other examples. In some implementations, the example environment 100 includes a plurality of types of such tools as part of the finished goods tool set 150.

The transport tool set 155 includes one or more tools that are capable of transporting work-in-process (WIP) between the semiconductor processing tool sets 105-150. The transport tool set 155 may be configured to accommodate one or more transport carriers such a wafer transport carrier (e.g., a wafer cassette or a front opening unified pod (FOUP), among other examples), a die carrier transport carrier (e.g., a film frame, among other examples), and/or a package transport carrier (e.g., a joint electron device engineering counsel (JEDEC) tray or a carrier tape reel, among other examples). The transport tool set 155 may also be configured to transfer and/or combine WIP amongst transport carriers. The transport tool set 155 may include a pick-and-place tool, a conveyor tool, a robot arm tool, an overhead hoist transport (OHT) tool, an automated materially handling system (AMES) tool, and/or another type of tool. In some implementations, the example environment 100 includes a plurality of types of such tools as part of the transport tool set 155.

One or more of the semiconductor processing tool sets 105-150 may perform one or more operations described herein. For example, one or more of the semiconductor processing tool sets 105-150 may perform one or more operations described in connection with FIGS. 5A-5N, 8A-8E, 10A-10C, 11A-11F, 13A-13C, and/or 14A-14E, among other examples.

The number and arrangement of tool sets shown in FIG. 1 are provided as one or more examples. In practice, there may be additional tool sets, different tool sets, or differently arranged tool sets than those shown in FIG. 1. Furthermore, two or more tool sets shown in FIG. 1 may be implemented within a single tool set, or a tool set shown in FIG. 1 may be implemented as multiple, distributed tool sets. Additionally, or alternatively, one or more tool sets of environment 100 may perform one or more functions described as being performed by another tool set of environment 100.

Figure 2:
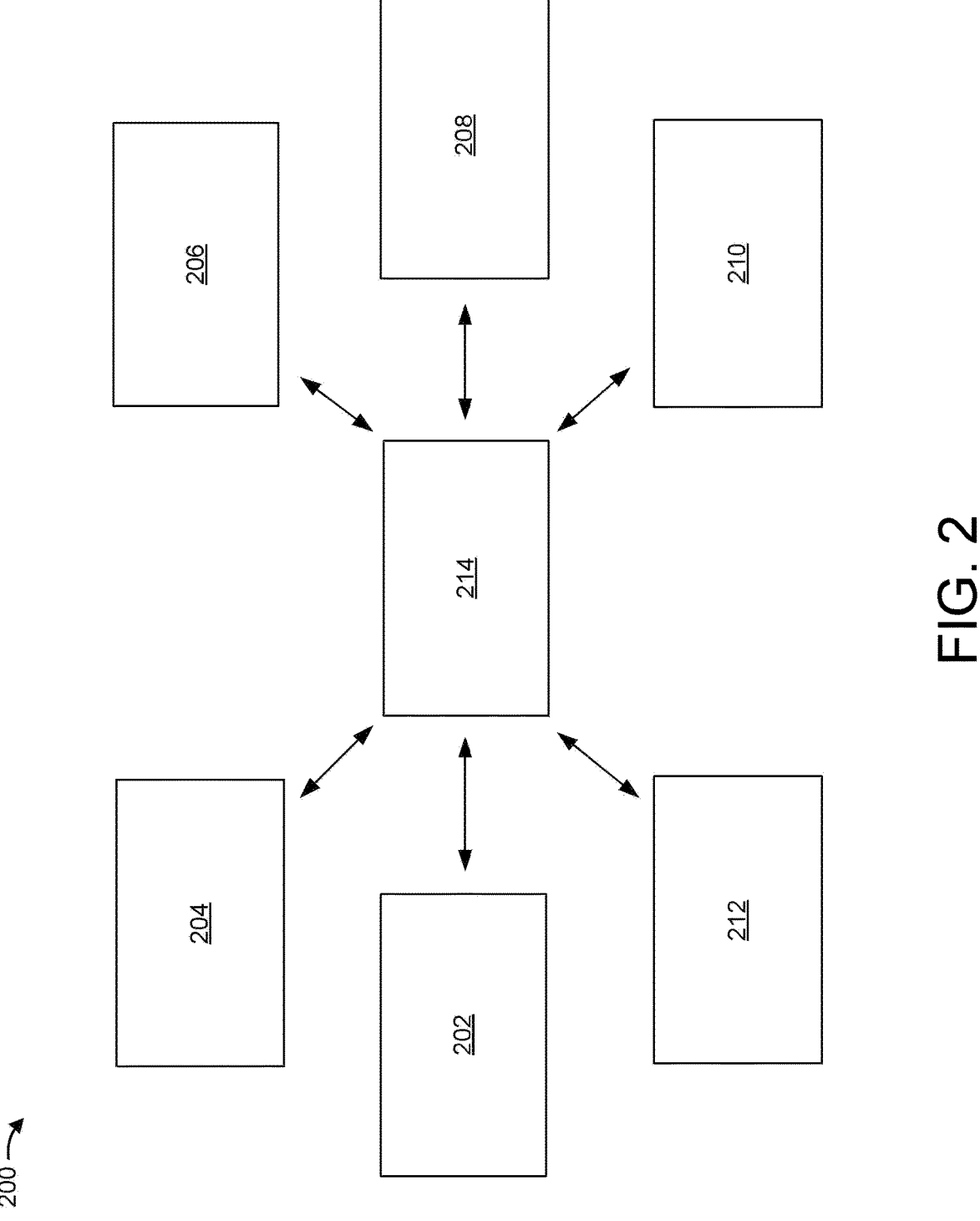
FIG. 2 is a diagram of an example environment in which systems and/or methods described herein may be implemented.

FIG. 2 is a diagram of an example environment 200 in which systems and/or methods described herein may be implemented. As shown in FIG. 2, the example environment 200 may include a plurality of semiconductor processing tools 202-212 and a wafer/die transport tool 214. The plurality of semiconductor processing tools 202-212 may include a deposition tool 202, an exposure tool 204, a developer tool 206, an etch tool 208, a planarization tool 210, a plating tool 212, and/or another type of semiconductor processing tool. The tools included in example environment 200 may be included in a semiconductor clean room, a semiconductor foundry, a semiconductor processing facility, and/or manufacturing facility, among other examples.

The deposition tool 202 is a semiconductor processing tool that includes a semiconductor processing chamber and one or more devices capable of depositing various types of materials onto a substrate. In some implementations, the deposition tool 202 includes a spin coating tool that is capable of depositing a photoresist layer on a substrate such as a wafer. In some implementations, the deposition tool 202 includes a chemical vapor deposition (CVD) tool such as a plasma-enhanced CVD (PECVD) tool, a high-density plasma CVD (HDP-CVD) tool, a sub-atmospheric CVD (SACVD) tool, a low-pressure CVD (LPCVD) tool, an atomic layer deposition (ALD) tool, a plasma-enhanced atomic layer deposition (PEALD) tool, or another type of CVD tool. In some implementations, the deposition tool 202 includes a physical vapor deposition (PVD) tool, such as a sputtering tool or another type of PVD tool. In some implementations, the deposition tool 202 includes an epitaxial tool that is configured to form layers and/or regions of a device by epitaxial growth. In some implementations, the example environment 200 includes a plurality of types of deposition tools 202.

The exposure tool 204 is a semiconductor processing tool that is capable of exposing a photoresist layer to a radiation source, such as an ultraviolet light (UV) source (e.g., a deep UV light source, an extreme UV light (EUV) source, and/or the like), an x-ray source, an electron beam (e-beam) source, and/or the like. The exposure tool 204 may expose a photoresist layer to the radiation source to transfer a pattern from a photomask to the photoresist layer. The pattern may include one or more semiconductor device layer patterns for forming one or more semiconductor devices, may include a pattern for forming one or more structures of a semiconductor device, may include a pattern for etching various portions of a semiconductor device, and/or the like. In some implementations, the exposure tool 204 includes a scanner, a stepper, or a similar type of exposure tool.

The developer tool 206 is a semiconductor processing tool that is capable of developing a photoresist layer that has been exposed to a radiation source to develop a pattern transferred to the photoresist layer from the exposure tool 204. In some implementations, the developer tool 206 develops a pattern by removing unexposed portions of a photoresist layer. In some implementations, the developer tool 206 develops a pattern by removing exposed portions of a photoresist layer. In some implementations, the developer tool 206 develops a pattern by dissolving exposed or unexposed portions of a photoresist layer through the use of a chemical developer.

The etch tool 208 is a semiconductor processing tool that is capable of etching various types of materials of a substrate, wafer, or semiconductor device. For example, the etch tool 208 may include a wet etch tool, a dry etch tool, and/or the like. In some implementations, the etch tool 208 includes a chamber that can be filled with an etchant, and the substrate is placed in the chamber for a particular time period to remove particular amounts of one or more portions of the substrate. In some implementations, the etch tool 208 etches one or more portions of the substrate using a plasma etch or a plasma-assisted etch, which may involve using an ionized gas to isotropically or directionally etch the one or more portions. In some implementations, the etch tool 208 includes a plasma-based asher to remove a photoresist material and/or another material.

The planarization tool 210 is a semiconductor processing tool that is capable of polishing or planarizing various layers of a wafer or semiconductor device. For example, a planarization tool 210 may include a chemical mechanical planarization (CMP) tool and/or another type of planarization tool that polishes or planarizes a layer or surface of deposited or plated material. The planarization tool 210 may polish or planarize a surface of a semiconductor device with a combination of chemical and mechanical forces (e.g., chemical etching and free abrasive polishing). The planarization tool 210 may utilize an abrasive and corrosive chemical slurry in conjunction with a polishing pad and retaining ring (e.g., typically of a greater diameter than the semiconductor device). The polishing pad and the semiconductor device may be pressed together by a dynamic polishing head and held in place by the retaining ring. The dynamic polishing head may rotate with different axes of rotation to remove material and even out any irregular topography of the semiconductor device, making the semiconductor device flat or planar.

The plating tool 212 is a semiconductor processing tool that is capable of plating a substrate (e.g., a wafer, a semiconductor device, and/or the like) or a portion thereof with one or more metals. For example, the plating tool 212 may include a copper electroplating device, an aluminum electroplating device, a nickel electroplating device, a tin electroplating device, a compound material or alloy (e.g., tin-silver, tin-lead, and/or the like) electroplating device, and/or an electroplating device for one or more other types of conductive materials, metals, and/or similar types of materials.

Wafer/die transport tool 214 includes a mobile robot, a robot arm, a tram or rail car, an overhead hoist transport (OHT) system, an automated materially handling system (AMES), and/or another type of device that is configured to transport substrates and/or semiconductor devices between semiconductor processing tools 202-212, that is configured to transport substrates and/or semiconductor devices between processing chambers of the same semiconductor processing tool, and/or that is configured to transport substrates and/or semiconductor devices to and from other locations such as a wafer rack, a storage room, and/or the like. In some implementations, wafer/die transport tool 214 may be a programmed device that is configured to travel a particular path and/or may operate semi-autonomously or autonomously. In some implementations, the example environment 200 includes a plurality of wafer/die transport tools 214.

For example, the wafer/die transport tool 214 may be included in a cluster tool or another type of tool that includes a plurality of processing chambers, and may be configured to transport substrates and/or semiconductor devices between the plurality of processing chambers, to transport substrates and/or semiconductor devices between a processing chamber and a buffer area, to transport substrates and/or semiconductor devices between a processing chamber and an interface tool such as an equipment front end module (EFEM), and/or to transport substrates and/or semiconductor devices between a processing chamber and a transport carrier (e.g., a front opening unified pod (FOUP)), among other examples. In some implementations, a wafer/die transport tool 214 may be included in a multi-chamber (or cluster) deposition tool 202, which may include a pre-clean processing chamber (e.g., for cleaning or removing oxides, oxidation, and/or other types of contamination or byproducts from a substrate and/or semiconductor device) and a plurality of types of deposition processing chambers (e.g., processing chambers for depositing different types of materials, processing chambers for performing different types of deposition operations). In these implementations, the wafer/die transport tool 214 is configured to transport substrates and/or semiconductor devices between the processing chambers of the deposition tool 202 without breaking or removing a vacuum (or an at least partial vacuum) between the processing chambers and/or between processing operations in the deposition tool 202, as described herein.

As described herein, one or more of the semiconductor processing tools 202-212 may perform a combination of operations to form one or more structures described herein. For example, one or more of the semiconductor processing tools 202-212 may perform one or more operations described in connection with FIGS. 4A-4E and/or 7A-7E, among other examples.

The number and arrangement of devices shown in FIG. 2 are provided as one or more examples. In practice, there may be additional devices, fewer devices, different devices, or differently arranged devices than those shown in FIG. 2. Furthermore, two or more devices shown in FIG. 2 may be implemented within a single device, or a single device shown in FIG. 2 may be implemented as multiple, distributed devices. Additionally, or alternatively, a set of devices (e.g., one or more devices) of the example environment 200 may perform one or more functions described as being performed by another set of devices of the example environment 200.

Figure 3A:
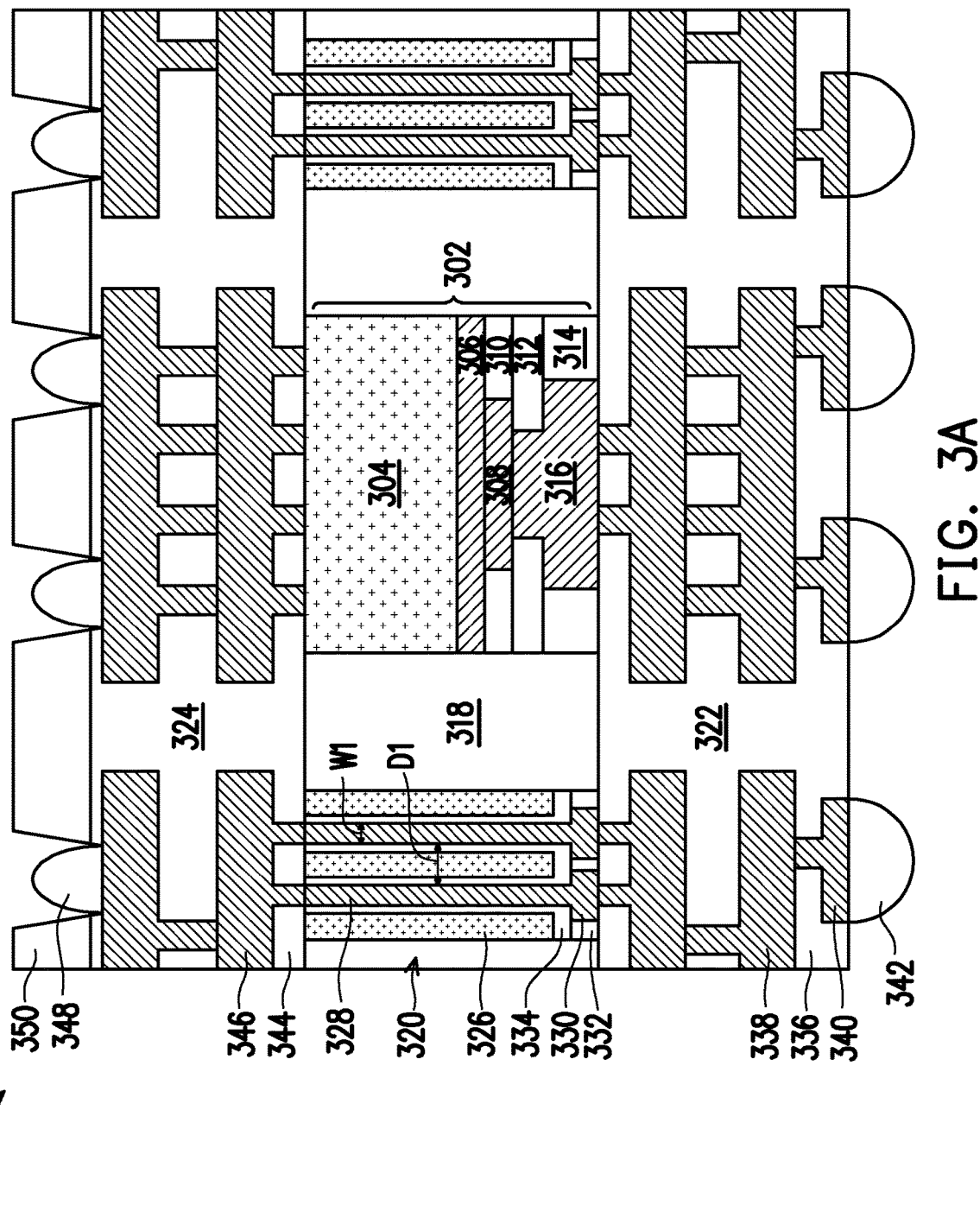
FIGS. 3A and 3B are diagrams of example implementations of a semiconductor device package described herein.
Figure 3B:
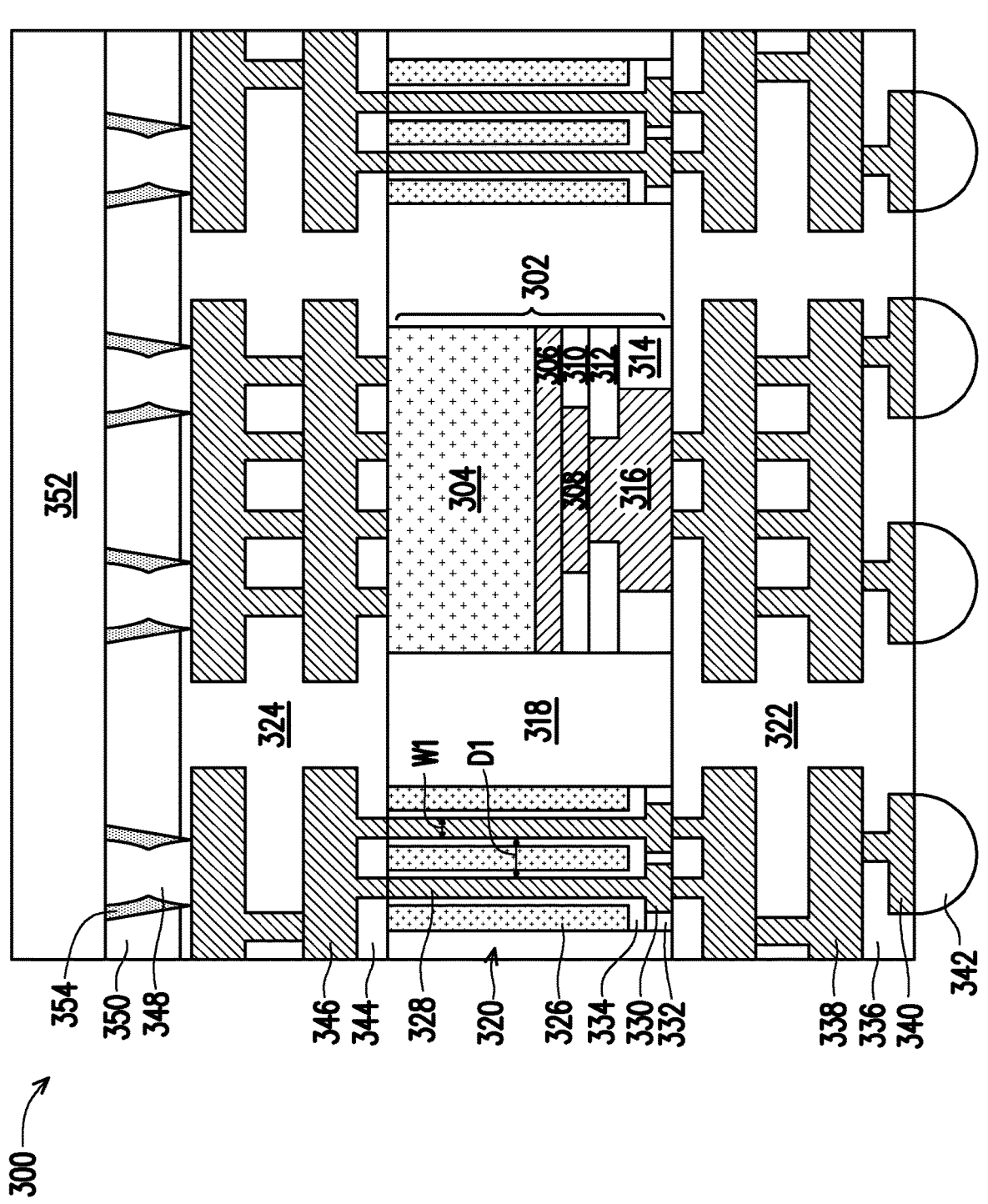

FIGS. 3A and 3B are diagrams of example implementations of a semiconductor device package 300 described herein. The semiconductor device package 300 includes a packaged semiconductor device that includes one or more semiconductor die packages. The semiconductor device package 300 may be referred to as a package on package (PoP) semiconductor device package, a 3D package, a 2.5D package, an integrated fanout (InFO) package, and/or another type of semiconductor device package that includes one or more semiconductor die packages.

FIG. 3A illustrates a cross-section view of the semiconductor device package 300. As shown in FIG. 3A, the semiconductor device package 300 may include a semiconductor die package 302. The semiconductor die package 302 may include one or more semiconductor dies 304, such as a logic die, a system-on-chip (SoC) die, a memory die, an input/output (I/O) die, a central processing unit (CPU) die, a graphics processing unit (GPU) die, a digital signal processing (DSP) die, an application specific integrated circuit (ASIC) die, and/or another type of semiconductor die, among other examples.

The semiconductor die package 302 may further include a metallization layer 306, one or more conductive pads 308 in a passivation layer 310, a polymer layer 312, another polymer layer 314, and one or more connectors 316 extending through the polymer layers 312 and 314. The metallization layer 306 may be coupled with the semiconductor die(s) 304. The one or more conductive pads 308 may be coupled with the metallization layer 306. The one or more connectors 316 may be coupled with the one or more conductive pads 308. The metallization layer 306, the one or more conductive pads 308, and the one or more connectors 316 may each include metal lines, trenches, vias, pillars, and/or another type of metallization layers. The metallization layer 306, the one or more conductive pads 308, and the one or more connectors 316 may each include one or more conductive materials, such as a gold (Au) material, a copper (Cu) material, a silver (Ag) material, a nickel (Ni) material, a tin (Sn) material, a lead (Pb) material, and/or a palladium (Pd) material, among other examples. The polymer layers 312 and 314 may include polybenzoxazole (PBO), a polyimide, a low temperature polyimide (LTPI), an epoxy resin, an acrylic resin, a phenol resin, benzocyclobutene (BCB), one or more dielectric layers, one or more polymer layers, and/or another suitable polymer material.

The semiconductor device package 300 may include an encapsulation layer 318. The encapsulation layer 318 may surround and/or encapsulate the semiconductor die package 302. The encapsulation layer 318 may include a molding compound, such as a polymer, one or more fillers dispersed in a resin, an epoxy-based resin, and/or another type of insulating material.

The semiconductor device package 300 may include one or more through silicon via (TSV) packages 320. The one or more TSV packages 320 may be located adjacent to (or side by side with) one or more sides of the semiconductor die package 302. The one or more TSV packages 320 may be spaced apart from the semiconductor die package 302 such that the encapsulation layer 318 surrounds and/or encapsulates the one or more TSV packages 320. The one or more TSV packages 320 may extend between, and may be electrically coupled with, a redistribution structure 322 and a redistribution structure 324. The one or more TSV packages 320 and the semiconductor die package 302 may be included over a top side (e.g., a second side opposing the first side) of the redistribution structure 322. The semiconductor die package 302 may be included between the redistribution structure 322 and the redistribution structure 324, and may be electrically coupled with the redistribution structure 322 by the one or more connectors 316.

Each TSV package 320 is a standalone and modular component that may be manufactured using frontend semiconductor processing equipment (e.g., the semiconductor processing tools 202-212 in the environment 200) as opposed to backend packaging equipment (e.g., the semiconductor processing tool sets 105-150 in the environment 100). Accordingly, each TSV package 320 may also be referred to as a TSV die in that a plurality of TSV packages 320 may be formed on a wafer and diced, cut, and/or otherwise separated into individual components (e.g., individual TSV packages 320) similar to semiconductor dies that are formed on a wafer. This enables the TSV package(s) 320 to be pre-manufactured (e.g., manufactured prior to the manufacturing of the semiconductor device package 300, as opposed to being formed as part of or during the manufacturing of the semiconductor device package 300), which may reduce processing times and cost for the semiconductor device package 300, may reduce defect rates in the TSV package(s) 320, and/or may enable the density of structures in the TSV package(s) 320 to be increased.

Each TSV package 320 may include a silicon layer 326 and a plurality of TSV structures 328 that are included in and extend through the silicon layer 326. The silicon layer 326 may include silicon (Si), polysilicon, amorphous silicon, silicon doped with one or more dopants, and/or another type of silicon.

The TSV structures 328 may be arranged in a side-by-side manner in the silicon layer 326. The TSV structures 328 may include vias, pillars, interconnects, and/or another type of elongated electrically conductive structures. The TSV structures 328 may include one or more conductive materials such as a gold (Au) material, a copper (Cu) material, a silver (Ag) material, a nickel (Ni) material, a tin (Sn) material, and/or a palladium (Pd) material, among other examples. The TSV structures 328 may be referred to TSVs (through silicon vias) in that the TSV structures 328 extend through silicon (e.g., the silicon layer 326) as opposed to the encapsulation layer 318 like a through interlayer via (TIV).

The TSV structures 328 of a TSV package 320 may each have a width W1. In some implementations, the width W1 of a TSV structure 328 is included in a range of approximately 4 microns to approximately 200 microns, which is lesser than a width of a related TIV structure (e.g., which might be in a range of approximately 20 microns to approximately 700 microns) that would otherwise be directly formed on a carrier substrate in a backend packing facility during manufacturing of the semiconductor device package 300. However, other values for these ranges are within the scope of the present disclosure.

The TSV structures 328 of a TSV package 320 may be spaced apart by a distance D1. In some implementations, the distance D1 between adjacent TSV structures 328 is included in a range of approximately 4 microns to approximately 200 microns, which is lesser than a distance between related TIV structures (e.g., which might be in a range of approximately 20 microns to approximately 700 microns) that would otherwise be directly formed on a carrier substrate in a backend packing facility during manufacturing of the semiconductor device package 300. However, other values for these ranges are within the scope of the present disclosure.

Each TSV package 320 may further include metal bumps 330 coupled with the TSV structures 328. The metal bumps 330 (or another type of conductive connection structures) may be included in a polymer layer 332, and may be included between the TSV structures 328 and the redistribution structure 322. The metal bumps 330 may include one or more materials such as a gold (Au) material, a copper (Cu) material, a silver (Ag) material, a nickel (Ni) material, a tin (Sn) material, and/or a palladium (Pd) material, among other examples. The polymer layer 332 may include polybenzoxazole (PBO), a polyimide, a low temperature polyimide (LTPI), an epoxy resin, an acrylic resin, a phenol resin, benzocyclobutene (BCB), one or more dielectric layers, one or more polymer layers, and/or another suitable polymer material.

Each TSV package 320 may further include an oxide liner 334 between the TSV structures 328 and the silicon layer 326. The oxide liner 334 may further be included between the metal bumps 330 and the silicon layer 326. The oxide liner 334 may include an oxide material such as silicon oxide ($SiO_x$ such as $SiO_2$) and/or another suitable oxide material. The oxide liner 334 may be included to promote adhesion between the TSV structures 328 and the silicon layer 326 and/or to reduce the likelihood of material migration from the TSV structures 328 into the silicon layer 326, among other examples.

The redistribution structure 322 may be referred to as a frontside redistribution structure. The redistribution structure 324 may be referred to as a backside redistribution structure. The redistribution structure 322 may include one or more polymer layers 336 and a plurality of metallization layers 338 disposed in the one or more polymer layers 336. The semiconductor die package 302 and the TSV structures 328 of the TSV package(s) 320 may be electrically connected with and/or attached to one or more metallization layers 338 of the redistribution structure 322. The metallization layers 338 of the redistribution structure 322 may include one or more materials such as a gold (Au) material, a copper (Cu) material, a silver (Ag) material, a nickel (Ni) material, a tin (Sn) material, and/or a palladium (Pd) material, among other examples. The metallization layers 338 of the redistribution structure 322 may include metal lines, vias, interconnects, and/or another type of metallization layers that enable fanout of I/O connections on the semiconductor die package 302. The polymer layer(s) 336 may include polybenzoxazole (PBO), a polyimide, a low temperature polyimide (LTPI), an epoxy resin, an acrylic resin, a phenol resin, benzocyclobutene (BCB), one or more polymer layers, and/or another suitable polymer material.

The semiconductor device package 300 may include conductive pads 340 coupled with the metallization layers 338, and conductive terminals 342 that are attached to a bottom side (e.g., a first side) of the redistribution structure 322 by the conductive pads 340. The conductive terminals 342 may include ball grid array (BGA) balls, land grid array (LGA) pads, pin grid array (PGA) pins, and/or another type of conductive terminals. The conductive terminals 342 may enable the semiconductor device package 300 to be mounted to a circuit board, a socket (e.g., an LGA socket), and/or another type of mounting structure.

The redistribution structure 324 may include one or more polymer layers 344 and a plurality of metallization layers 346 disposed in one or more polymer layers 344. The TSV structures 328 of the TSV package(s) 320 may be coupled with the one or more of the metallization layers 346. The metallization layers 346 may include metal lines, vias, interconnects, and/or another type of metallization layers that enable fanout of I/O connections of another semiconductor die package that may be subsequently attached to the semiconductor device package 300 above the redistribution structure 324, and enable signals to be routed between the semiconductor die package 302 and the other semiconductor die package. The metallization layers 346 may include one or more materials such as a gold (Au) material, a copper (Cu) material, a silver (Ag) material, a nickel (Ni) material, a tin (Sn) material, and/or a palladium (Pd) material, among other examples. The polymer layer(s) 344 may include polybenzoxazole (PBO), a polyimide, a low temperature polyimide (LTPI), an epoxy resin, an acrylic resin, a phenol resin, benzocyclobutene (BCB), one or more polymer layers, and/or another suitable polymer material.

The semiconductor die package 302 may be in direct contact with the redistribution structure 324 without a die attach film (DAF) between the semiconductor die 304 and the redistribution structure 324. The DAF may be omitted because of the process that is used to form or assemble the semiconductor device package 300. In particular, a DAF may be used in a "die last" process, where a redistribution structure is formed first and a semiconductor die package is placed onto the redistribution structure. In this process flow, the DAF is used to adhere the semiconductor die package to the redistribution structure so that the semiconductor die package does not move or displace during subsequent processing. However, the semiconductor device package 300 described herein is formed using a "die first" process, where the semiconductor die package 302 is placed on a carrier substrate, and the redistribution structure 324 is formed on the semiconductor die package 302. Thus, a DAF is not needed for adhesion between the semiconductor die package 302 and the redistribution structure 324, as the redistribution structure 324 directly adheres to the semiconductor die package 302 (and the TSV packages 320) in the die first process without the use of a DAF.

The omission of the DAF between the semiconductor die package 302 and the redistribution structure 324 enables portions of the metallization layers 346 to directly contact the semiconductor die 304, which enables the metallization layers 346 to function as a heatsink for the semiconductor die 304. The use of the metallization layers 346 as a heatsink for the semiconductor die may increase thermal dissipation for the semiconductor die 304 by providing increased thermal conductivity relative to the use of a DAF (e.g., from approximately 0.4 thermal conductivity to approximately 390 thermal conductivity). Moreover, the omission of the DAF between the semiconductor die 304 and the redistribution structure 324 eliminates the likelihood of void formation in the DAF, which might otherwise result in warpage and/or unevenness for the semiconductor die 304. Warpage and/or unevenness for the semiconductor die 304 may reduce a molding compound grind (MCG) window for the semiconductor device package 300, so that omission of the DAF may increase the MCG window, thereby reducing the tolerance for grinding the encapsulation layer 318 (referred to as the MCG window) after the encapsulation layer 318 is deposited.

One or more of the metallization layers 346 of the redistribution structure 324 may be electrically connected with connectors 348 that provide electrical and physical connections for another semiconductor die package that may be subsequently attached to the semiconductor device package 300 above the redistribution structure 324. The connectors 348 may include solder balls, solder bumps, controlled collapse chip connection (C4) bumps, and/or micro bumps, among other examples.

A backside enhance layer (BEL) film 350 may be included over and/or on a top side of the redistribution structure 324. The BEL film 350 may include a nonconductive material that provides increased structural rigidity for the semiconductor device package 300 to reduce the likelihood of warpage in the semiconductor device package 300. The BEL film 350 may extend above the connectors 348 to protect the connectors 348 during shipping and/or other semiconductor processes.

The implementation illustrated in FIG. 3A may be referred to as a "bottom only" semiconductor device package, an InFO bottom (InFO-B) semiconductor device package, and/or another type of semiconductor device package in which only the "bottom" semiconductor die package (e.g., the semiconductor die package 302) is included. This provides modularity and customization for the semiconductor device package 300 in that this implementation enables the type of the semiconductor die package to be selected by an end user or end manufacturer for another semiconductor die package that may be subsequently attached to the semiconductor device package 300 above the redistribution structure 324.

FIG. 3B illustrates an implementation in which a semiconductor die package 352 is attached to the semiconductor device package 300 by the connectors 348. The semiconductor die package 352 is included over the BEL film 350 and over the redistribution structure 324. Moreover, the semiconductor die package 352 and the semiconductor die package 302 are vertically arranged in the semiconductor device package 300. Accordingly, the semiconductor device package 300 may be referred to as a package on package (PoP).

The semiconductor die package 352 may include one or more semiconductor dies, such as a memory die, a high band width memory (HBM) die, a static random access memory (SRAM) die, a dynamic random access memory (DRAM) die, and/or another type of die, among other examples.

An underfill material 354 may be included around the connectors 348. The underfill material 354 may be included to fill in the gaps between the connectors 348 and the BEL film 350. The underfill material 354 may include a polymer, one or more fillers dispersed in a resin, an epoxy-based resin, and/or another type of insulating material.

As indicated above, FIGS. 3A and 3B are provided as examples. Other examples may differ from what is described with regard to FIGS. 3A and 3B.

Figure 4A:
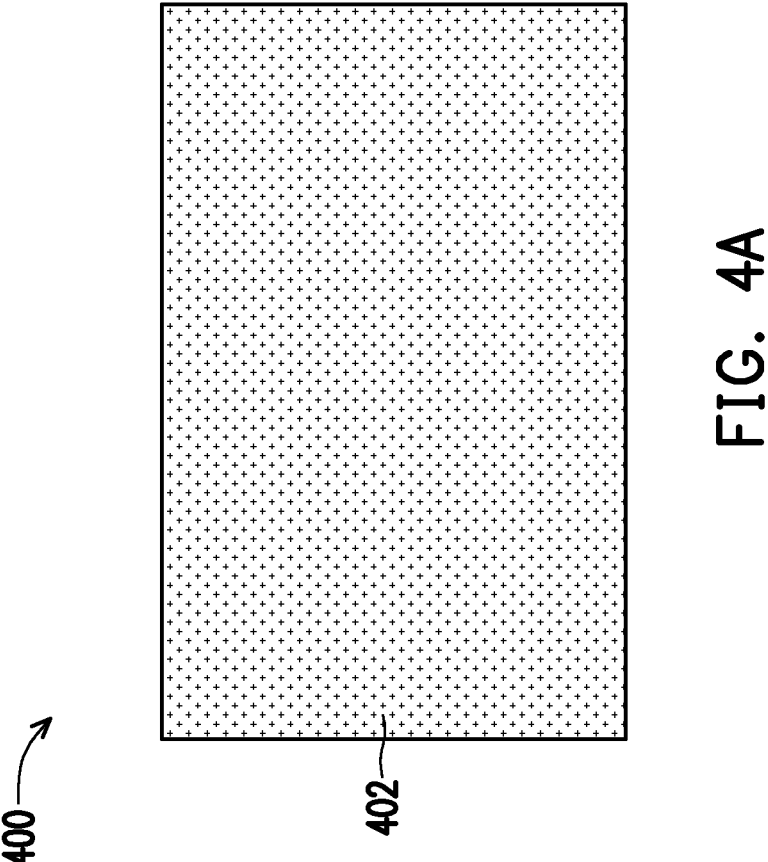
FIGS. 4A-4E are diagrams of an example implementation of forming a plurality of through silicon via (TSV) packages described herein.

FIGS. 4A-4E are diagrams of an example implementation 400 of forming a plurality of TSV packages 320 described herein. As shown in FIG. 4A, one or more operations in the example implementation 400 may be performed in connection with a substrate 402. In some implementations, the substrate 402 includes a silicon (Si) substrate or a silicon wafer. The use of a silicon substrate enables the TSV packages 320 to be formed in a frontend semiconductor manufacturing environment (e.g., the environment 200 of FIG. 2) using frontend semiconductor processing tools (e.g., the semiconductor processing tools 202-212). Alternatively, substrate 402 may include a substrate formed of a material including silicon, a III-V compound semiconductor material substrate such as gallium arsenide (GaAs), a silicon on insulator (SOI) substrate, a germanium substrate (Ge), a silicon germanium (SiGe) substrate, a silicon carbide (SiC) substrate, or another type of semiconductor substrate. The substrate 402 may include various layers, including conductive or insulating layers formed on a semiconductor substrate. The substrate 402 may include a compound semiconductor and/or an alloy semiconductor.

Figure 4B:
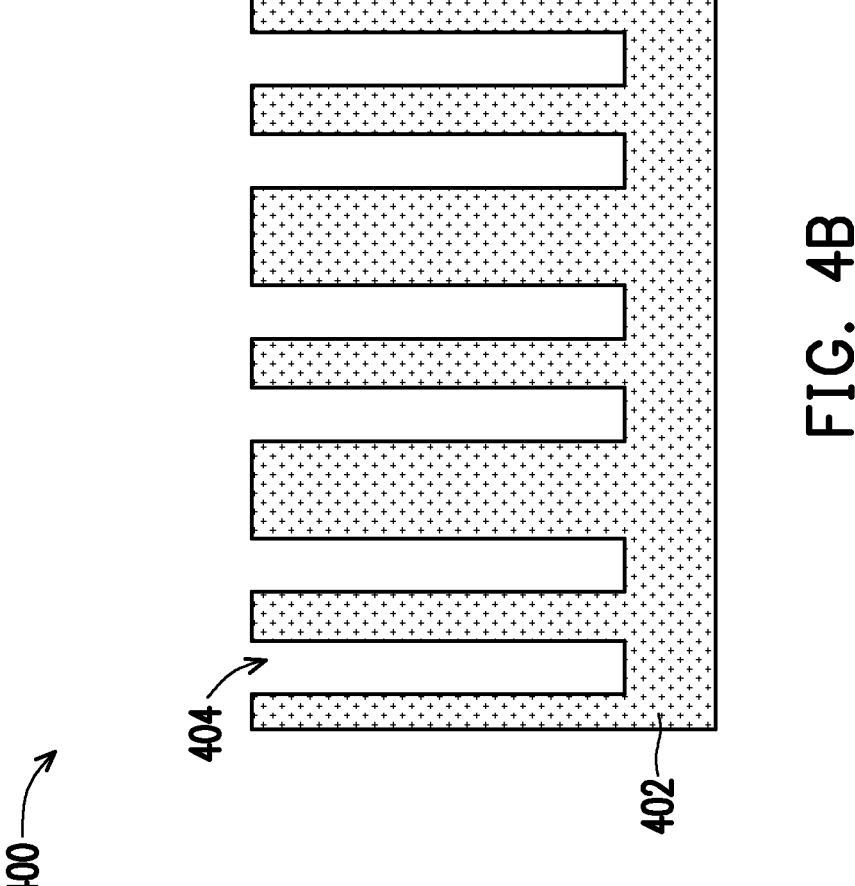

As shown in FIG. 4B, a plurality of recesses (or openings) 404 may be formed in the substrate 402. In some implementations, a pattern in a photoresist layer is used to etch the substrate 402 to form the recesses 404 in the substrate 402. In these implementations, the deposition tool 202 forms the photoresist layer on the substrate 402. The exposure tool 204 exposes the photoresist layer to a radiation source to pattern the photoresist layer. The developer tool 206 develops and removes portions of the photoresist layer to expose the pattern. The etch tool 208 etches the substrate 402 based on the pattern to form the recesses 404. In some implementations, the etch operation includes a plasma etch operation, a wet chemical etch operation, and/or another type of etch operation. In some implementations, a photoresist removal tool removes the remaining portions of the photoresist layer (e.g., using a chemical stripper, plasma ashing, and/or another technique). In some implementations, a hard mask layer is used as an alternative technique for etching the substrate 402 based on a pattern.

Figure 4C:
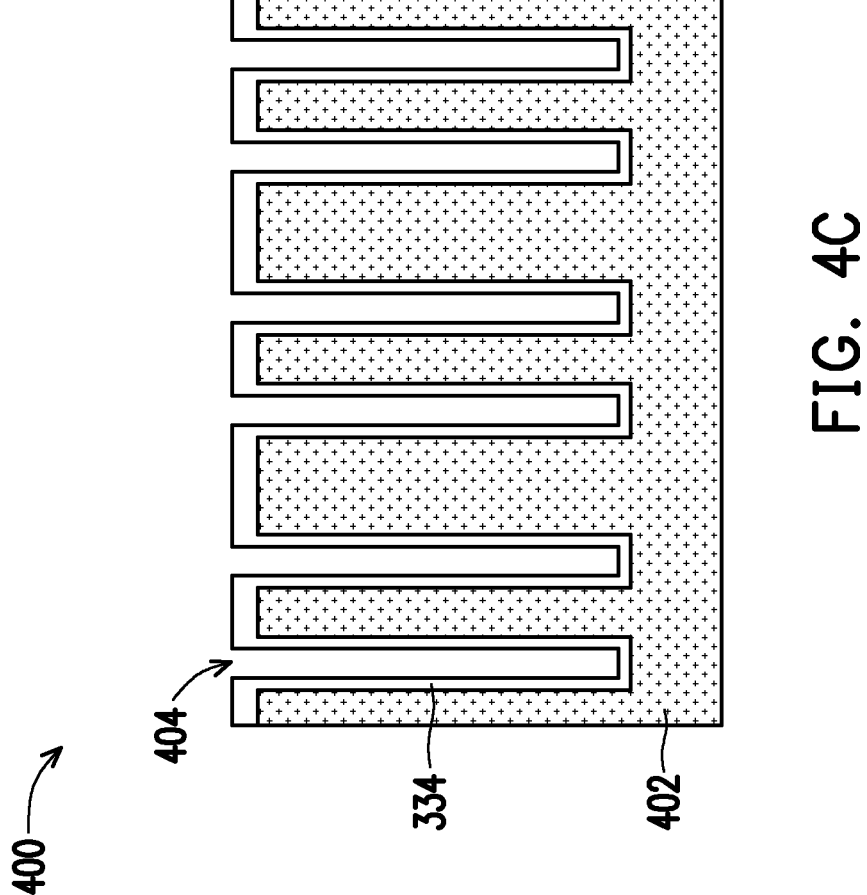

As shown in FIG. 4C, an oxide liner 334 is formed on sidewalls and on a bottom surface of the recesses 404. The deposition tool 202 may deposit the oxide liner 334 using a CVD technique, a PVD technique, and ALD technique, and/or another deposition technique. The deposition tool 202 may conformally deposit the oxide liner 334 such that the oxide liner 334 conforms to the sidewalls and the bottom surface of the recesses 404. As further shown in FIG. 4C, the oxide liner 334 may also be formed on the top surface of the substrate 402.

Figure 4D:
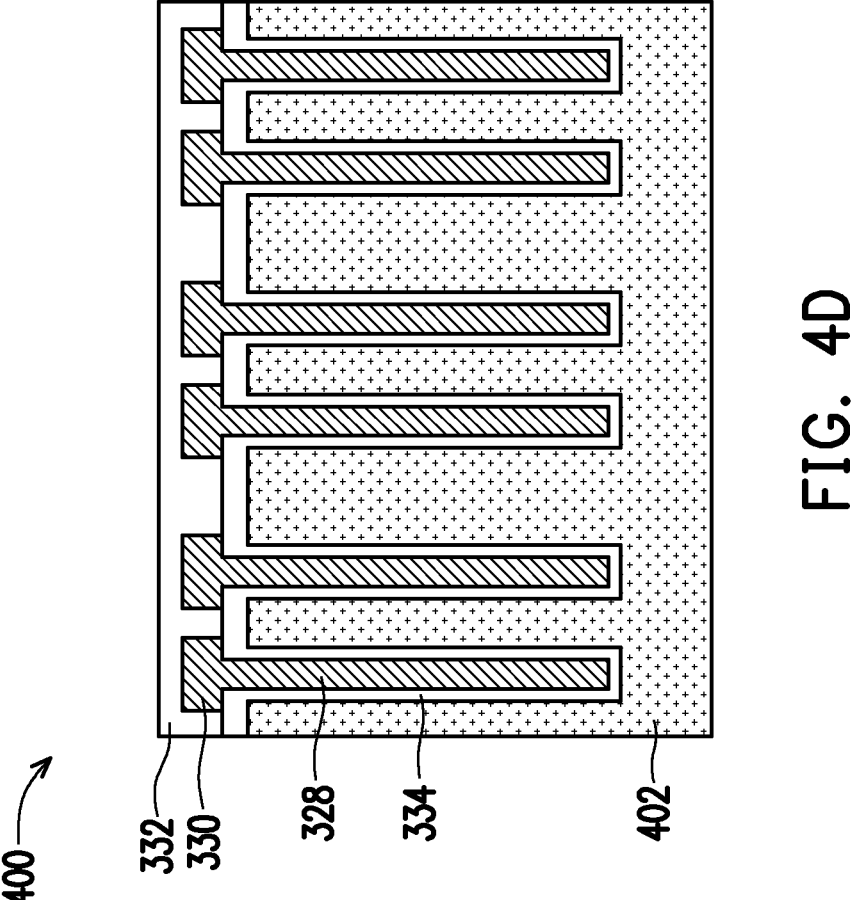

As shown in FIG. 4D, TSV structures 328 may be formed on the oxide liner 334 in the recesses 404. The deposition tool 202 and/or the plating tool 212 deposits the conductive material of the TSV structures 328 using a CVD technique, a PVD technique, an ALD technique, an electroplating technique, another deposition technique described above in connection with FIG. 2, and/or a deposition technique other than as described above in connection with FIG. 2. In some implementations, an annealing operation may be performed to reflow the TSV structures 328 after deposition of the TSV structures 328. The annealing operation may be performed to remove voids, seams, and/or other types of defects in the TSV structures 328.

As further shown in FIG. 4D, metal bumps 330 may be formed on the TSV structures 328. The deposition tool 202 and/or the plating tool 212 deposits the conductive material of the metal bumps 330 using a CVD technique, a PVD technique, an ALD technique, an electroplating technique, another deposition technique described above in connection with FIG. 2, and/or a deposition technique other than as described above in connection with FIG. 2. In some implementations, an annealing operation may be performed to reflow the metal bumps 330 after deposition of the metal bumps 330. The annealing operation may be performed to remove voids, seams, and/or other types of defects in the metal bumps 330.

As further shown in FIG. 4D, the deposition tool 202 may form a polymer layer 332 over the substrate and on exposed portions of the oxide liner 334. The deposition tool 202 may also form the polymer layer 332 on the metal bumps 330.

Figure 4E:
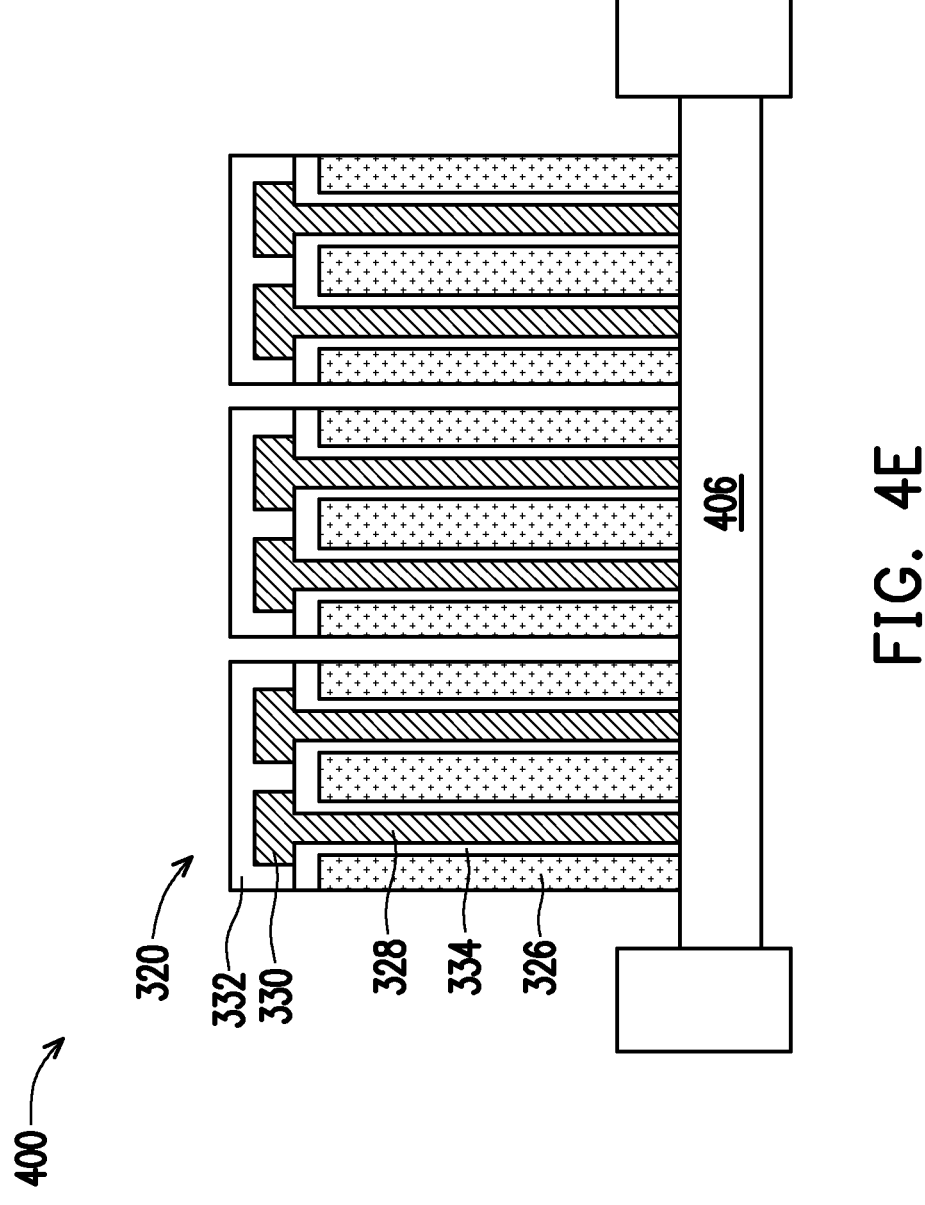

As shown in FIG. 4E, the substrate 402 may be placed on a frame 406 and may be diced, cut, and/or otherwise separated into TSV packages (or TSV dies) 320. Each TSV package 320 may include a plurality of the TSV structures 328. TSV packages 320 may then be packaged for storage and/or shipment to a semiconductor packaging facility for use in the manufacturing of semiconductor device packages such as the semiconductor device package 300.

As indicated above, FIGS. 4A-4E are provided as an example. Other examples may differ from what is described with regard to FIGS. 4A-4E.

Figure 5A:
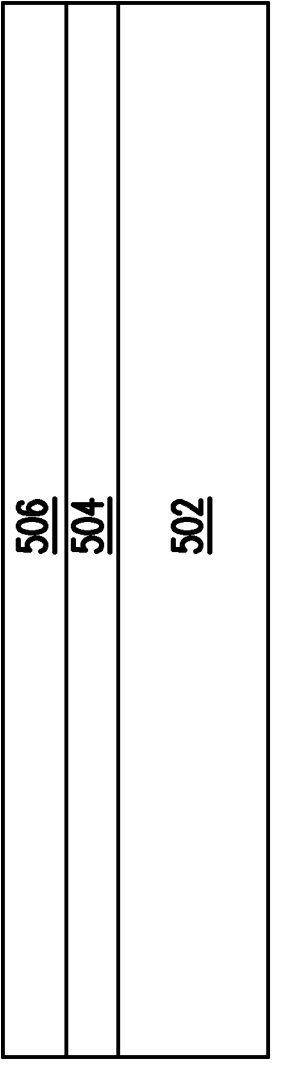
FIGS. 5A-5N are diagrams of an example implementation of forming a semiconductor device package that includes a plurality of TSV packages described herein.
Figure 5B:
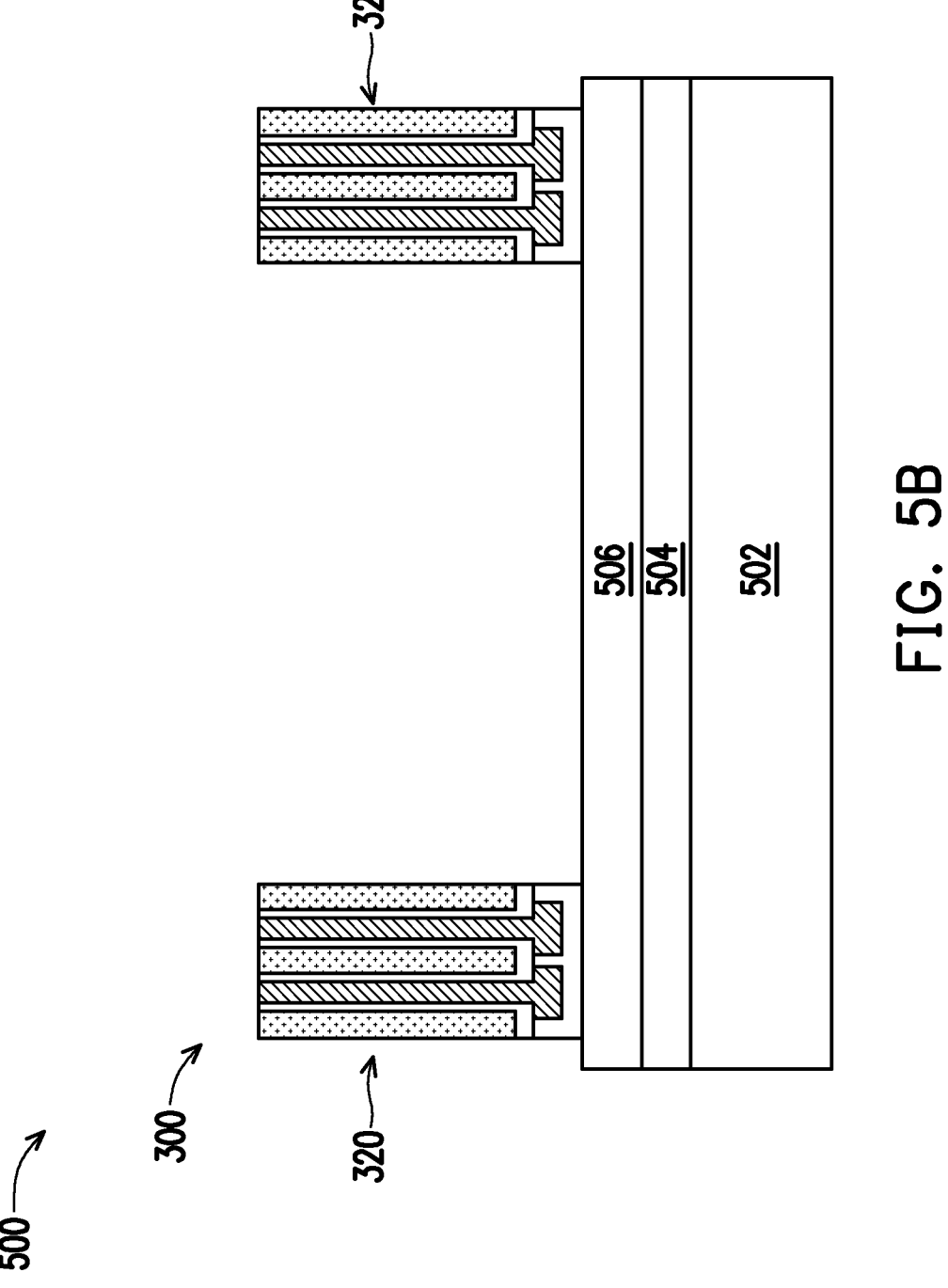
Figure 5C:
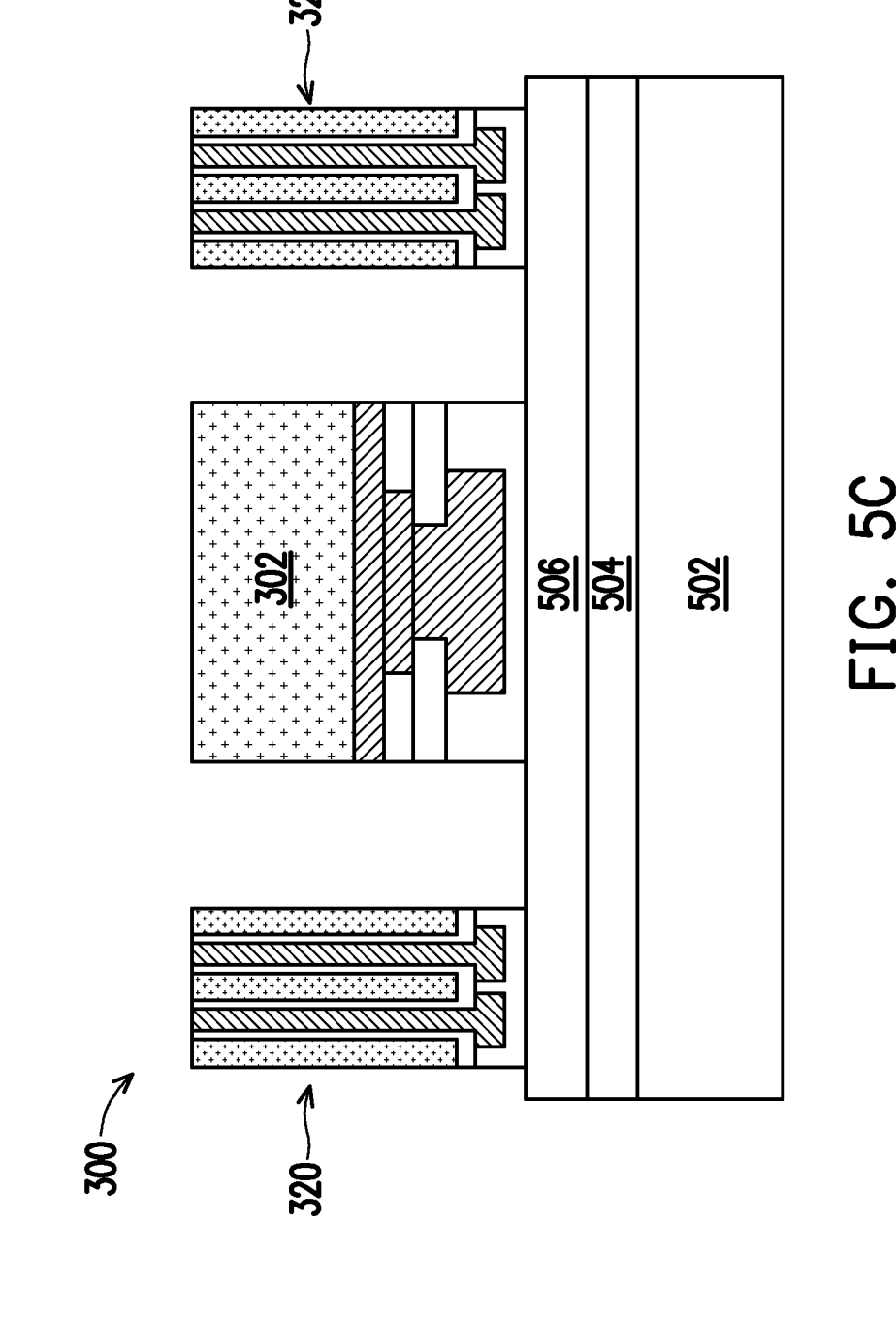
Figure 5D:
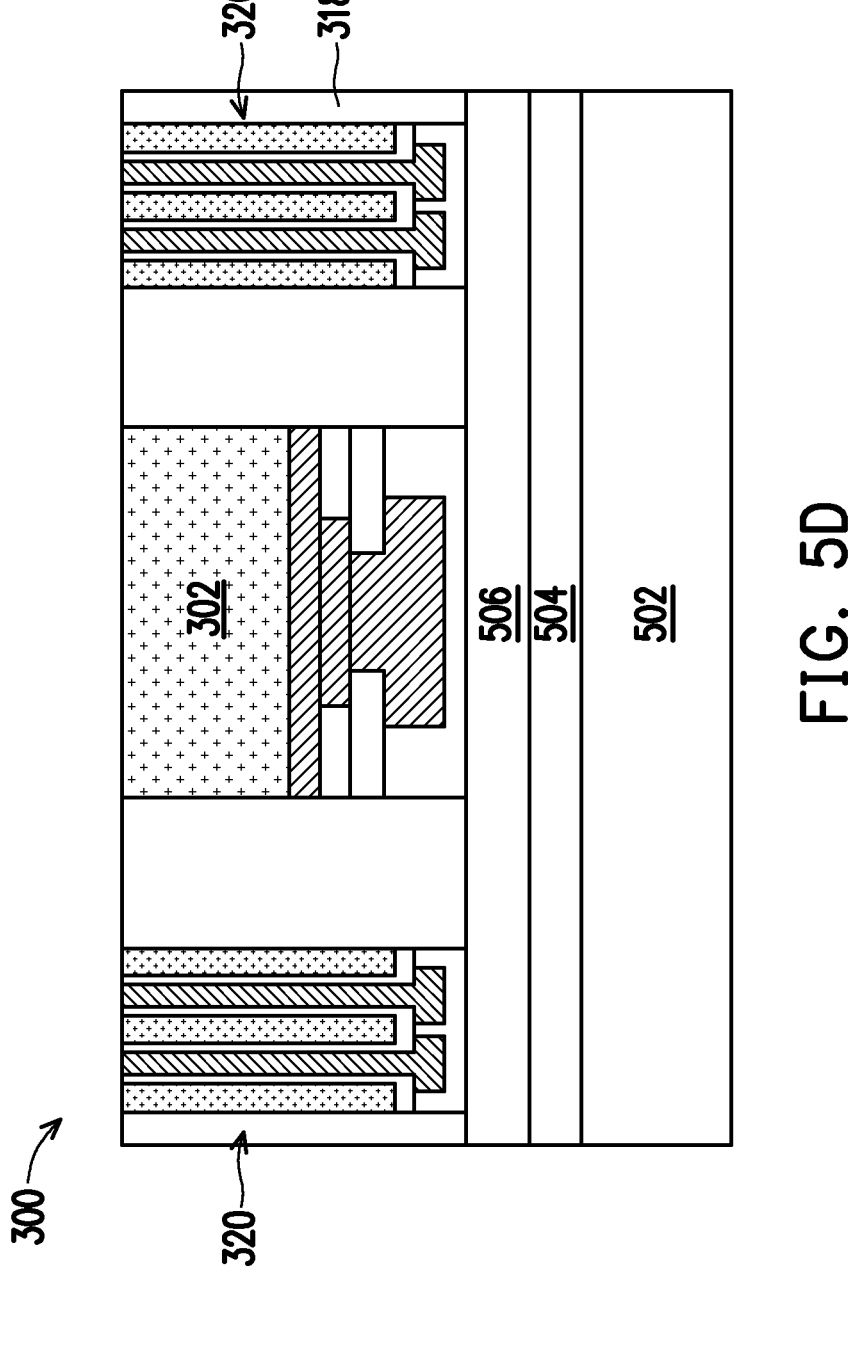
Figure 5E:
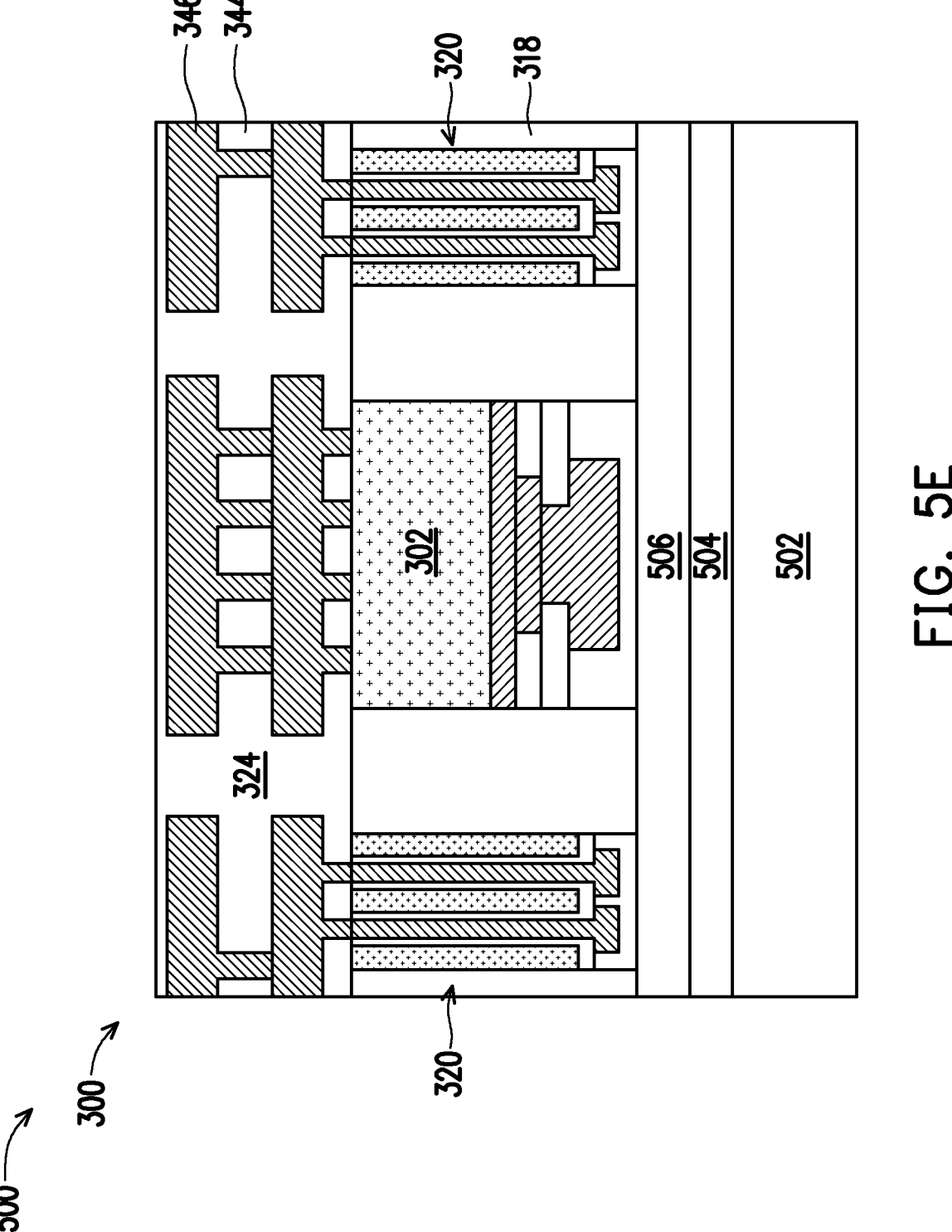
Figure 5F:
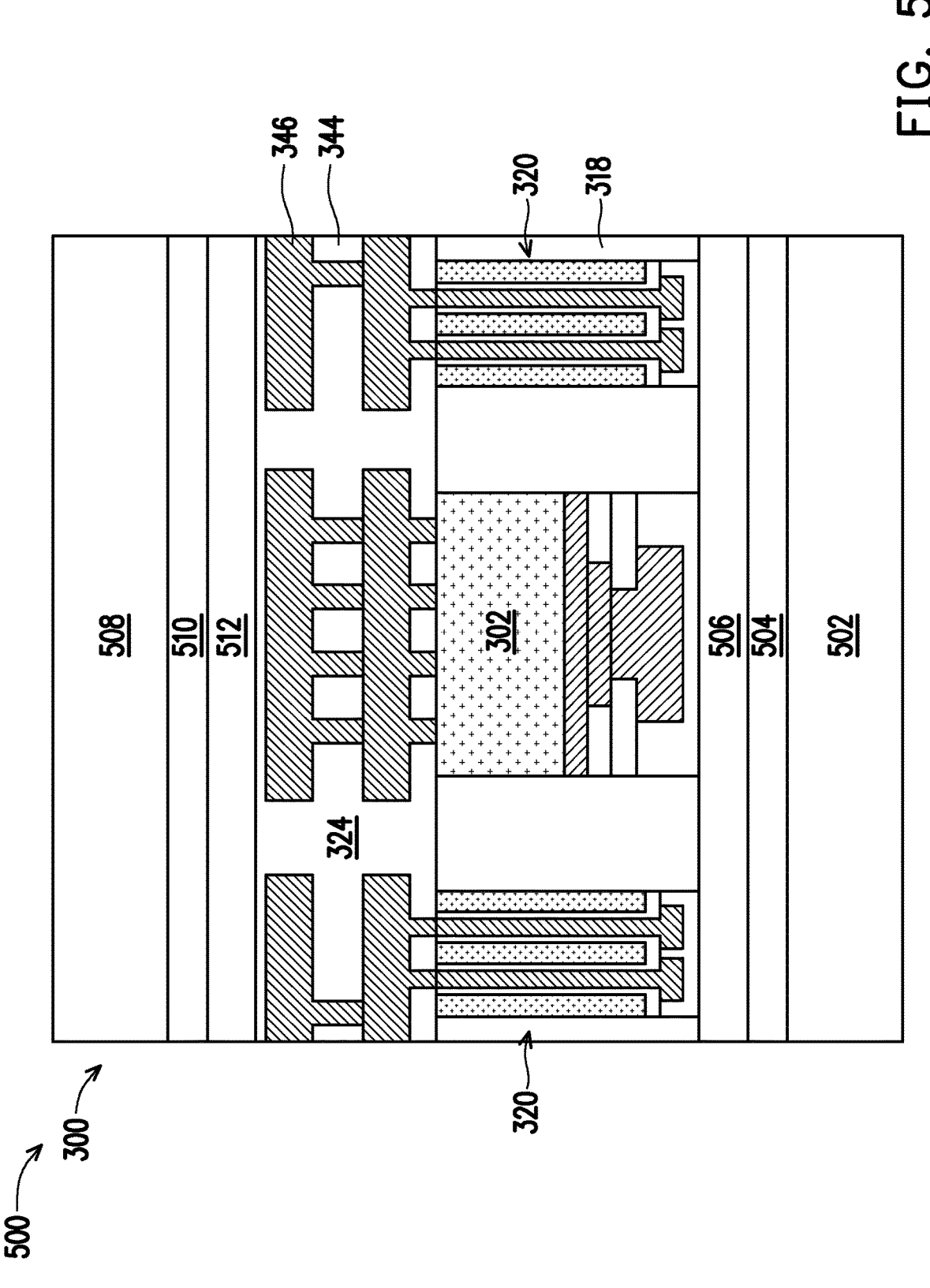
Figure 5G:
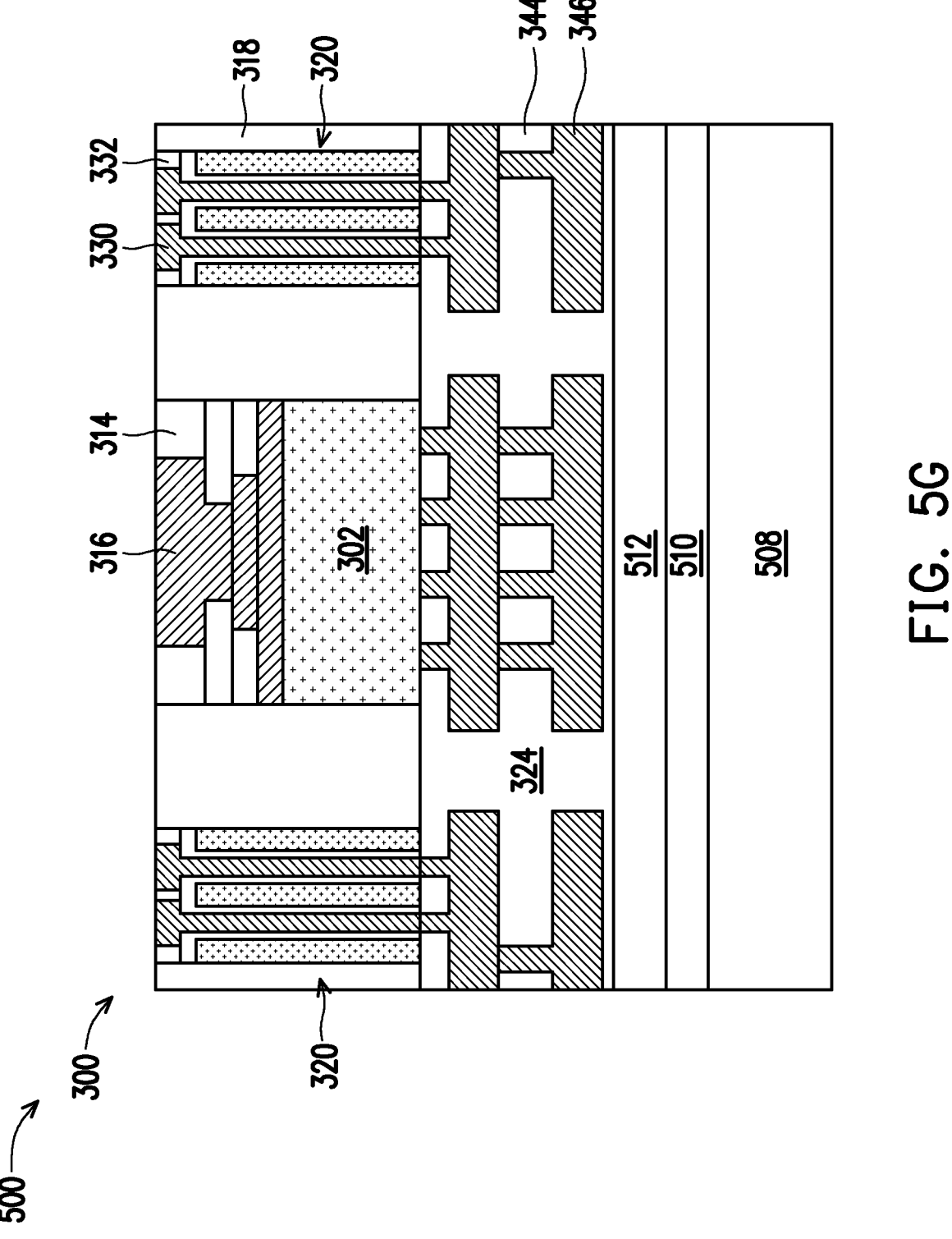
Figure 5H:
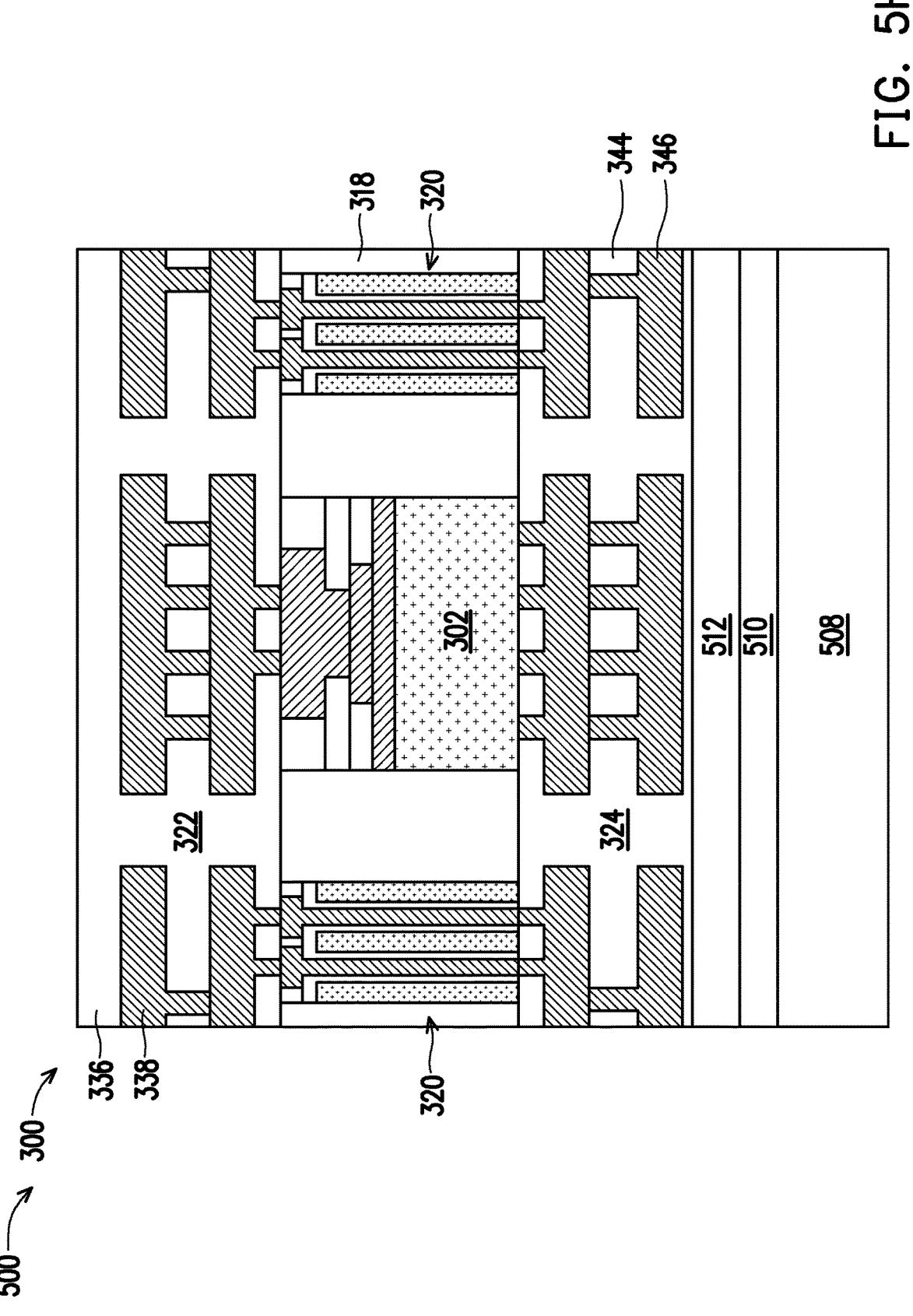
Figure 5I:
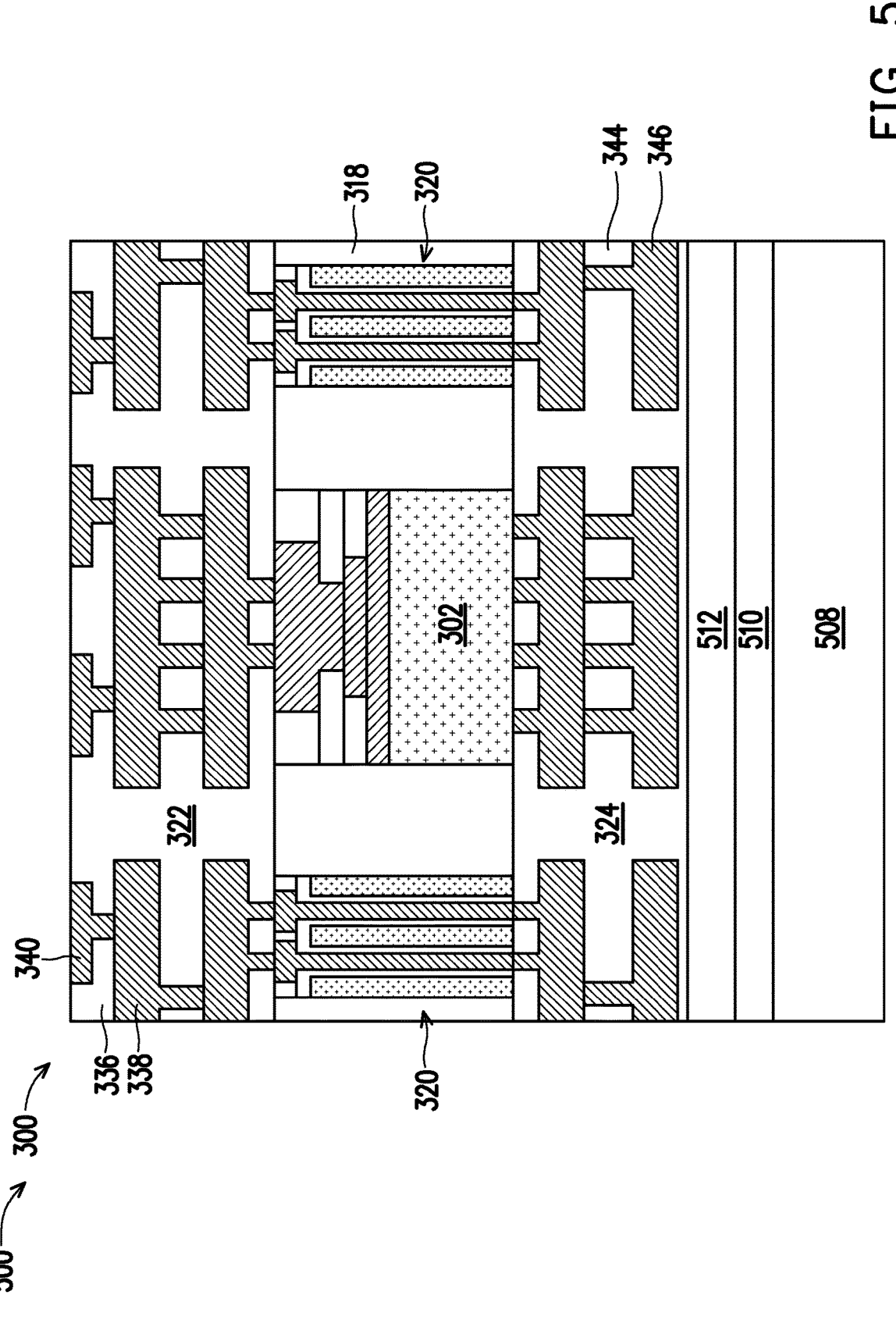
Figure 5J:
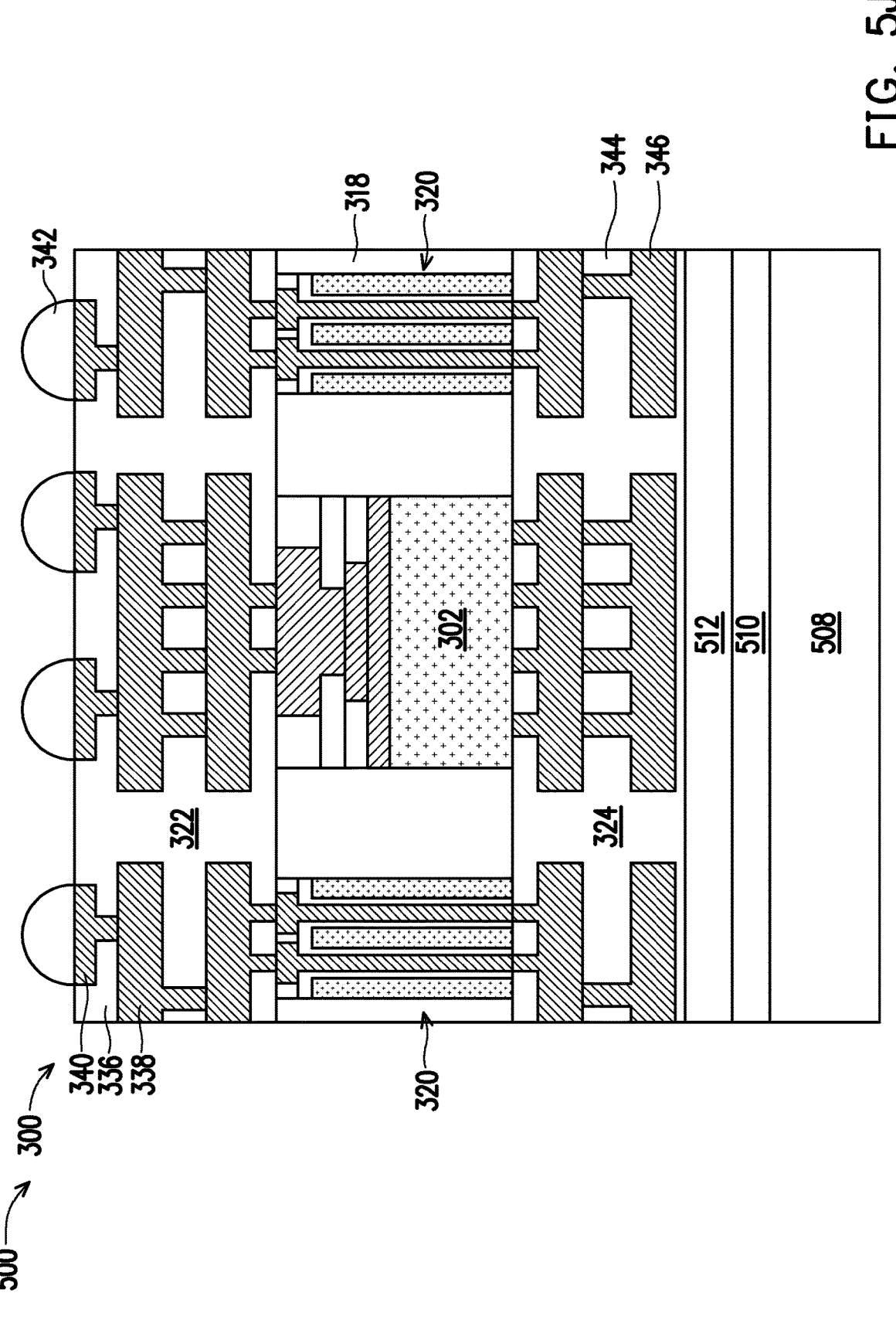
Figure 5K:
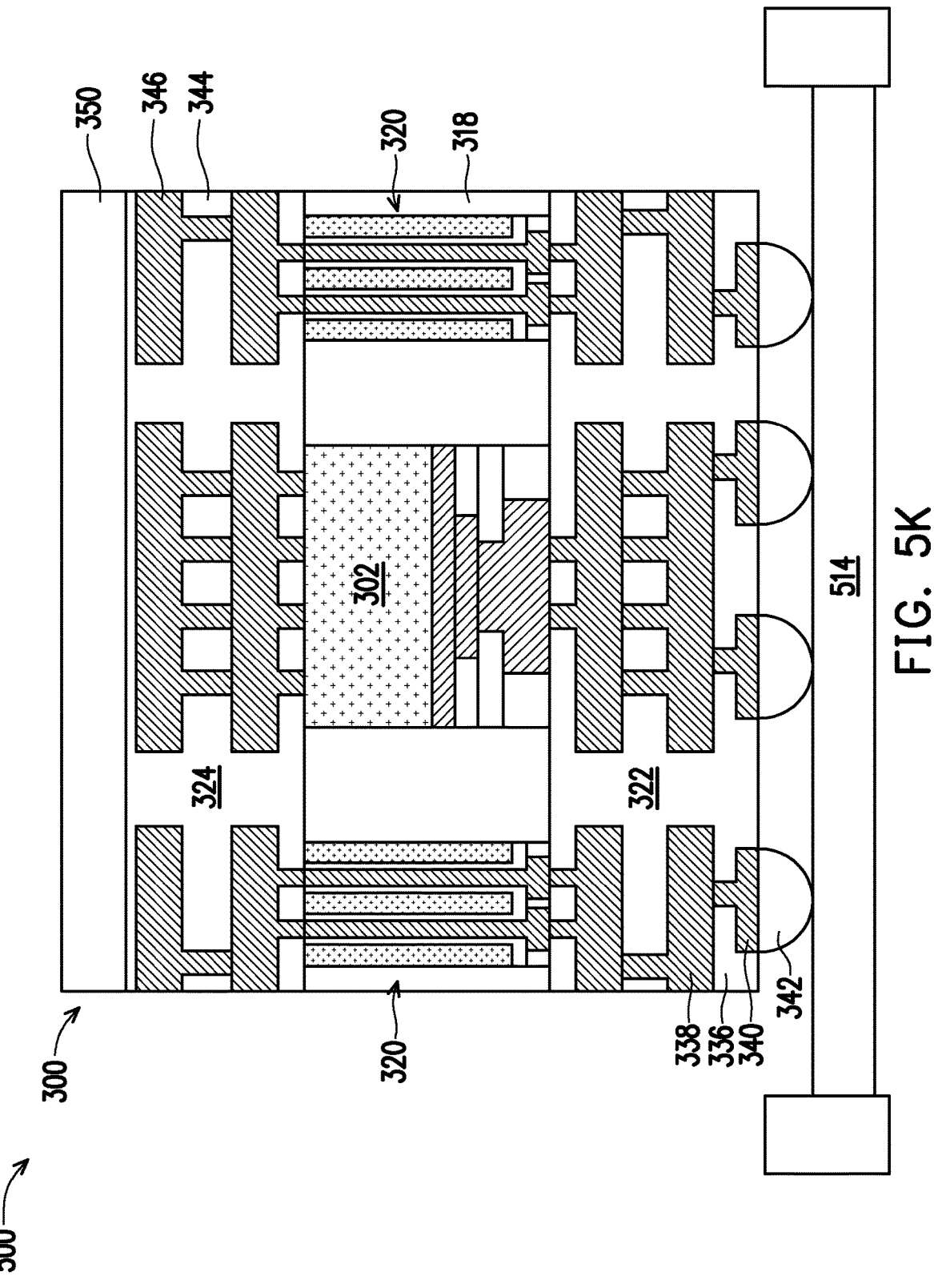
Figure 5L:
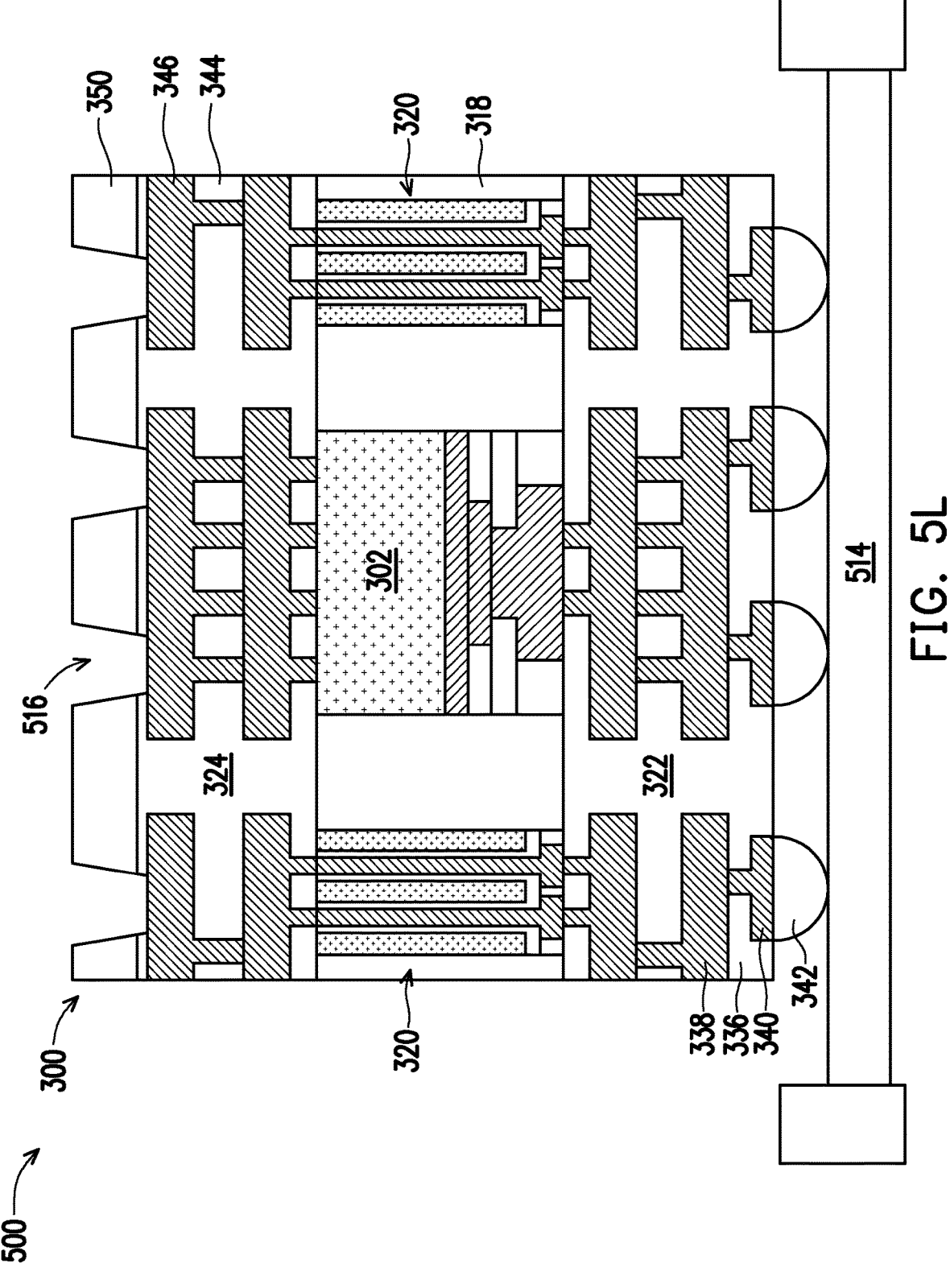
Figure 5M:
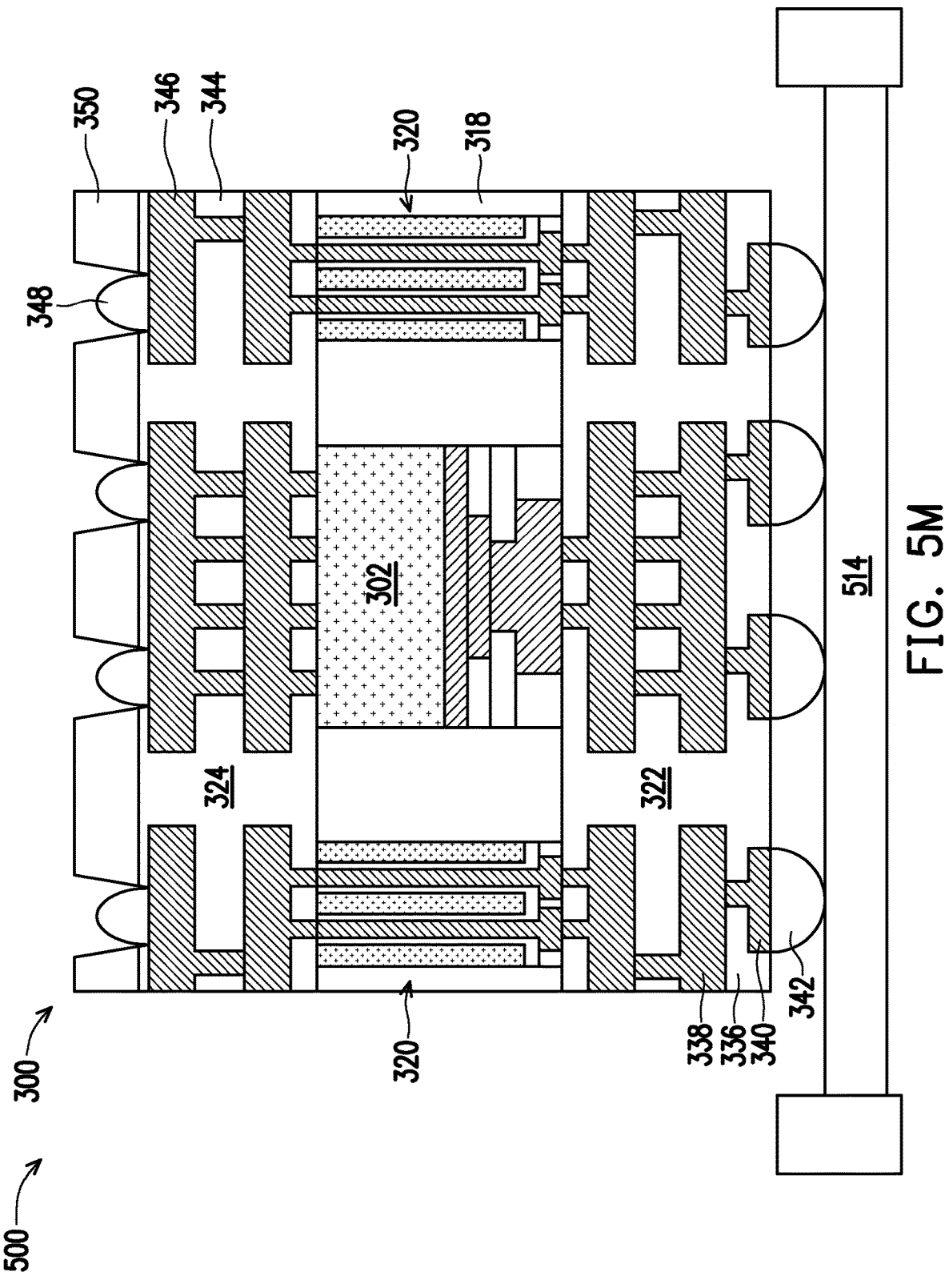
Figure 5N:
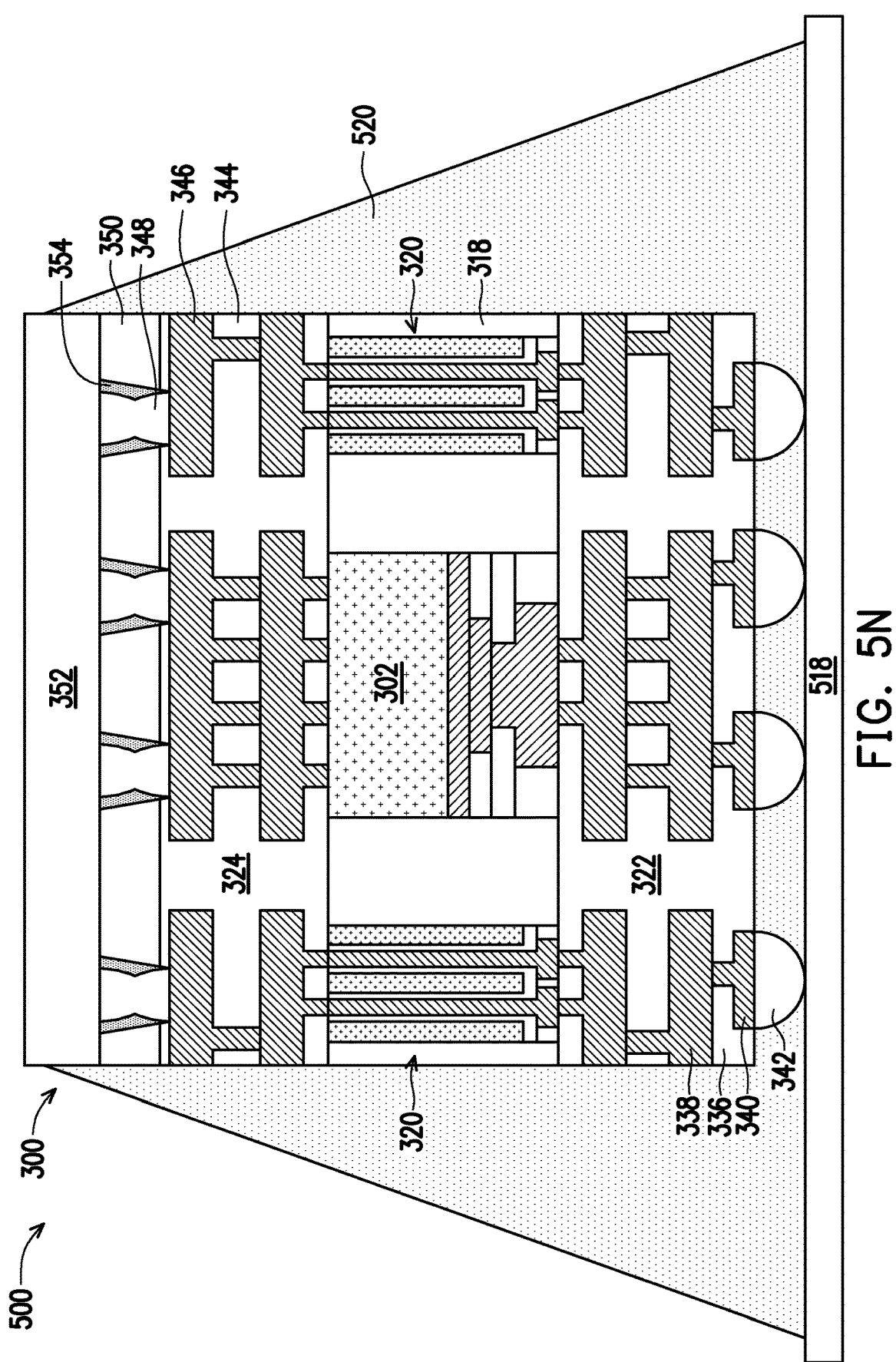

FIGS. 5A-5N are diagrams of an example implementation 500 of forming a semiconductor device package 300 that includes a plurality of TSV packages 320 described herein. The TSV packages 320 may be formed according to the example implementation 400 described in connection with FIGS. 4A-4E.

As shown in FIG. 5A, portions of the example implementation 500 may be performed in connection with a carrier substrate 502. The carrier substrate 502 may include a glass substrate, a silicon substrate, and/or another suitable carrier substrate. One or more layers may be included on the carrier substrate 502, such as a light-to-heat conversion (LTHC) release layer 504 that is formed over and/or on the carrier substrate 502, and a DAF 506 that is formed over and/or on the LTHC release layer 504. The DAF 506 may be configured to adhere components of the semiconductor device package 300 to the carrier substrate 502 for processing. The LTHC release layer 504 may be configured to enable the semiconductor device package 300 to be removed or debonded from the carrier substrate 502 after processing.

As shown in FIG. 5B, one or more TSV packages 320 may be placed on the carrier substrate 502. The TSV packages 320 may be secured in place and adhered to the carrier substrate 502 by the DAF 506. In some implementations, die-attach tool set 130 may pick and place the TSV packages 320 onto the carrier substrate 502.

As shown in FIG. 5C, a semiconductor die package 302 may be placed on the carrier substrate 502. The semiconductor die package 302 may be secure in place and adhered to the carrier substrate 502 by the DAF 506. In some implementations, die-attach tool set 130 may pick and place the semiconductor die package 302 onto the carrier substrate 502.

As shown in FIGS. 5B and 5C, the TSV packages 320 may be placed onto the carrier substrate 502 prior to the semiconductor die package 302, and the semiconductor die package 302 may be placed onto the carrier substrate 502 after the TSV packages 320 are placed onto the carrier substrate 502. The semiconductor die package 302 may be more complex, and may be of higher cost and more time to manufacture, relative to the TSV packages 320. Accordingly, this order of operations may be used to reduce the likelihood of scrapping the semiconductor die package 302 due to defects or other issues with placement of the TSV packages 320. However, in other implementations, the semiconductor die package 302 may be placed first, and then the TSV packages 320 may be placed.

As shown in FIG. 5D, an encapsulation layer 318 may be formed over the carrier substrate 502. The encapsulation tool set 135 may deposit the molding compound of the encapsulation layer 318 around the TSV packages 320 and around the semiconductor die package 302 such that, in a top-down view of the semiconductor device package 300, the TSV packages 320 and the semiconductor die package 302 are encapsulated and/or surrounded by the encapsulation layer 318. The encapsulation tool set 135 may deposit the encapsulation layer 318 by compression molding, transfer molding, or by another suitable technique. The molding compound of the encapsulation layer 318 may be applied in liquid or semi-liquid form and then subsequently cured.

The planarization tool set 110 may subsequently perform a planarization operation to remove and planarize an upper surface of the encapsulation layer 318 that is formed over the tops of the TSV packages 320 and/or over the top of the semiconductor die package 302. This exposes the tops of the TSV packages 320 and the top of the semiconductor die package 302 through the encapsulation layer 318.

The planarization operation may include a CMP operation, a grinding operation, an etching operation, and/or another suitable process. The planarization operation may be referred to as a molding compound grind (MCG) operation. As described above, placing the semiconductor die package on the carrier substrate 502 first, as opposed to forming a redistribution structure first and using a DAF to attach the semiconductor die package 302 to the redistribution structure, reduces the likelihood of warpage and/or unevenness for the semiconductor die package 302. The reduced likelihood of warpage and/or unevenness for the semiconductor die package 302 may increase an MCG window of the MCG operation, thereby reducing the tolerance needed for grinding the encapsulation layer 318 in the MCG operation.

As shown in FIG. 5E, a redistribution structure 324 may be formed over and/or on the semiconductor die package 302, over and/or on the TSV packages 320, and over and/or on the encapsulation layer 318. The RDL tool set 105 may form the redistribution structure 324 by forming a plurality of polymer layers 344 and a plurality of metallization layers 346 in the plurality of polymer layers 344. For example, the RDL tool set 105 may deposit a first polymer layer 344, may remove portions of the first polymer layer 344 to form recesses in the first polymer layer 344, and may form a first metallization layer 346 in the recesses. The RDL tool set 105 may continue to perform similar processing operations to build the redistribution structure 324 until a sufficient or desired arrangement of metallization layers 346 is achieved.

As further shown in FIG. 5E, the redistribution structure 324 may be in direct contact with the semiconductor die package 302 (e.g., without an intervening DAF). Accordingly, portions of the metallization layers 346 of the redistribution structure 324 may be in direct contact with the semiconductor die package 302, which may enable the portions of the metallization layers 346 to function as a heatsink for the semiconductor die package 302. Moreover, the TSV structures 328 of the TSV packages 320 may be connected with one or more of the metallization layers 346 of the redistribution structure 324.

As shown in FIG. 5F, a carrier substrate 508 may be attached to the top surface of the redistribution structure 324. The carrier substrate 508 may be attached using an LTHC release layer 510 and a DAF 512. Subsequently, carrier substrate de-bonding is performed to detach (or "de-bond") the carrier substrate 502 from the semiconductor device package 300. The singulation tool set 125 may de-bond the carrier substrate 502 using one or more techniques, such as projecting a light (e.g., a laser light or an UV light) onto the LTHC release layer 504 between the carrier substrate 502 and the DAF 506 so that the LTHC release layer 504 decomposes under the heat of the light.

As shown in FIG. 5G, the planarization tool set 110 may perform a planarization operation to remove the DAF 506 after the carrier substrate 502 is removed. The planarization operation may also result in grinding and/or removal of a portion of the polymer layers 332 of the TSV packages 320, which results in the top surfaces of the metal bumps 330 being exposed through the polymer layers 332. Moreover, the planarization operation may result in grinding and/or removal of a portion of the polymer layer 314 of the semiconductor die package 302, which results in the top surfaces of the connector(s) 316 being exposed through the polymer layer 314.

As shown in FIG. 5H, a redistribution structure 322 may be formed over and/or on the semiconductor die package 302, over and/or on the TSV packages 320, and over and/or on the encapsulation layer 318. The RDL tool set 105 may form the redistribution structure 322 by forming a plurality of polymer layers 336 and a plurality of metallization layers 338 in the plurality of polymer layers 336. For example, the RDL tool set 105 may deposit a first polymer layer 336, may remove portions of the first polymer layer 336 to form recesses in the first polymer layer 336, and may form a first metallization layer 338 in the recesses. The RDL tool set 105 may continue to perform similar processing operations to build the redistribution structure 322 until a sufficient or desired arrangement of metallization layers 338 is achieved.

One or more of the metallization layers 338 may be connected to the metal bumps 330 of the redistribution structure 322. One or more of the metallization layers 338 may be connected to the connector(s) 316 of the semiconductor die package 302.

As shown in FIG. 5I, conductive pads 340 may be formed in and/or on the redistribution structure 322. The conductive pads 340 may be connected to one or more of the metallization layers 338 of the redistribution structure. The RDL tool set 105 may form the conductive pads 340 by removing portions of a polymer layer 336 of the redistribution structure 322 to form recesses in the polymer layer 336, and may form the conductive pads 340 in the recesses.

As shown in FIG. 5I, conductive terminals 342 may be formed over and/or on the redistribution structure 322. The connection tool set 115 may form the conductive terminals 342 on the conductive pads 340.

As shown in FIG. 5K, the semiconductor device package 300 may be placed on a frame 514. The frame 514 may be referred to as a tape frame or another type of frame that supports the semiconductor device package 300 during processing. In some implementations, a plurality of semiconductor device packages 300 are formed on the carrier substrate 508 and subsequently placed on the frame 514 for processing. In these implementations, the frame 514 may also support the semiconductor device packages 300 during singulation to cut the semiconductor device packages 300 into individual pieces after processing.

Carrier substrate de-bonding is performed to detach (or "de-bond") the carrier substrate 508 from the semiconductor device package 300. The singulation tool set 125 may de-bond the carrier substrate 508 using one or more techniques, such as projecting a light (e.g., a laser light or an UV light) onto the LTHC release layer 510 between the carrier substrate 508 and the DAF 512 so that the LTHC release layer 510 decomposes under the heat of the light. A planarization tool set 110 may perform a planarization operation to remove the DAF 512 and to planarize the top surface of the polymer layer 344 of the redistribution structure 324 after the carrier substrate 508 is removed.

As further shown in FIG. 5K, the RDL tool set 105 may attach a BEL film 350 to the top side of the redistribution structure 324. The RDL tool set 105 may laminate the BEL film 350 to the top side of the redistribution structure 324 and/or may attach the BEL film 350 to the top side of the redistribution structure 324 using another technique.

As shown in FIG. 5L, the singulation tool set 125 may perform a laser drilling operation and/or another type of operation to form openings 516 in the BEL film 350 to expose portions of one or more metallization layers 346 through the openings 516.

As shown in FIG. 5M, connectors 348 may be formed in the openings 516 such that the connectors 348 are attached to exposed portions of the one or more metallization layers 346. For example, the connection tool set 115 may form the connectors 348 in the openings 516. The semiconductor device package 300 may be subsequently removed from the frame 514.

As shown in FIG. 5N, the semiconductor die package 352 may be attached to the redistribution structure 324, and an underfill material 354 may be dispensed in between the connectors 348 and the BEL film 350. Alternatively, the operations that are illustrated and described in connection with FIG. 5N are omitted, and the semiconductor device package 300 is prepared for finishing at a subsequent manufacturer or end user. At the end user, the semiconductor device package 300 may be attached to a PCB 518 using the SMT tool set 145, and an underfill 520 may be dispensed around the semiconductor device package 300.

The die-attach tool set 130 may attach the semiconductor die package 352 to the redistribution structure 324 by placing the semiconductor die package 352 on the connectors 348 and performing a reflow operation to cause the connectors 348 to bond with the semiconductor die package 352. In some implementations, a solder paste may be placed on the tops of the connectors 348 in preparation for attaching the semiconductor die package 352 to the connectors 348.

The encapsulation tool set 135 may deposit the underfill material 354 in a capillary flow process, in which the capillary effect is used to deposit the underfill material 354 in between the connectors 348 and the BEL film 350. Alternatively, another suitable technique may be used to deposit the underfill material 354.

As indicated above, FIGS. 5A-5N are provided as an example. Other examples may differ from what is described with regard to FIGS. 5A-5N.

Figure 6A:
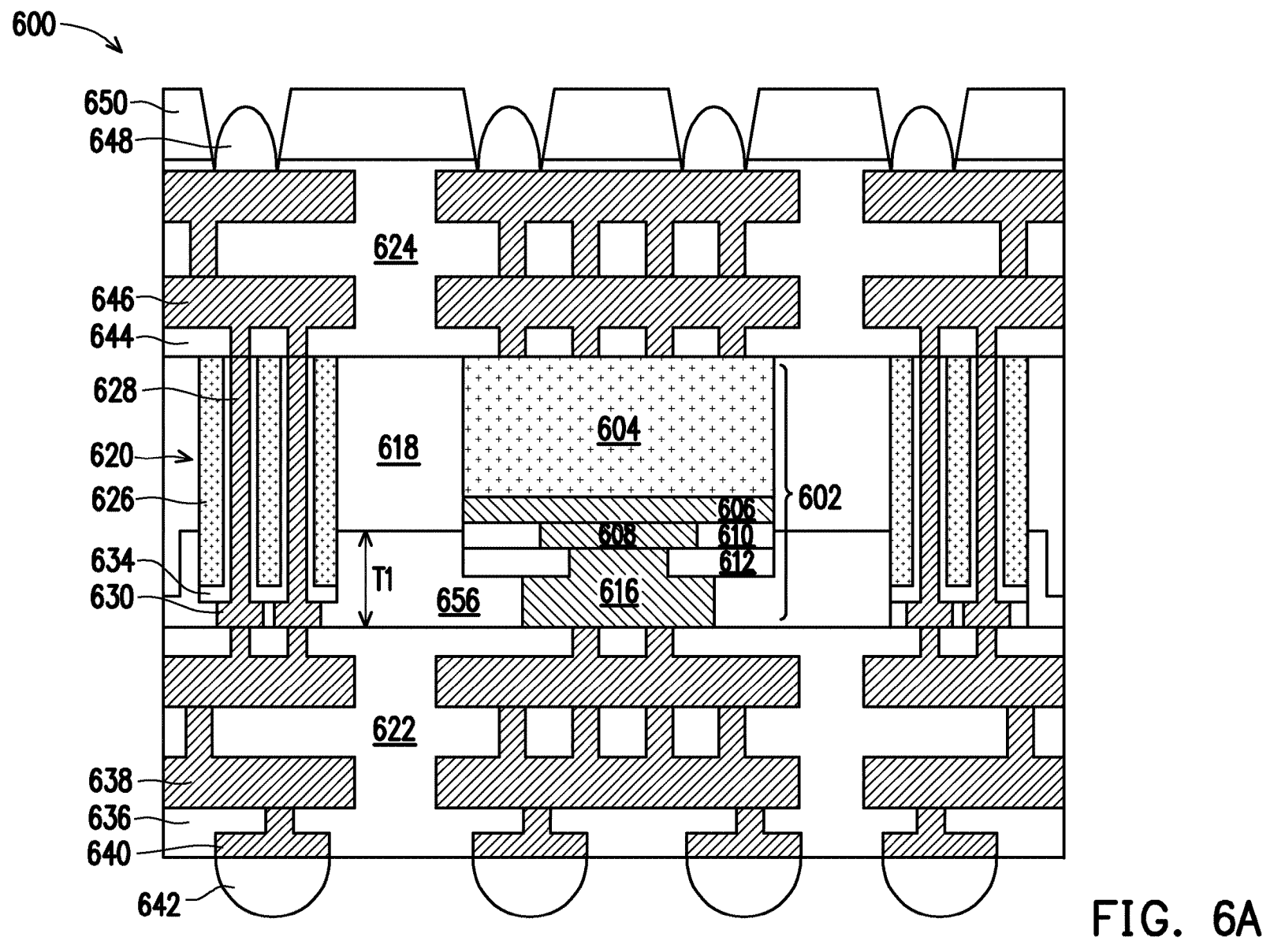
Figure 6B:
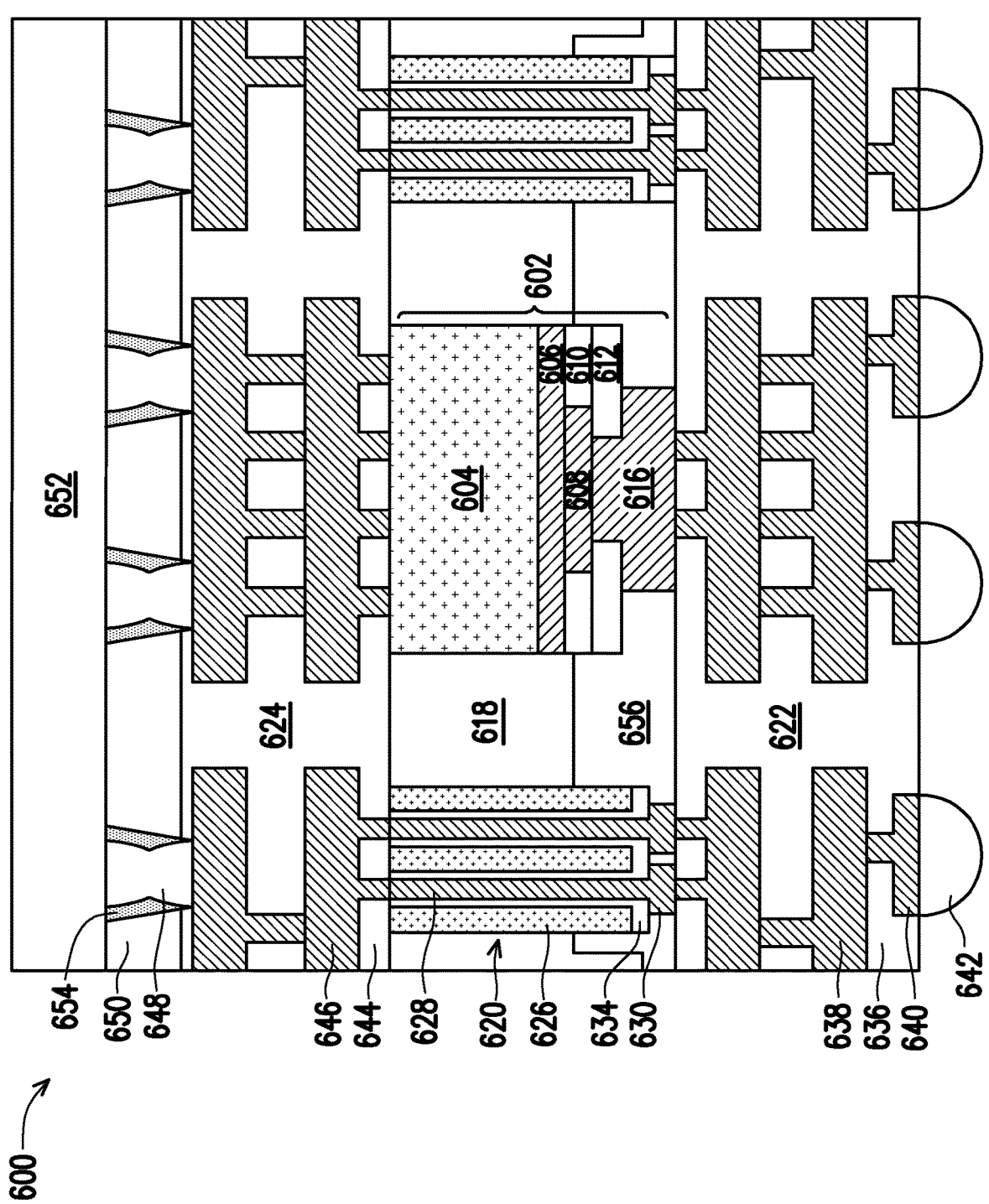

FIGS. 6A and 6B are diagrams of example implementations of a semiconductor device package 600 described herein. The semiconductor device package 600 includes a packaged semiconductor device that includes one or more semiconductor die packages. The semiconductor device package 600 may be referred to as a package on package (PoP) semiconductor device package, a 3D package, a 2.5D package, an integrated fanout (InFO) package, and/or another type of semiconductor device package that includes one or more semiconductor die packages.

The semiconductor device package 600 includes a similar arrangement of structures and/or layers as the semiconductor device package 300. For example, and as shown in FIG. 6A, the semiconductor device package 600 may include components 602-630 and 634-650 that correspond to components 302-330 and 334-350 of the semiconductor device package 300 shown in FIG. 3A. As another example, and as shown in FIG. 6B, the semiconductor device package 600 may include components 602-630 and 634-654 that correspond to components 302-330 and 334-354 of the semiconductor device package 300 shown in FIG. 3B.

However, as shown in FIGS. 6A and 6B, the polymer layer 332 may be omitted from the semiconductor device package 600. Instead, the semiconductor device package 600 may include a thick die attach film (DAF) 656 between the silicon layer 626 of the TSV packages 620 and the redistribution structure 622. The DAF 656 surrounds the metal bumps 630 of the TSV packages 620 instead of a polymer layer. Moreover, the DAF 656 is included between the polymer layer 612 of the semiconductor die package 602 and the redistribution structure 622. The DAF 656 surrounds the connector(s) 616 of the semiconductor die package 602 instead of a low temperature polyimide (LTPI) layer. The use of the DAF 656 may reduce the cost and complexity of manufacturing the TSV packages 620 and the semiconductor die package 602 in that fewer polymer layers need to be formed for the TSV packages 620 and the semiconductor die package 602 when using the DAF 656.

The DAF 656 may include a thermoplastic material, such as epoxy resin, phenol resin, or poly-olefin, among other examples. Other thermoplastic materials or polymers compatible with semiconductor processing environments may be used. The DAF 656 may be deposited in liquid form having a relatively high viscosity to enable displacement of material of the DAF 656 as the TSV packages 620 and the semiconductor die package 602 are placed in the DAF 656 during manufacturing of the semiconductor device package 600. The DAF 656 may transition to a solid form as the temperature of the DAF 656 approaches room temperature.

As shown in FIG. 6A, the DAF 656 may have a thickness T1. The thickness T1 may be included in a range of approximately 30 microns to approximately 200 microns to sufficiently fill in the gaps between the TSV packages 620 and the redistribution structure 622, to sufficiently fill in the gaps between the semiconductor die package 602 and the redistribution structure 622, and to sufficiently fill in the gaps between the encapsulation layer 618 and the redistribution structure 622. However, other values for the range are within the scope of the present disclosure.

In some implementations, the thickness of the DAF 656 may be different in different areas of the semiconductor device package 600. For example, the thickness of the DAF 656 may be greater around the TSV packages 620 and around the semiconductor die package 602 due to the displacement of material of the DAF 656 when the TSV packages 620 and the semiconductor die package 602 are placed in the DAF 656 during manufacturing of the semiconductor device package 600.

In some implementations, the thickness T1 of the DAF 656 is greater relative to a thickness of the metal bumps 630. In some implementations, the DAF 656 surrounds the silicon layer 626 along a portion of a height of the silicon layer 626. In some implementations, DAF 656 extends above the connector(s) 616.

As indicated above, FIGS. 6A and 6B are provided as examples. Other examples may differ from what is described with regard to FIGS. 6A and 6B.

FIGS. 7A-7E are diagrams of an example implementation 700 of forming a plurality of TSV packages 620 described herein.

Figure 7A:
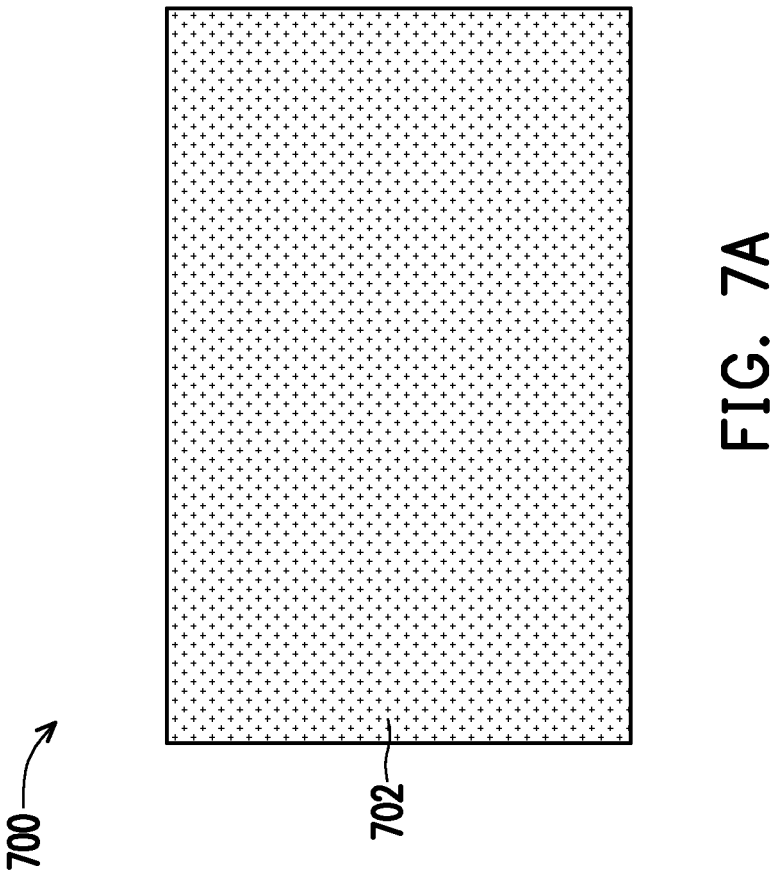
FIGS. 7A-7E are diagrams of an example implementation of forming a plurality of TSV packages described herein.

As shown in FIG. 7A, one or more operations in the example implementation 700 may be performed in connection with a substrate 702. In some implementations, the substrate 702 includes a silicon (Si) substrate or a silicon wafer. The use of a silicon substrate enables the TSV packages 620 to be formed in a frontend semiconductor manufacturing environment (e.g., the environment 200 of FIG. 2) using frontend semiconductor processing tools (e.g., the semiconductor processing tools 202-212). Alternatively, substrate 702 may include a substrate formed of a material including silicon, a III-V compound semiconductor material substrate such as gallium arsenide (GaAs), a silicon on insulator (SOI) substrate, a germanium substrate (Ge), a silicon germanium (SiGe) substrate, a silicon carbide (SiC) substrate, or another type of semiconductor substrate. The substrate 702 may include various layers, including conductive or insulating layers formed on a semiconductor substrate. The substrate 702 may include a compound semiconductor and/or an alloy semiconductor.

Figure 7B:
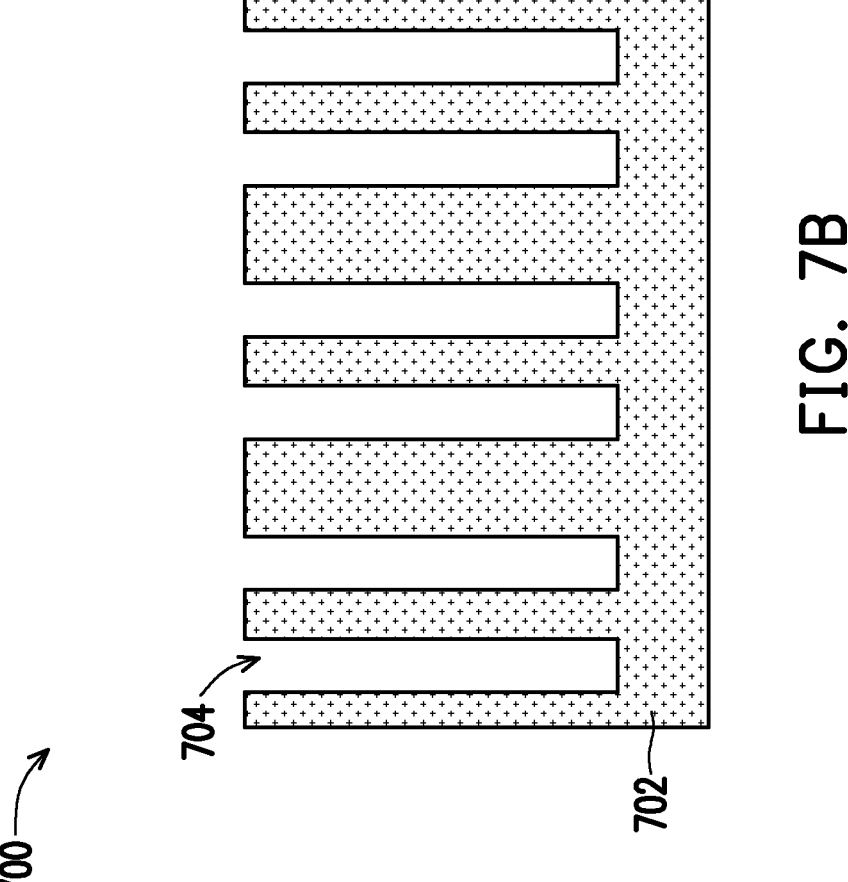

As shown in FIG. 7B, a plurality of recesses (or openings) 704 may be formed in the substrate 702. In some implementations, a pattern in a photoresist layer is used to etch the substrate 702 to form the recesses 704 in the substrate 702. In these implementations, the deposition tool 202 forms the photoresist layer on the substrate 702. The exposure tool 204 exposes the photoresist layer to a radiation source to pattern the photoresist layer. The developer tool 206 develops and removes portions of the photoresist layer to expose the pattern. The etch tool 208 etches the substrate 702 based on the pattern to form the recesses 704. In some implementations, the etch operation includes a plasma etch operation, a wet chemical etch operation, and/or another type of etch operation. In some implementations, a photoresist removal tool removes the remaining portions of the photoresist layer (e.g., using a chemical stripper, plasma ashing, and/or another technique). In some implementations, a hard mask layer is used as an alternative technique for etching the substrate 702 based on a pattern.

Figure 7C:
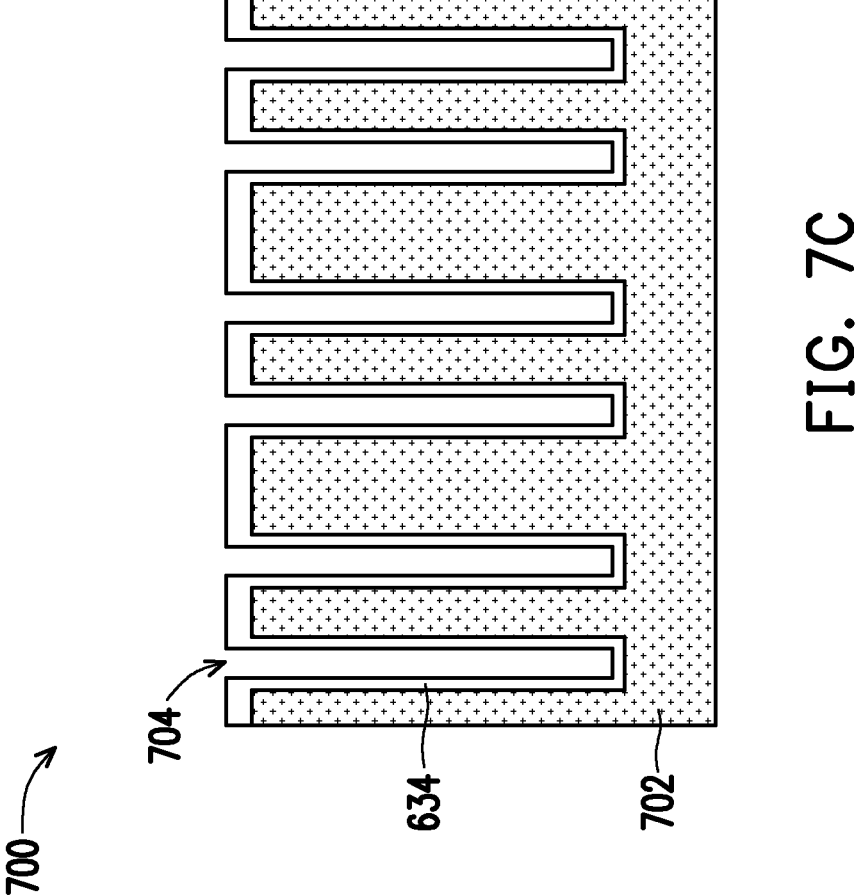

As shown in FIG. 7C, an oxide liner 634 is formed on sidewalls and on a bottom surface of the recesses 704. The deposition tool 202 may deposit the oxide liner 634 using a CVD technique, a PVD technique, and ALD technique, and/or another deposition technique. The deposition tool 202 may conformally deposit the oxide liner 634 such that the oxide liner 634 conforms to the sidewalls and the bottom surface of the recesses 704. As further shown in FIG. 7C, the oxide liner 634 may also be formed on the top surface of the substrate 702.

Figure 7D:
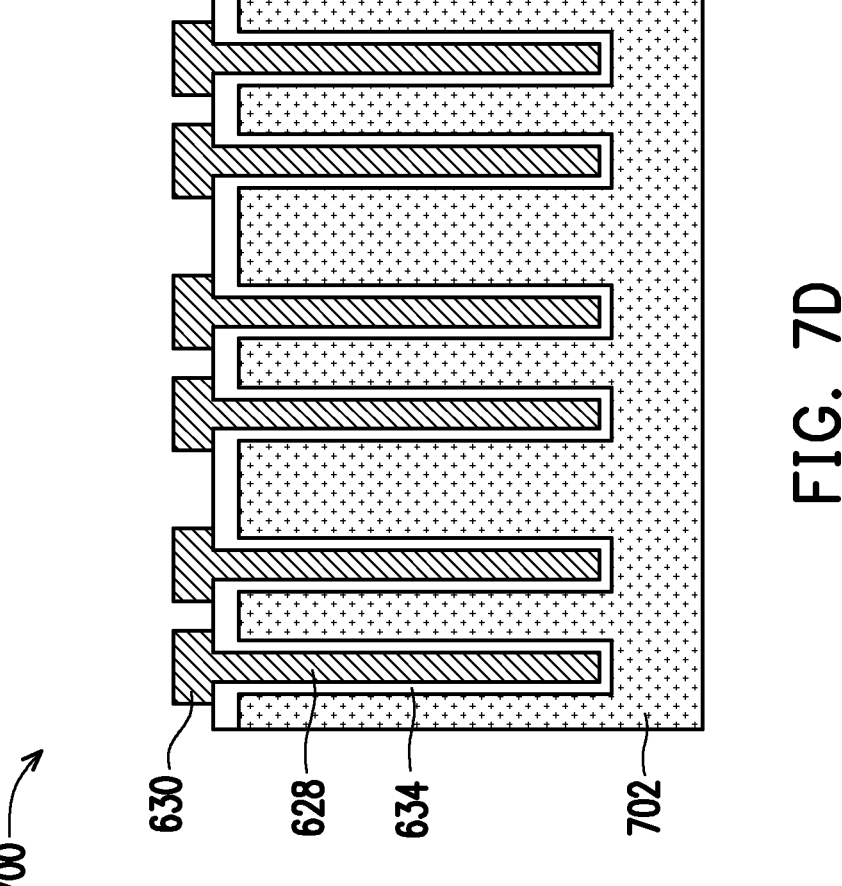

As shown in FIG. 7D, TSV structures 628 may be formed on the oxide liner 634 in the recesses 704. The deposition tool 202 and/or the plating tool 212 deposits the conductive material of the TSV structures 628 using a CVD technique, a PVD technique, an ALD technique, an electroplating technique, another deposition technique described above in connection with FIG. 2, and/or a deposition technique other than as described above in connection with FIG. 2. In some implementations, an annealing operation may be performed to reflow the TSV structures 628 after deposition of the TSV structures 628. The annealing operation may be performed to remove voids, seams, and/or other types of defects in the TSV structures 628.

As further shown in FIG. 7D, metal bumps 630 may be formed on the TSV structures 628. The deposition tool 202 and/or the plating tool 212 deposits the conductive material of the metal bumps 630 using a CVD technique, a PVD technique, an ALD technique, an electroplating technique, another deposition technique described above in connection with FIG. 2, and/or a deposition technique other than as described above in connection with FIG. 2. In some implementations, an annealing operation may be performed to reflow the metal bumps 630 after deposition of the metal bumps 630. The annealing operation may be performed to remove voids, seams, and/or other types of defects in the metal bumps 630.

Figure 7E:
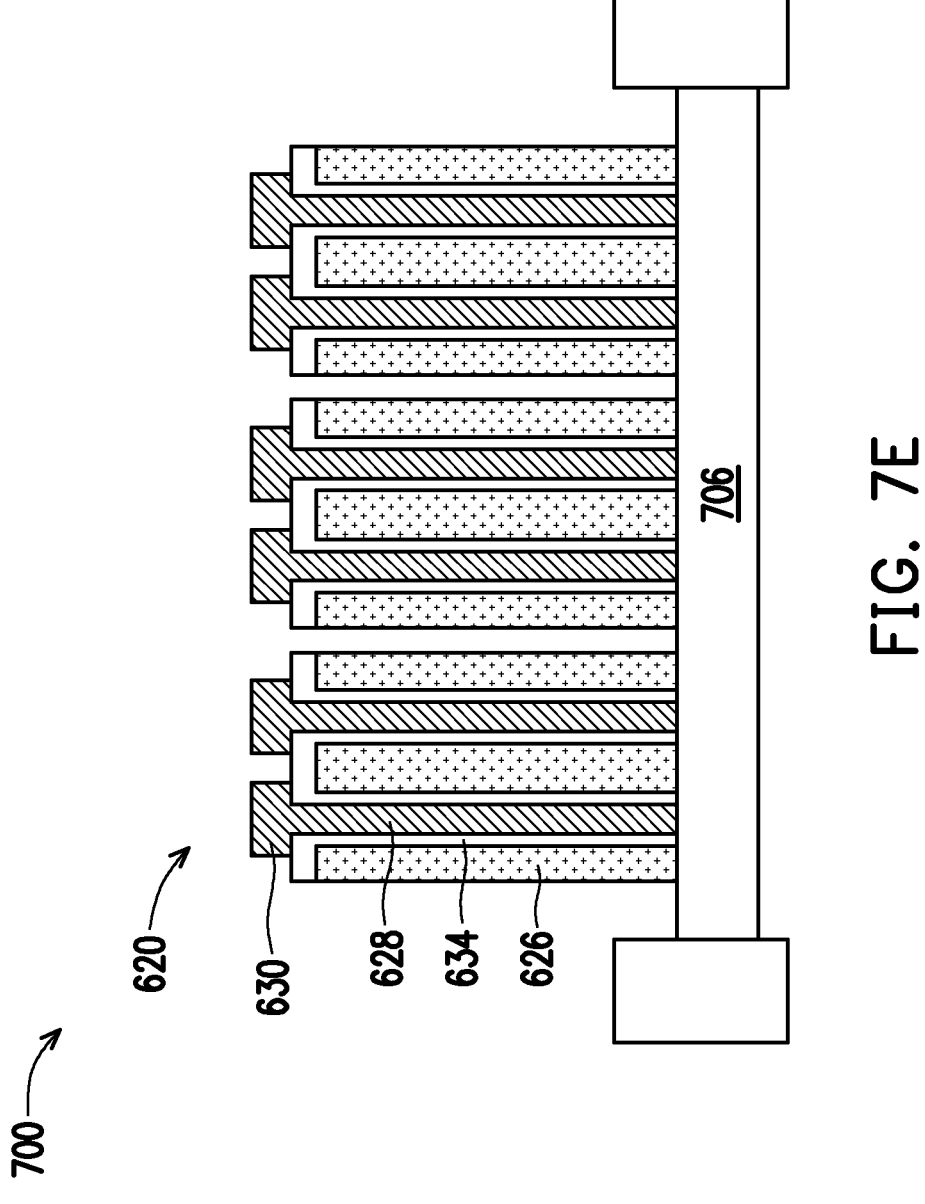

As shown in FIG. 7E, the substrate 702 may be placed on a frame 706 and may be diced, cut, and/or otherwise separated into TSV packages (or TSV dies) 620 (e.g., without first forming a polymer layer over the metal bumps 630). Each TSV package 620 may include a plurality of the TSV structures 628. TSV packages 620 may then be packaged for storage and/or shipment to a semiconductor packaging facility for use in the manufacturing of semiconductor device packages such as the semiconductor device package 600.

As indicated above, FIGS. 7A-7E are provided as an example. Other examples may differ from what is described with regard to FIGS. 7A-7E.

FIGS. 8A-8E are diagrams of an example implementation 800 of forming a semiconductor device package 600 that includes a plurality of TSV packages 620 described herein. The TSV packages 620 may be formed according to the example implementation 700 described in connection with FIGS. 7A-7E.

Figure 8A:
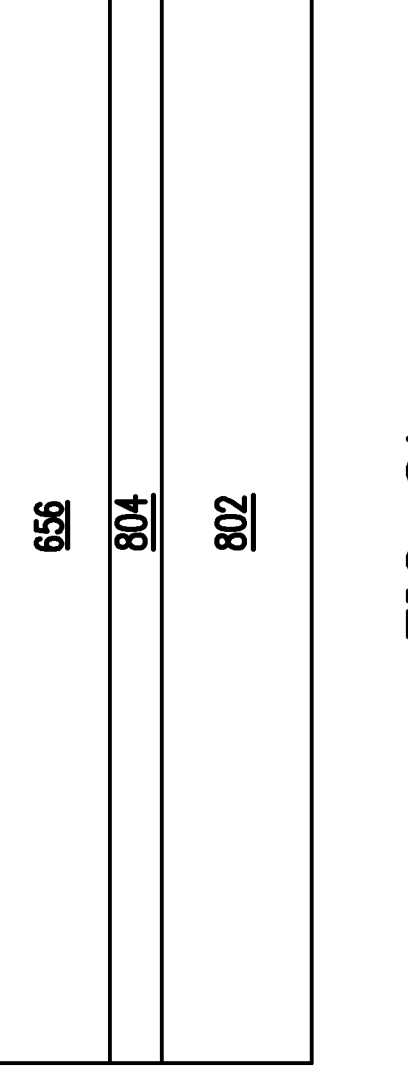
FIGS. 8A-8E are diagrams of an example implementation of forming a semiconductor device package that includes a plurality of TSV packages described herein.

As shown in FIG. 8A, portions of the example implementation 800 may be performed in connection with a carrier substrate 802. The carrier substrate 802 may include a glass substrate, a silicon substrate, and/or another suitable carrier substrate. One or more layers may be included on the carrier substrate 802, such as a light-to-heat conversion (LTHC) release layer 804 that is formed over and/or on the carrier substrate 802, and a DAF 656 that is formed over and/or on the LTHC release layer 504. The DAF 656 may be configured to adhere components of the semiconductor device package 600 to the carrier substrate 802 for processing. The LTHC release layer 804 may be configured to enable the semiconductor device package 600 to be removed or debonded from the carrier substrate 802 after processing.

Figure 8B:
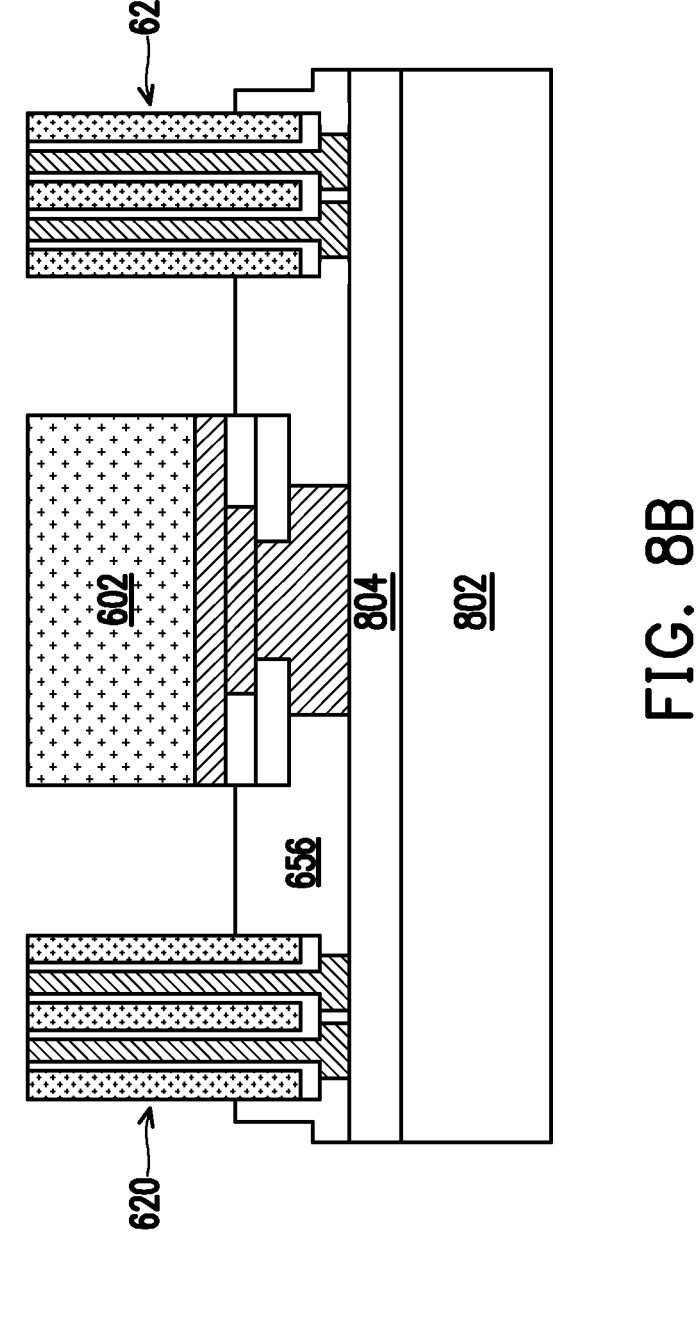

As shown in FIG. 8B, one or more TSV packages 620 and a semiconductor die package 602 may be placed on the carrier substrate 802. The TSV packages 620 and a semiconductor die package 602 may be secured in place and adhered to the carrier substrate 802 by the DAF 656. In some implementations, die-attach tool set 130 may pick and place the TSV packages 620 and the semiconductor die package 602 into the DAF 656 over the carrier substrate 802 such that the metal bumps 630 and the connector(s) 616 are submerged in the DAF 656. Thus, the die-attach tool set 130 may pick and place the TSV packages 620 and the semiconductor die package 602 into the DAF 656 when the DAF 656 is in a liquid state or a semi-liquid state. In some implementations, placing the TSV packages 620 and the semiconductor die package 602 into the DAF 656 may cause the thickness of the DAF 656 to increase, particularly around the TSV packages 620 and around the semiconductor die package 602.

In some implementations, the TSV packages 620 may be placed onto the carrier substrate 802 prior to the semiconductor die package 602, and the semiconductor die package 602 may be placed onto the carrier substrate 802 after the TSV packages 620 are placed onto the carrier substrate 802. Alternatively, the semiconductor die package 602 may be placed first, and then the TSV packages 620 may be placed.

Figure 8C:
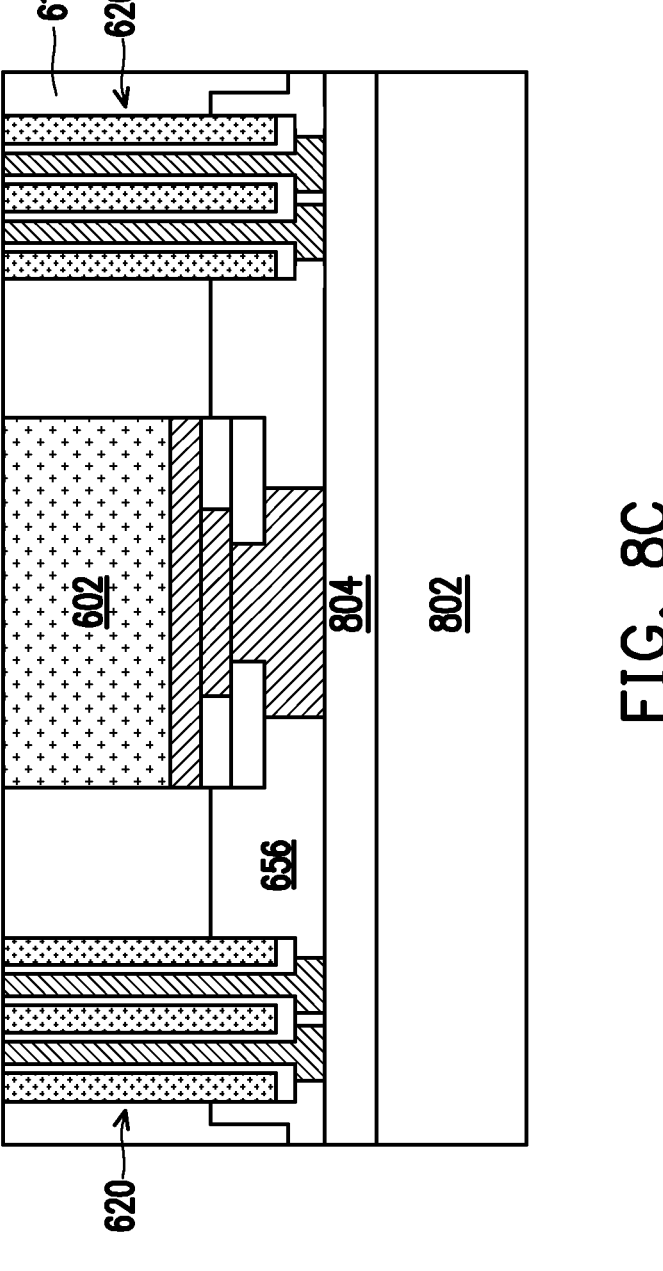

As shown in FIG. 8C, an encapsulation layer 618 may be formed over the DAF 656. The encapsulation tool set 135 may deposit the molding compound of the encapsulation layer 618 around the TSV packages 620 and around the semiconductor die package 602 such that, in a top-down view of the semiconductor device package 600, the TSV packages 620 and the semiconductor die package 602 are encapsulated and/or surrounded by the encapsulation layer 618. The encapsulation tool set 135 may deposit the encapsulation layer 618 by compression molding, transfer molding, or by another suitable technique. The molding compound of the encapsulation layer 618 may be applied in liquid or semi-liquid form and then subsequently cured.

The planarization tool set 110 may subsequently perform a planarization operation to remove and planarize an upper surface of the encapsulation layer 618 that is formed over the tops of the TSV packages 620 and/or over the top of the semiconductor die package 602. This exposes the tops of the TSV packages 620 and the top of the semiconductor die package 602 through the encapsulation layer 618.

Figure 8D:
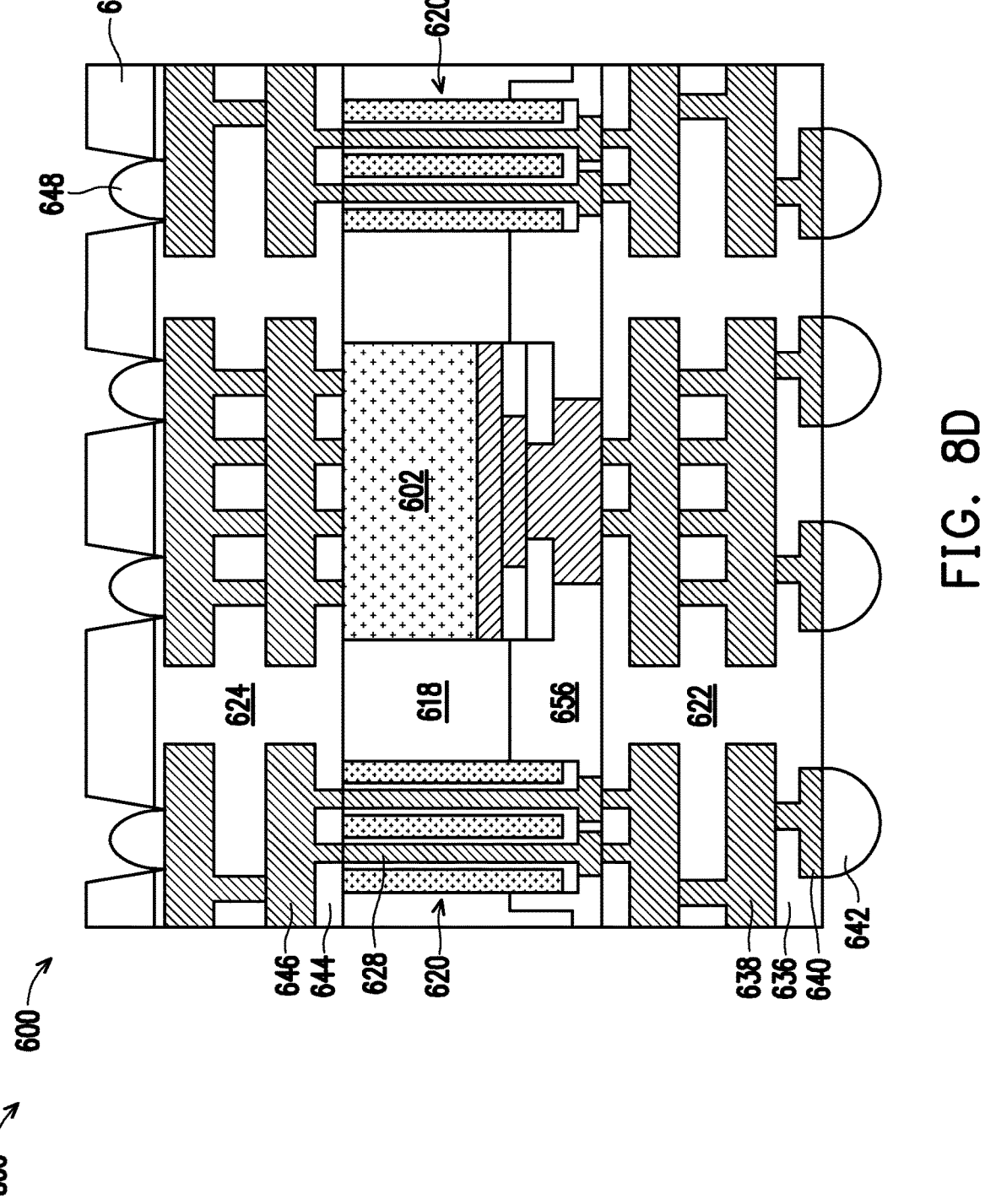
Figure 8E:
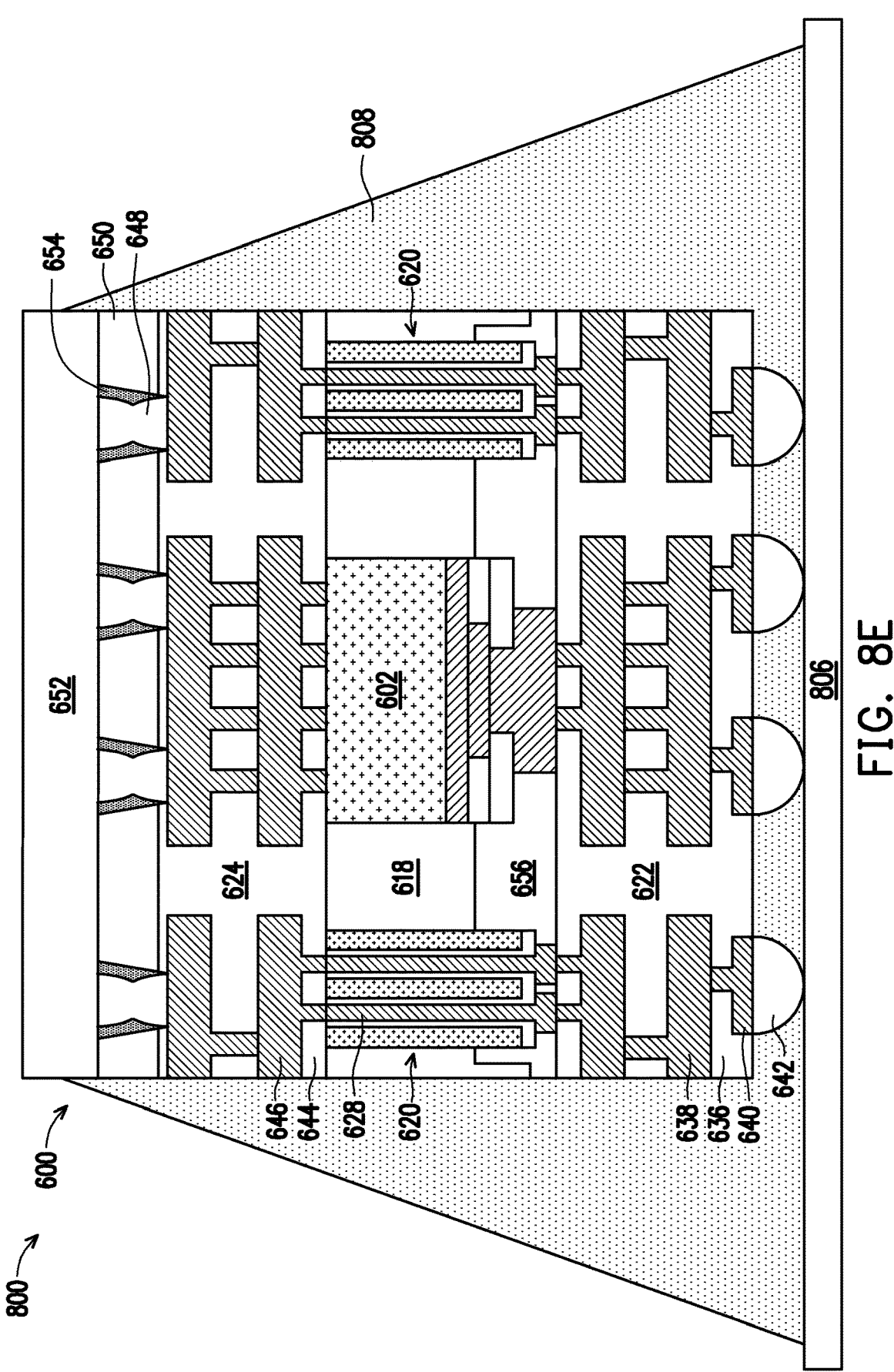

As shown in FIG. 8D, similar processing operations as those shown in FIGS. 5E-5M may be performed to form the components 622, 624 and 636-650 in the semiconductor device package 600. As shown in FIG. 8E, the semiconductor die package 652 may be attached to the redistribution structure 624, and an underfill material 654 may be dispensed in between the connectors 648 and the BEL film 650. Alternatively, the operations that are illustrated and described in connection with FIG. 8E are omitted, and the semiconductor device package 600 is prepared for finishing at a subsequent manufacturer or end user. At the end user, the semiconductor device package 600 may be attached to a PCB 806 using the SMT tool set 145, and an underfill 808 may be dispensed around the semiconductor device package 600.

As indicated above, FIGS. 8A-8E are provided as an example. Other examples may differ from what is described with regard to FIGS. 8A-8E.

Figure 9A:
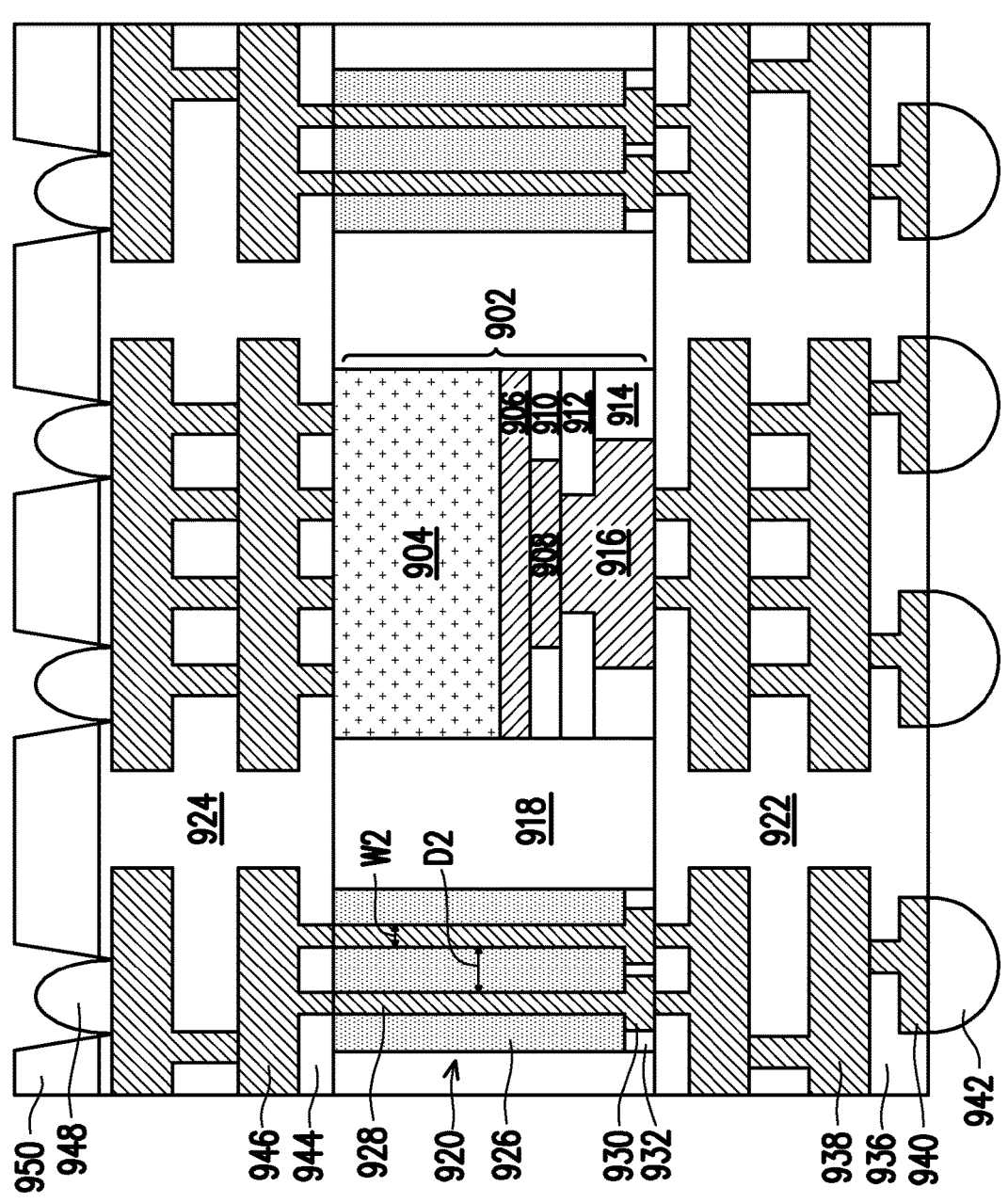
FIGS. 9A and 9B are diagrams of example implementations of a semiconductor device package described herein.
Figure 9B:
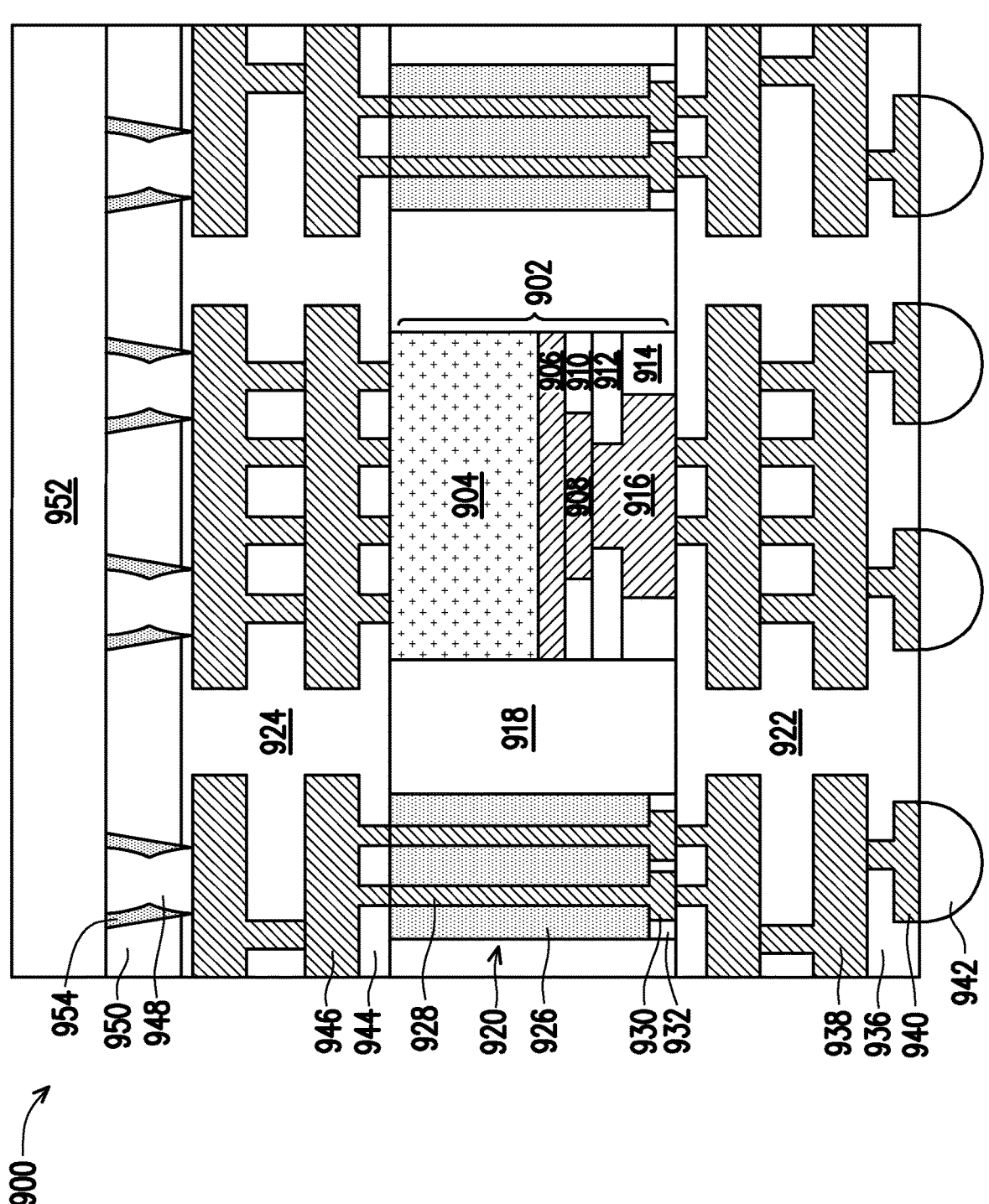

FIGS. 9A and 9B are diagrams of example implementations of a semiconductor device package 900 described herein. The semiconductor device package 900 includes a packaged semiconductor device that includes one or more semiconductor die packages. The semiconductor device package 900 may be referred to as a package on package (PoP) semiconductor device package, a 3D package, a 2.5D package, an integrated fanout (InFO) package, and/or another type of semiconductor device package that includes one or more semiconductor die packages.

The semiconductor device package 900 includes a similar arrangement of structures and/or layers as the semiconductor device package 300. For example, and as shown in FIG. 9A, the semiconductor device package 900 may include components 902-950 that are similar to components 302-350 of the semiconductor device package 300 shown in FIG. 3A. As another example, and as shown in FIG. 9B, the semiconductor device package 900 may include components 902-954 that are similar to components 302-354 of the semiconductor device package 300 shown in FIG. 3B.

However, as shown in FIGS. 9A and 9B, the semiconductor device package 900 includes one or more TIV packages 920 over the redistribution structure 922 as opposed to TSV packages 320. Each TIV package 920 may include an encapsulation layer 926 and a plurality of TIV structures 928 that extend through the encapsulation layer 926 and are connected to the redistribution structures 922 and 924 on opposing ends of the TIV structures 928. The TIV structures 928 may be referred to as TIV structures in that the TIV structures 928 extend through an encapsulation layer (e.g., a molding compound layer) as opposed to a silicon layer through which a TSV structure extends. The encapsulation layer 926 may include a molding compound, such as a polymer, one or more fillers dispersed in a resin, an epoxy-based resin, and/or another type of insulating material.

As further shown in FIGS. 9A and 9B, the oxide liner 334 may also omitted from the semiconductor device package 900. However, each TIV package 920 may include a plurality of metal bumps 930 (or another type of conductive connection structures) and a polymer layer 932, between the encapsulation layer 926 and the redistribution structure 922, surrounding the metal bumps 930.

As further shown in FIG. 9A, the TIV structures 928 of a TIV package 920 may each have a width W2. In some implementations, the width W2 of a TIV structure 928 is included in a range of approximately 20 microns to approximately 200 microns, which is lesser than a width of a related TIV structure (e.g., which might be in a range of approximately 20 microns to approximately 700 microns) that would otherwise be directly formed on a carrier substrate in a backend packing facility during manufacturing of the semiconductor device package 900. However, other values for these ranges are within the scope of the present disclosure.

The TIV structures 928 of a TIV package 920 may be spaced apart by a distance D2. In some implementations, the distance D2 between adjacent TIV structures 928 is included in a range of approximately 20 microns to approximately 200 microns, which is lesser than a distance between related TIV structures (e.g., which might be in a range of approximately 20 microns to approximately 700 microns) that would otherwise be directly formed on a carrier substrate in a backend packing facility during manufacturing of the semiconductor device package 900. However, other values for these ranges are within the scope of the present disclosure.

As indicated above, FIGS. 9A and 9B are provided as examples. Other examples may differ from what is described with regard to FIGS. 9A and 9B.

Figure 10A:
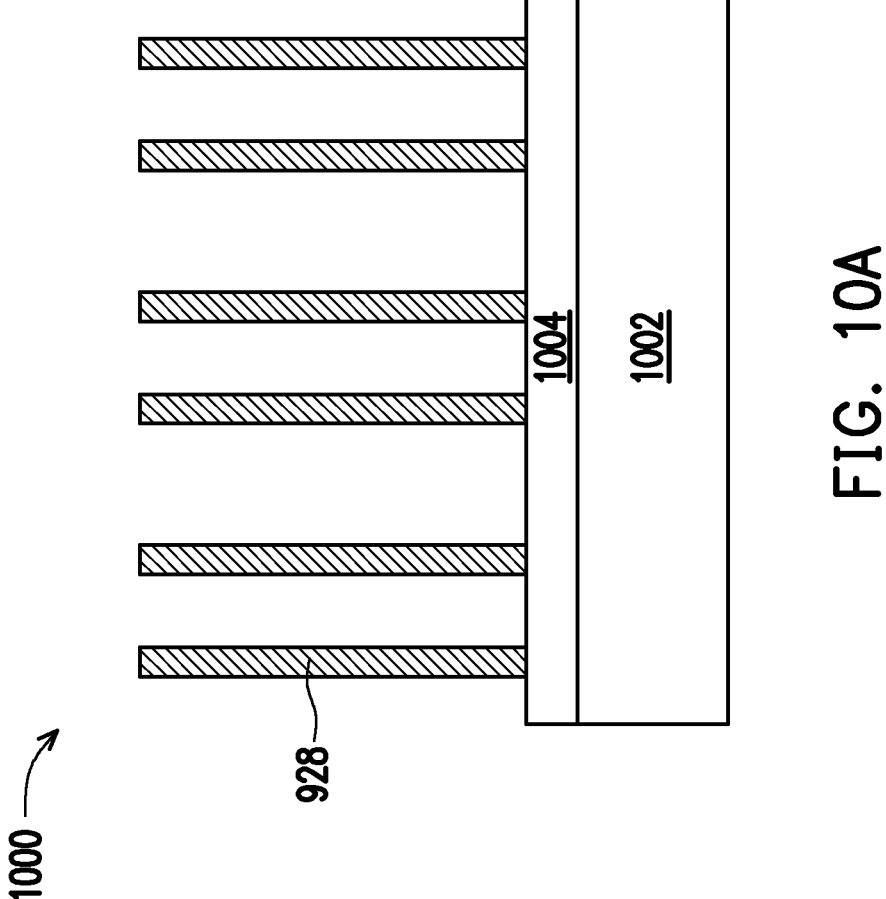
FIGS. 10A-10C are diagrams of an example implementation of forming a plurality of TIV packages described herein.
Figure 10B:
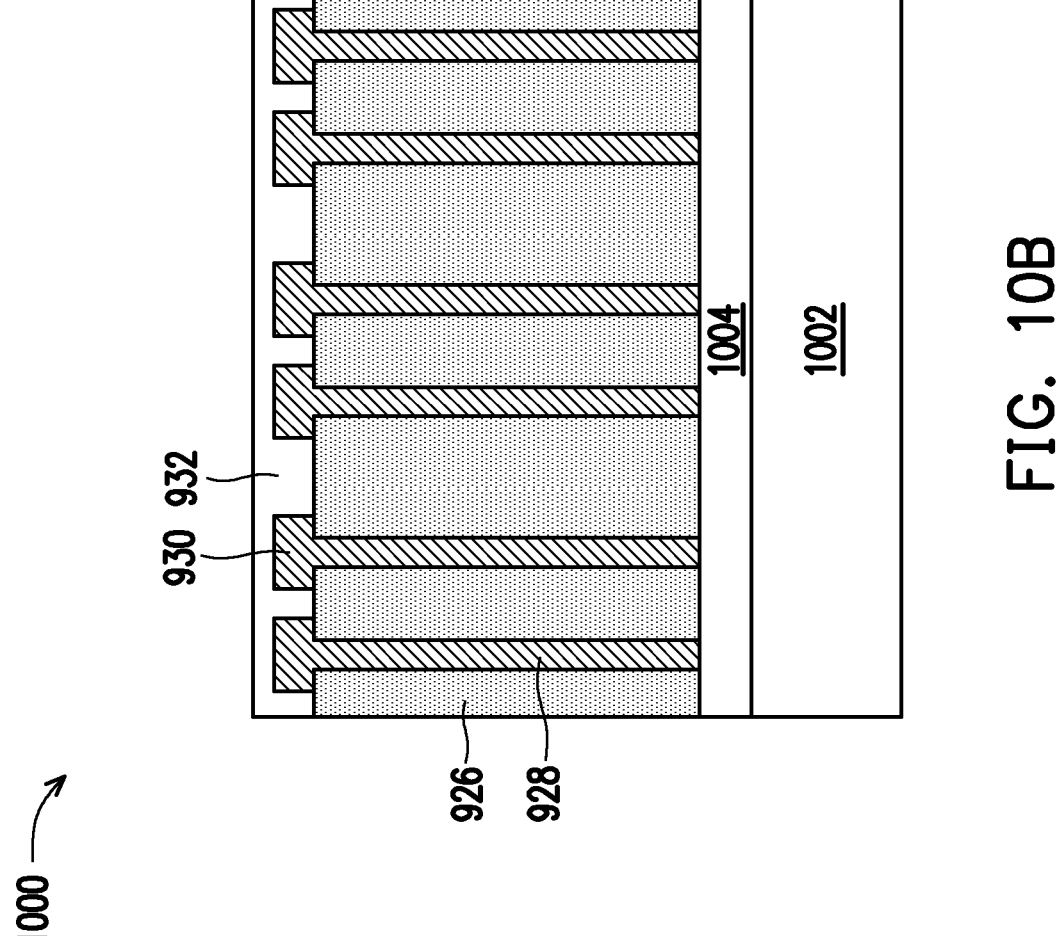
Figure 10C:
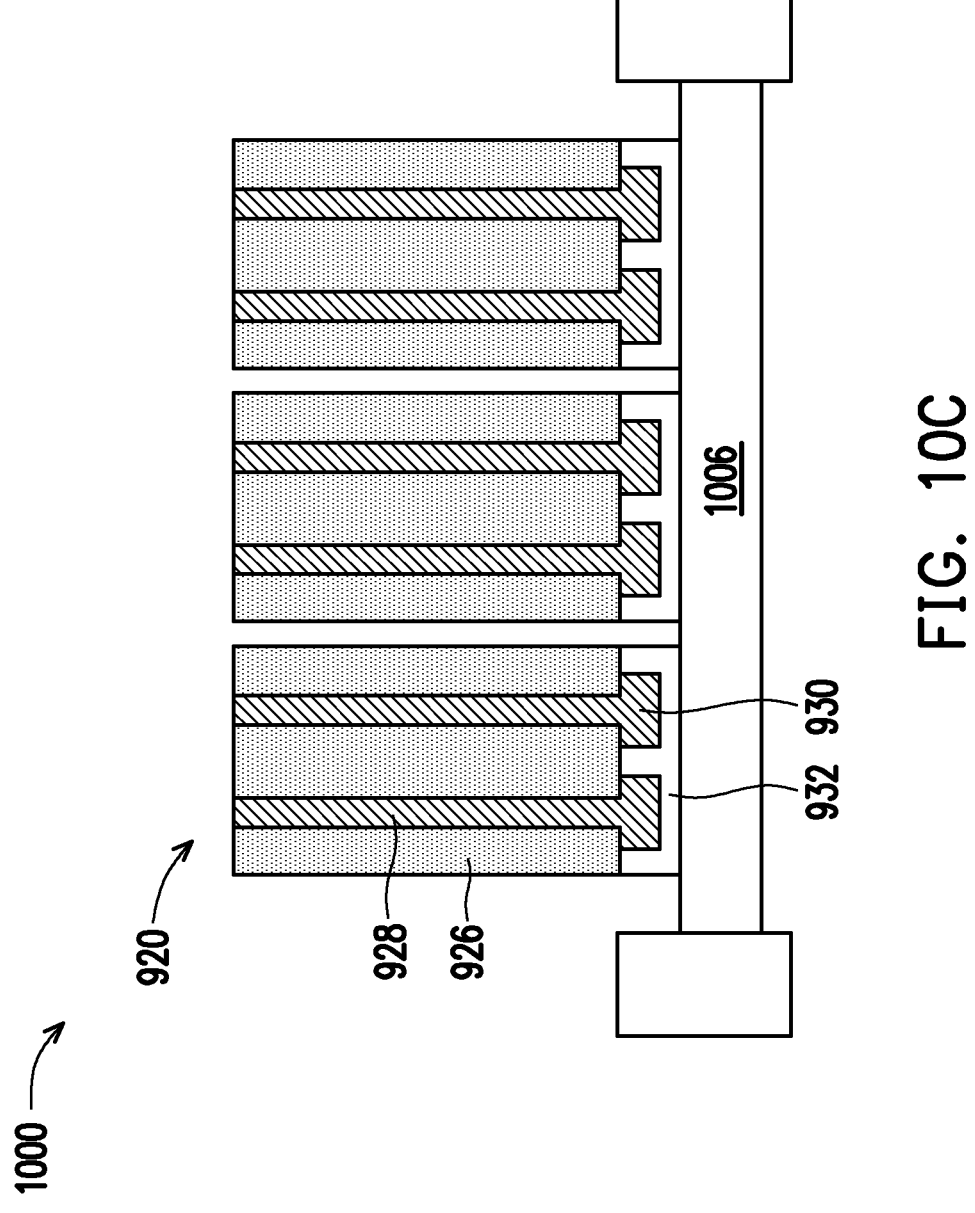

FIGS. 10A-10C are diagrams of an example implementation 1000 of forming a plurality of TIV packages 920 described herein. The TIV packages 920 may be manufactured (e.g., pre-manufactured) prior to being placed into a semiconductor device package (e.g., the semiconductor device package 900). Pre-manufacturing the interconnect structure packages may enable the interconnects of the interconnect structure packages to be formed to smaller dimensions and greater density in that pre-manufacturing the interconnect structure packages is not subjected to process variations that may occur in backend packaging of the semiconductor device package.

As shown in FIG. 10A, one or more operations in the example implementation 1000 may be performed in connection with a carrier substrate 1002. An LTHC release layer 1004 may be included on the carrier substrate 1002 to enable the TIV packages 920 to be removed from the carrier substrate 1002 after manufacturing of the TIV packages 920.

As further shown in FIG. 10A, TIV structures 928 may be formed over the carrier substrate 1002. The connection tool set 115 may form the TIV structures 928 using a CVD technique, a PVD technique, an ALD technique, an electroplating technique, another deposition technique described above in connection with FIG. 1, and/or a deposition technique other than as described above in connection with FIG. 1.

As shown in FIG. 10B, an encapsulation layer 926 may be formed around the TIV structures 928 such that the TIV structures 928 are encapsulated or surrounded (e.g., in a top down view) by the encapsulation layer 926. The RDL tool set 105 may form the encapsulation layer 926 using a CVD technique, a PVD technique, an ALD technique, an electroplating technique, another deposition technique described above in connection with FIG. 1, and/or a deposition technique other than as described above in connection with FIG. 1.

As further shown in FIG. 10B, metal bumps 930 may be formed on the TIV structures 928. The connection tool set 115 deposits the conductive material of the metal bumps 930 using a CVD technique, a PVD technique, an ALD technique, an electroplating technique, another deposition technique described above in connection with FIG. 1, and/or a deposition technique other than as described above in connection with FIG. 1. In some implementations, an annealing operation may be performed to reflow the metal bumps 930 after deposition of the metal bumps 930. The annealing operation may be performed to remove voids, seams, and/or other types of defects in the metal bumps 930.

As further shown in FIG. 10B, the RDL tool set 105 may form a polymer layer 932 over the substrate and on exposed portions of the encapsulation layer 926. The RDL tool set 105 may also form the polymer layer 932 on the metal bumps 930.

As shown in FIG. 10C, the TIV structures 928 may be placed on a frame 1006 and may be diced, cut, and/or otherwise separated into TIV packages (or TIV dies) 920 by the singulation tool set 125. Each TIV package 920 may include a plurality of the TIV structures 928. TIV packages 920 may then be packaged for storage and/or shipment to a semiconductor packaging facility for use in the manufacturing of semiconductor device packages such as the semiconductor device package 900.

As indicated above, FIGS. 10A-10C are provided as an example. Other examples may differ from what is described with regard to FIGS. 10A-10C.

FIGS. 11A-11F are diagrams of an example implementation 1100 of forming a semiconductor device package 900 that includes a plurality of TIV packages 920 described herein. The TIV packages 920 may be formed according to the example implementation 1000 described in connection with FIGS. 10A-10C.

Figure 11A:
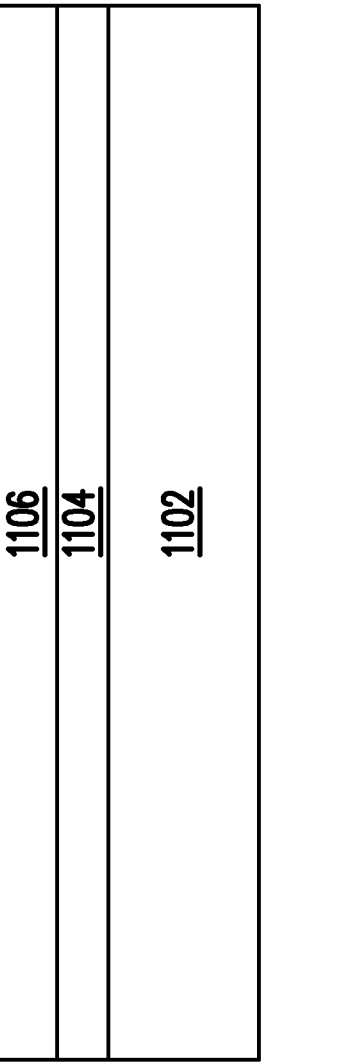
FIGS. 11A-11F are diagrams of an example implementation of forming a semiconductor device package that includes a plurality of through interlayer via (TIV) packages described herein.

As shown in FIG. 11A, portions of the example implementation 1100 may be performed in connection with a carrier substrate 1102. The carrier substrate 1102 may include a glass substrate, a silicon substrate, and/or another suitable carrier substrate. One or more layers may be included on the carrier substrate 1102, such as a light-to-heat conversion (LTHC) release layer 1104 that is formed over and/or on the carrier substrate 1102, and a DAF 1106 that is formed over and/or on the LTHC release layer 1104. The DAF 1106 may be configured to adhere components of the semiconductor device package 900 to the carrier substrate 1102 for processing. The LTHC release layer 1104 may be configured to enable the semiconductor device package 900 to be removed or debonded from the carrier substrate 1102 after processing.

Figure 11B:
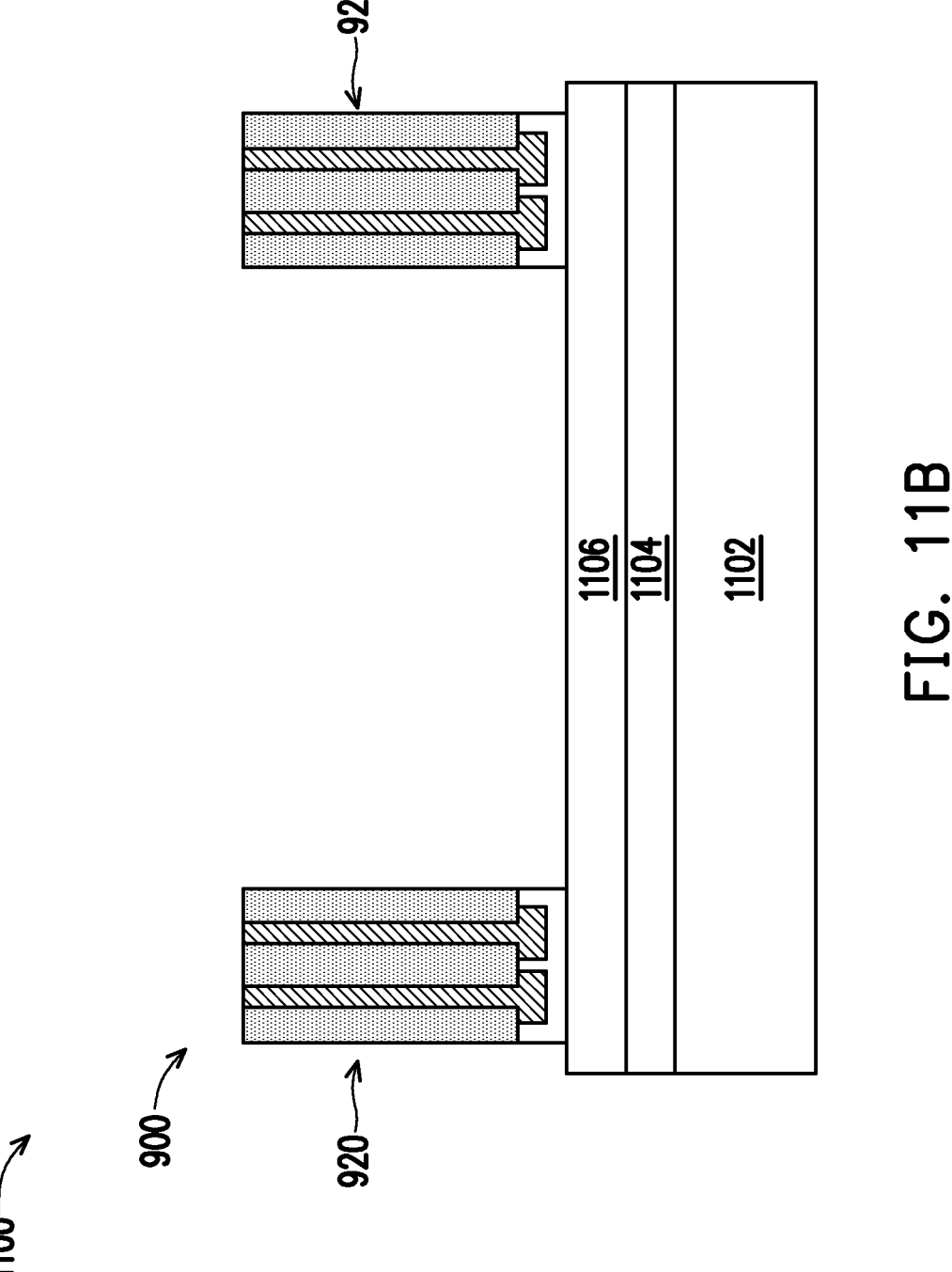

As shown in FIG. 11B, one or more TIV packages 920 may be placed on the carrier substrate 1102. The TIV packages 920 may be secured in place and adhered to the carrier substrate 1102 by the DAF 1106. In some implementations, die-attach tool set 130 may pick and place the TIV packages 920 onto the carrier substrate 1102.

Figure 11C:
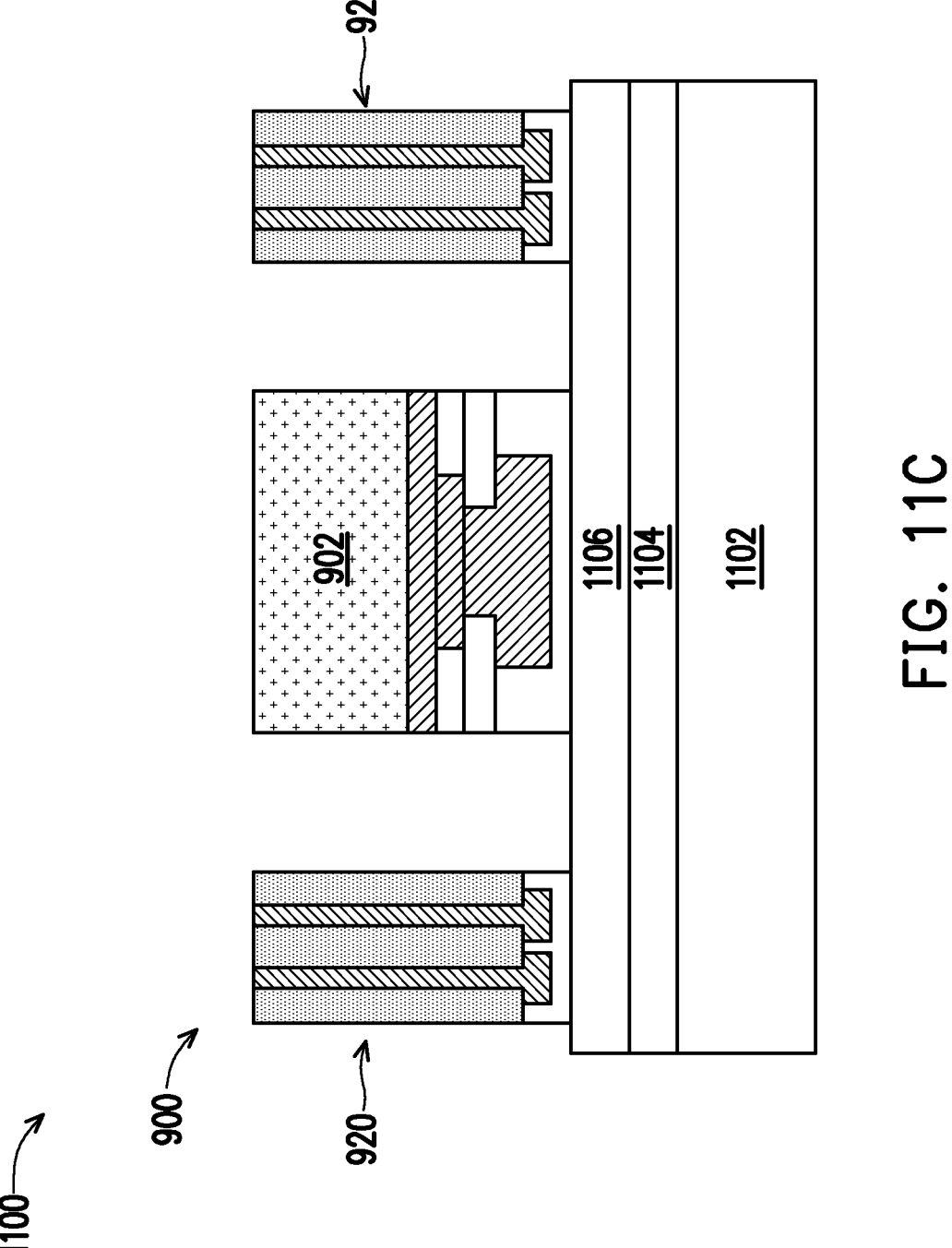

As shown in FIG. 11C, a semiconductor die package 902 may be placed on the carrier substrate 1102. The semiconductor die package 902 may be secure in place and adhered to the carrier substrate 1102 by the DAF 1106. In some implementations, die-attach tool set 130 may pick and place the semiconductor die package 902 onto the carrier substrate 1102.

As shown in FIGS. 11B and 11C, the TIV packages 920 may be placed onto the carrier substrate 1102 prior to the semiconductor die package 902, and the semiconductor die package 902 may be placed onto the carrier substrate 1102 after the TIV packages 920 are placed onto the carrier substrate 1102. The semiconductor die package 902 may be more complex, and may be of higher cost and more time to manufacture, relative to the TIV packages 920. Accordingly, this order of operations may be used to reduce the likelihood of scrapping the semiconductor die package 902 due to defects or other issues with placement of the TIV packages 920. However, in other implementations, the semiconductor die package 902 may be placed first, and then the TIV packages 920 may be placed.

Figure 11D:
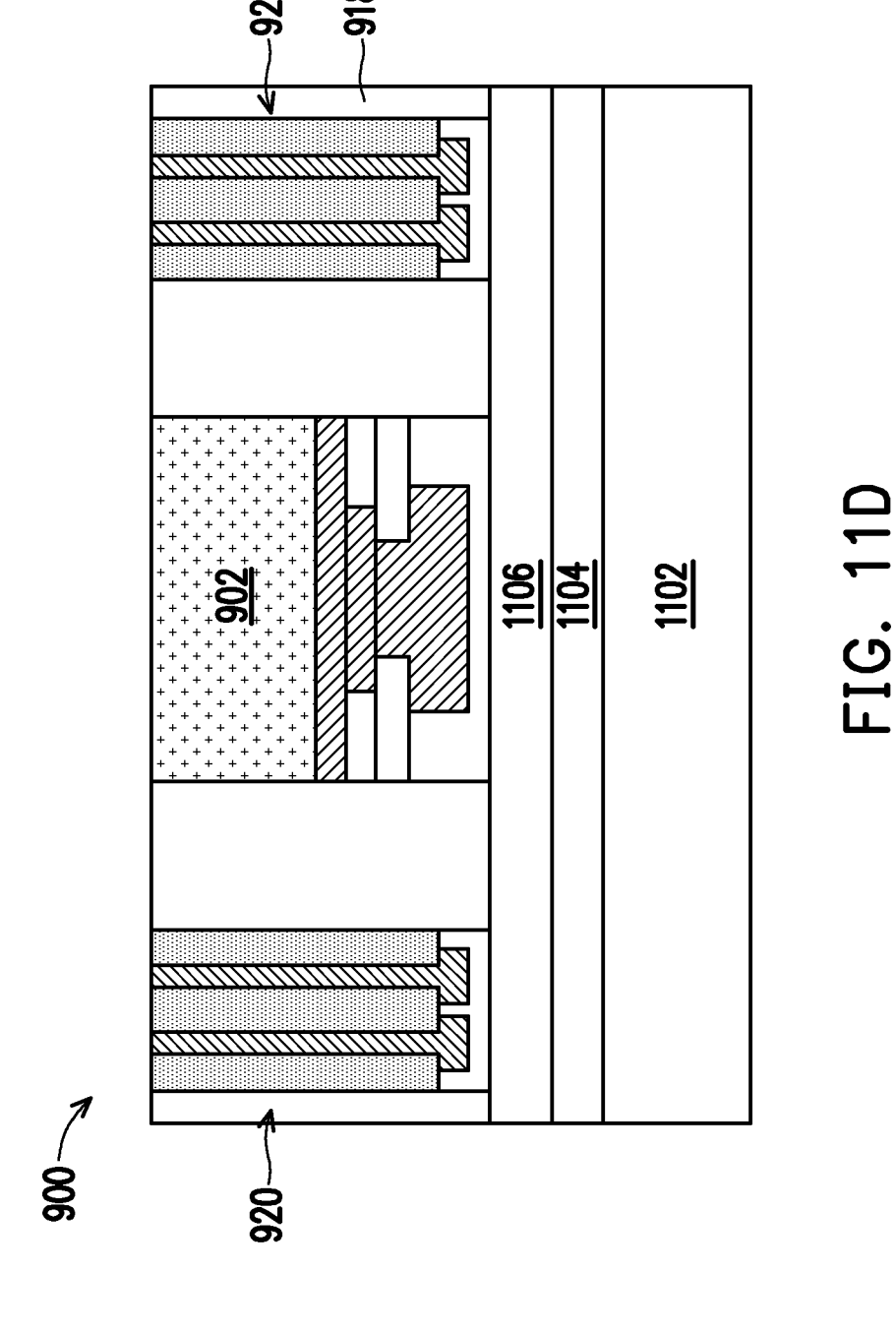

As shown in FIG. 11D, an encapsulation layer 918 may be formed over the carrier substrate 1102. The encapsulation tool set 135 may deposit the molding compound of the encapsulation layer 918 around the TIV packages 920 and around the semiconductor die package 902 such that, in a top-down view of the semiconductor device package 900, the TIV packages 920 and the semiconductor die package 902 are encapsulated and/or surrounded by the encapsulation layer 918. The encapsulation tool set 135 may deposit the encapsulation layer 918 by compression molding, transfer molding, or by another suitable technique. The molding compound of the encapsulation layer 918 may be applied in liquid or semi-liquid form and then subsequently cured.

The planarization tool set 110 may subsequently perform a planarization operation to remove and planarize an upper surface of the encapsulation layer 918 that is formed over the tops of the TIV packages 920 and/or over the top of the semiconductor die package 902. This exposes the tops of the TIV packages 920 and the top of the semiconductor die package 902 through the encapsulation layer 918.

The planarization operation may include a CMP operation, a grinding operation, an etching operation, and/or another suitable process. The planarization operation may be referred to as a molding compound grind (MCG) operation. As described above, placing the semiconductor die package 902 on the carrier substrate 1102 first, as opposed to forming a redistribution structure first and using a DAF to attach the semiconductor die package 902 to the redistribution structure, reduces the likelihood of warpage and/or unevenness for the semiconductor die package 902. The reduced likelihood of warpage and/or unevenness for the semiconductor die package 902 may increase an MCG window of the MCG operation, thereby reducing the tolerance needed for grinding the encapsulation layer 918 in the MCG operation.

Figure 11E:
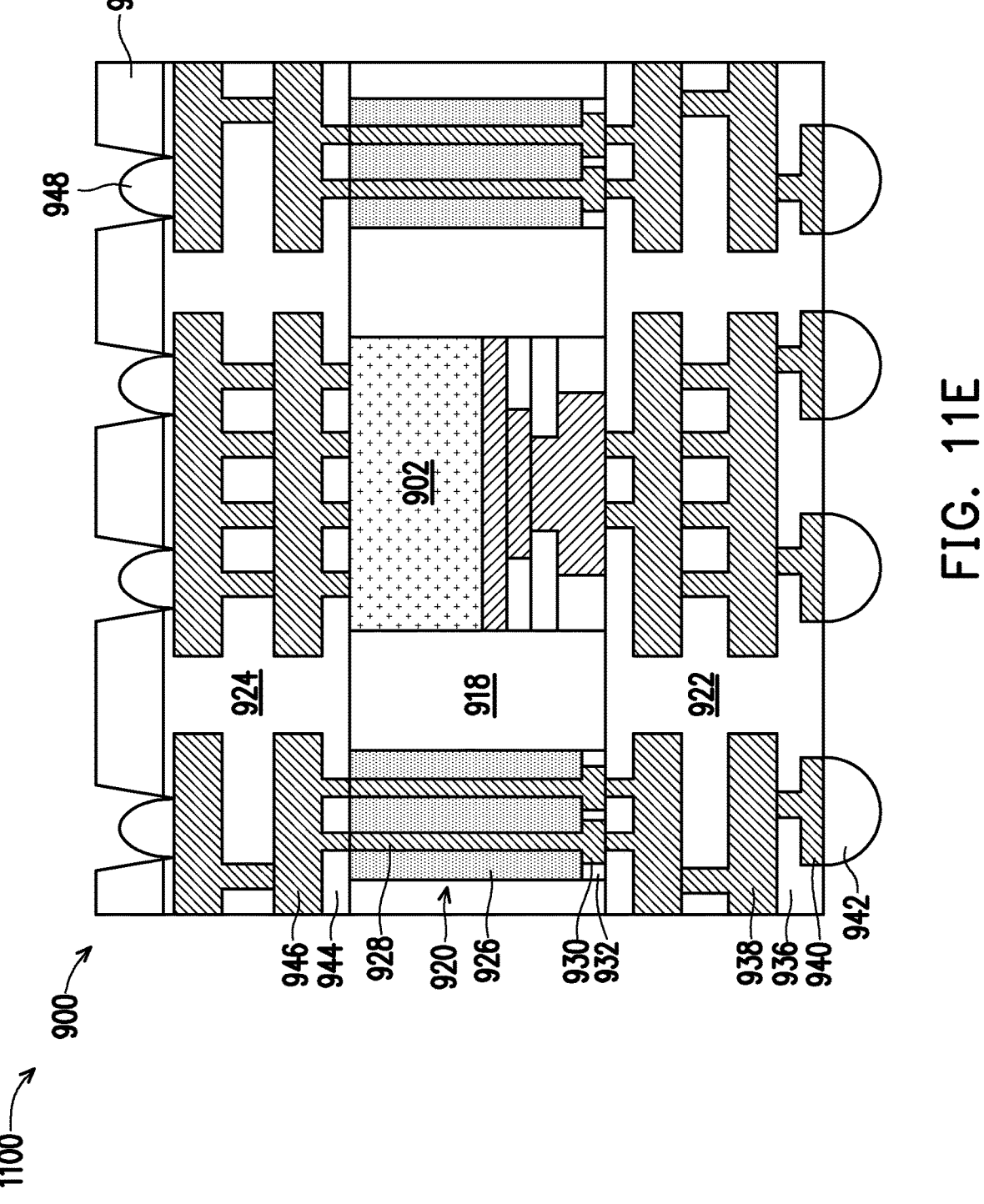
Figure 11F:
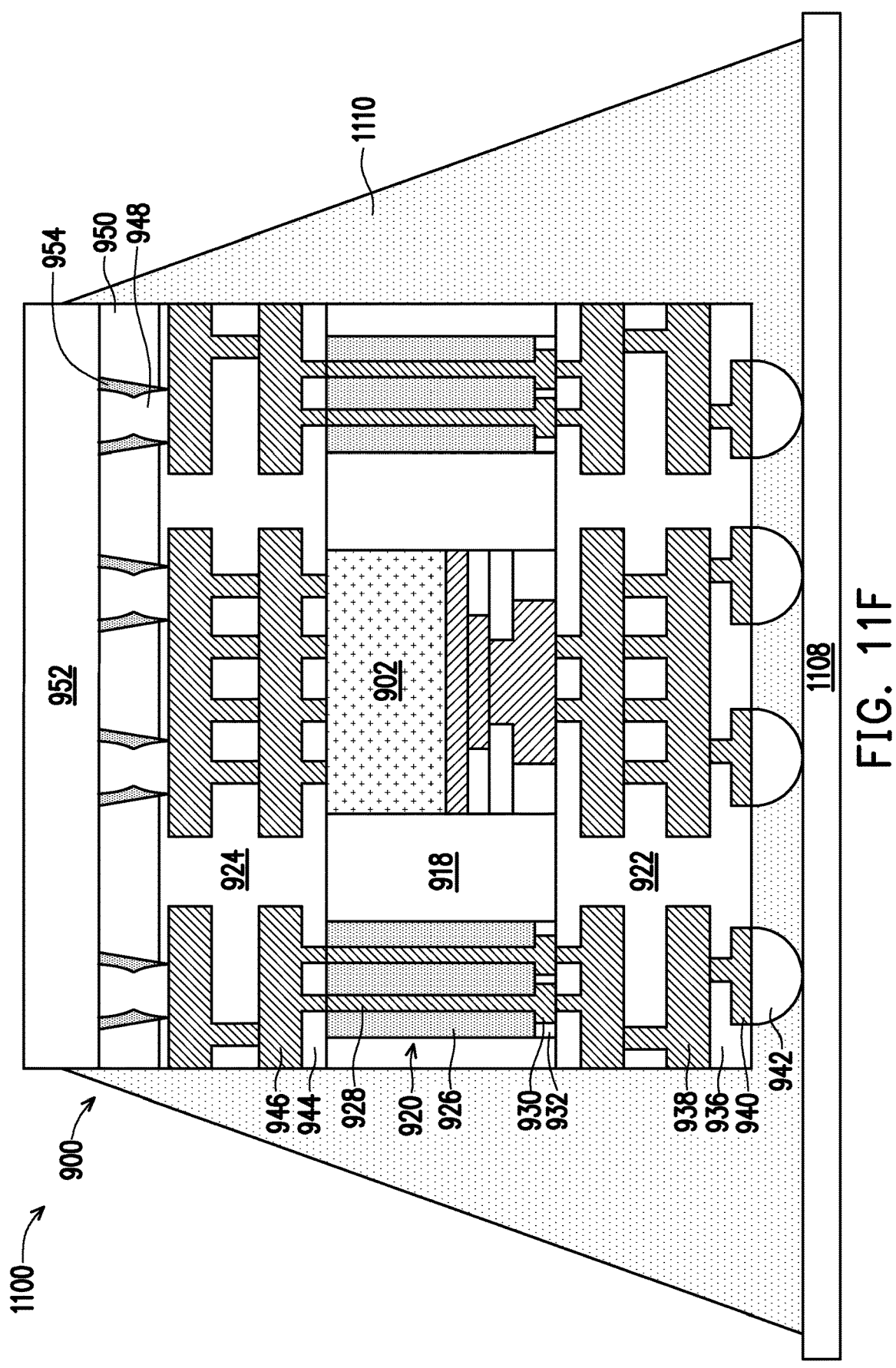

As shown in FIG. 11E, similar processing operations as those shown in FIGS. 5E-5M may be performed to form the components 922, 924 and 936-950 in the semiconductor device package 900. As shown in FIG. 11F, the semiconductor die package 952 may be attached to the redistribution structure 924, and an underfill material 954 may be dispensed in between the connectors 948 and the BEL film 950. Alternatively, the operations that are illustrated and described in connection with FIG. 11F are omitted, and the semiconductor device package 900 is prepared for finishing at a subsequent manufacturer or end user. At the end user, the semiconductor device package 900 may be attached to a PCB 1108 using the SMT tool set 145, and an underfill 1110 may be dispensed around the semiconductor device package 900.

As indicated above, FIGS. 11A-11F are provided as an example. Other examples may differ from what is described with regard to FIGS. 11A-11F.

Figure 12A:
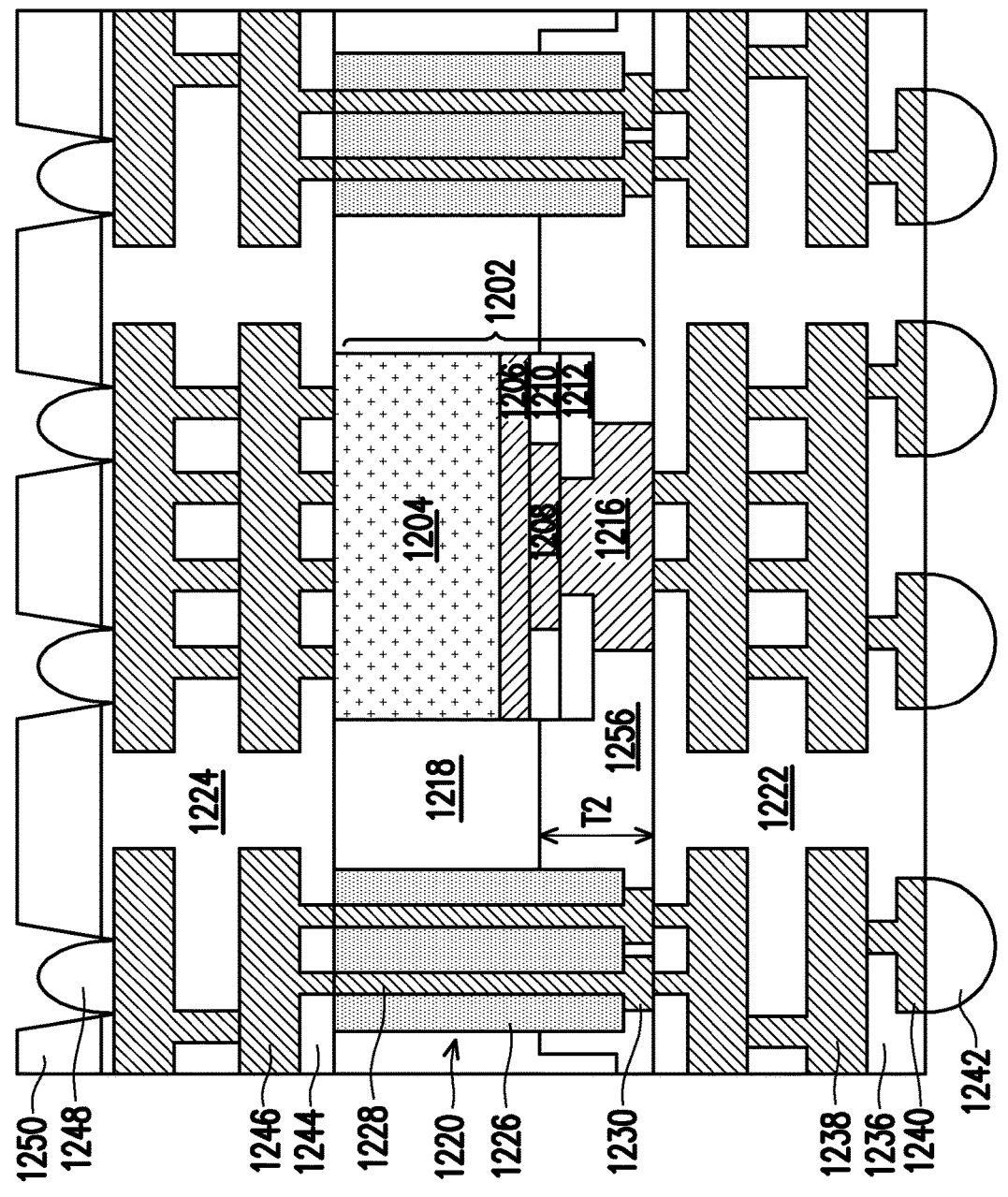
FIGS. 12A and 12B are diagrams of example implementations of a semiconductor device package described herein.
Figure 12B:
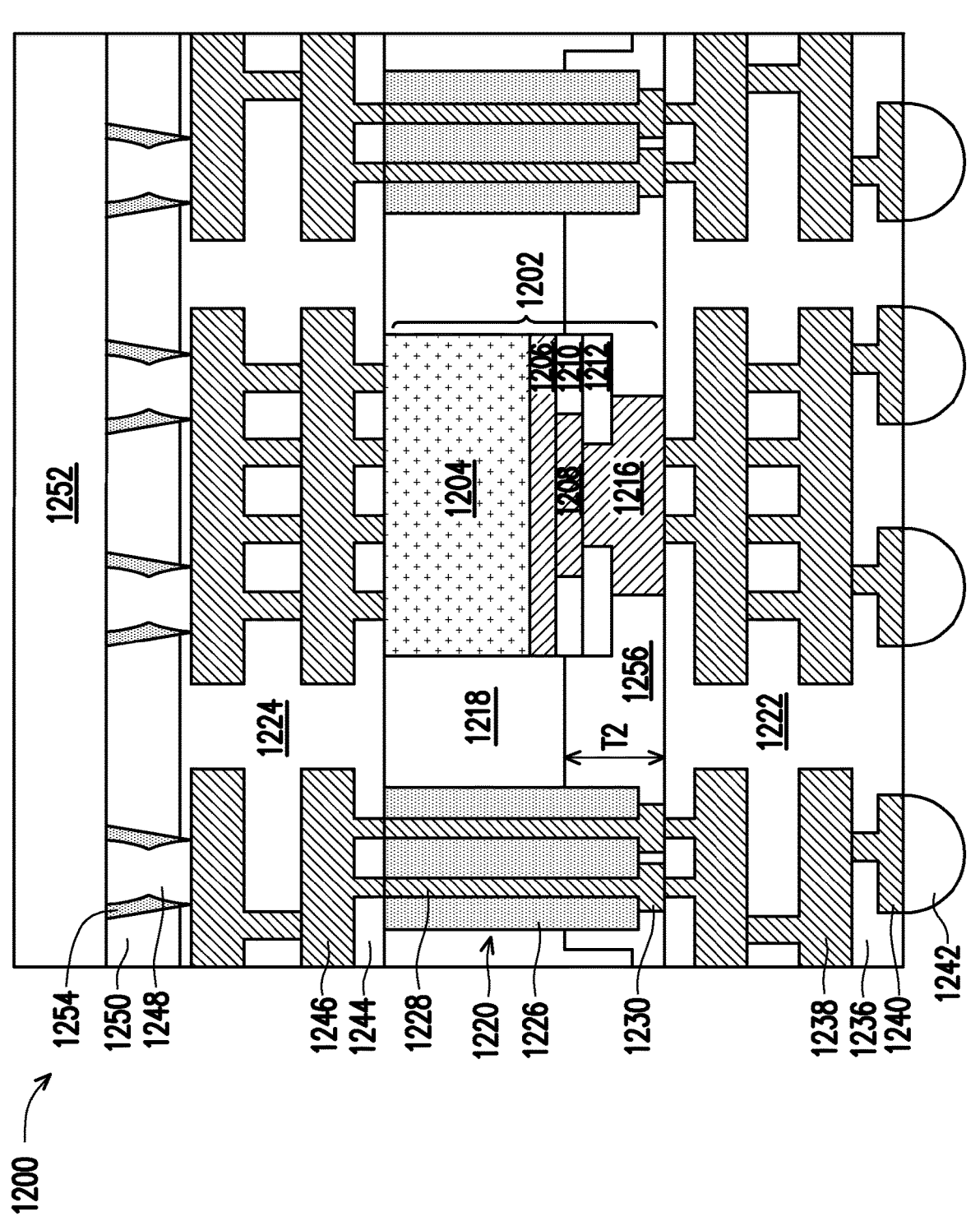

FIGS. 12A and 12B are diagrams of example implementations of a semiconductor device package 1200 described herein. The semiconductor device package 1200 includes a packaged semiconductor device that includes one or more semiconductor die packages. The semiconductor device package 1200 may be referred to as a package on package (PoP) semiconductor device package, a 3D package, a 2.5D package, an integrated fanout (InFO) package, and/or another type of semiconductor device package that includes one or more semiconductor die packages.

The semiconductor device package 1200 includes a similar arrangement of structures and/or layers as the semiconductor device package 900. For example, and as shown in FIG. 12A, the semiconductor device package 1200 may include components 1202-1230 and 1236-1250 that correspond to components 902-930 and 936-950 of the semiconductor device package 900 shown in FIG. 9A. As another example, and as shown in FIG. 12B, the semiconductor device package 1200 may include components 1202-1230 and 1236-1254 that correspond to components 902-930 and 936-954 of the semiconductor device package 900 shown in FIG. 9B.

However, as shown in FIGS. 12A and 12B, the polymer layer 932 may be omitted from the semiconductor device package 1200. Instead, the semiconductor device package 1200 may include a thick die attach film (DAF) 1256 between the encapsulation layer 1226 of the TIV packages 1220 and the redistribution structure 1222. The DAF 1256 surrounds the metal bumps 1230 of the TIV packages 1220 instead of a polymer layer. Moreover, the DAF 1256 is included between the polymer layer 1212 of the semiconductor die package 1202 and the redistribution structure 1222. The DAF 1256 surrounds the connector(s) 1216 of the semiconductor die package 1202 instead of a low temperature polyimide (LTPI) layer. The use of the DAF 1256 may reduce the cost and complexity of manufacturing the TIV packages 1220 and the semiconductor die package 1202 in that fewer polymer layers need to be formed for the TIV packages 1220 and the semiconductor die package 1202 when using the DAF 1256.

The DAF 1256 may include a thermoplastic material, such as epoxy resin, phenol resin, or poly-olefin, among other examples. Other thermoplastic materials or polymers compatible with semiconductor processing environments may be used. The DAF 1256 may be deposited in liquid form having a relatively high viscosity to enable displacement of material of the DAF 1256 as the TIV packages 1220 and the semiconductor die package 1202 are placed in the DAF 1256 during manufacturing of the semiconductor device package 1200. The DAF 1256 may transition to a solid form as the temperature of the DAF 1256 approaches room temperature.

As shown in FIG. 12A, the DAF 1256 may have a thickness T2. The thickness T2 may be included in a range of approximately 30 microns to approximately 200 microns to sufficiently fill in the gaps between the TIV packages 1220 and the redistribution structure 1222, to sufficiently fill in the gaps between the semiconductor die package 1202 and the redistribution structure 1222, and to sufficiently fill in the gaps between the encapsulation layer 1218 and the redistribution structure 1222. However, other values for the range are within the scope of the present disclosure.

In some implementations, the thickness of the DAF 1256 may be different in different areas of the semiconductor device package 1200. For example, the thickness of the DAF 1256 may be greater around the TIV packages 1220 and around the semiconductor die package 1202 due to the displacement of material of the DAF 1256 when the TIV packages 1220 and the semiconductor die package 1202 are placed in the DAF 1256 during manufacturing of the semiconductor device package 1200.

In some implementations, the thickness T2 of the DAF 1256 is greater relative to a thickness of the metal bumps 1230. In some implementations, the DAF 1256 surrounds the encapsulation layer 1226 along a portion of a height of the encapsulation layer 1226. In some implementations, DAF 1256 extends above the connector(s) 1216.

As indicated above, FIGS. 12A and 12B are provided as examples. Other examples may differ from what is described with regard to FIGS. 12A and 12B.

Figure 13A:
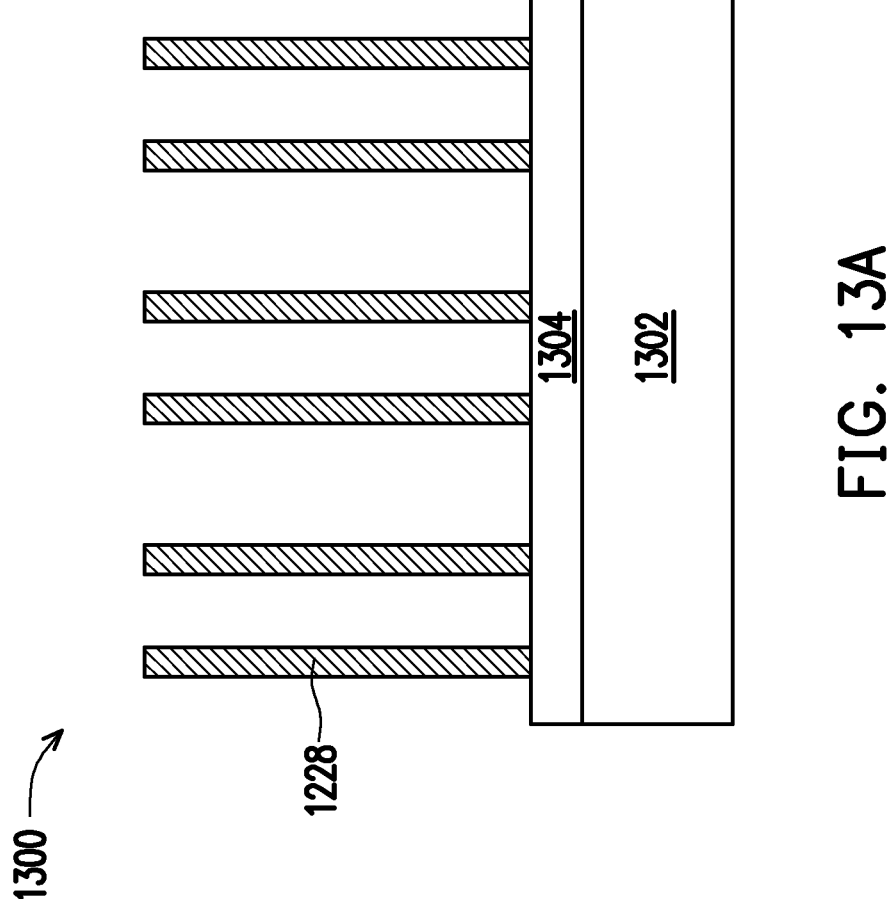
FIGS. 13A-13C are diagrams of an example implementation of forming a plurality of TIV packages described herein.
Figure 13B:
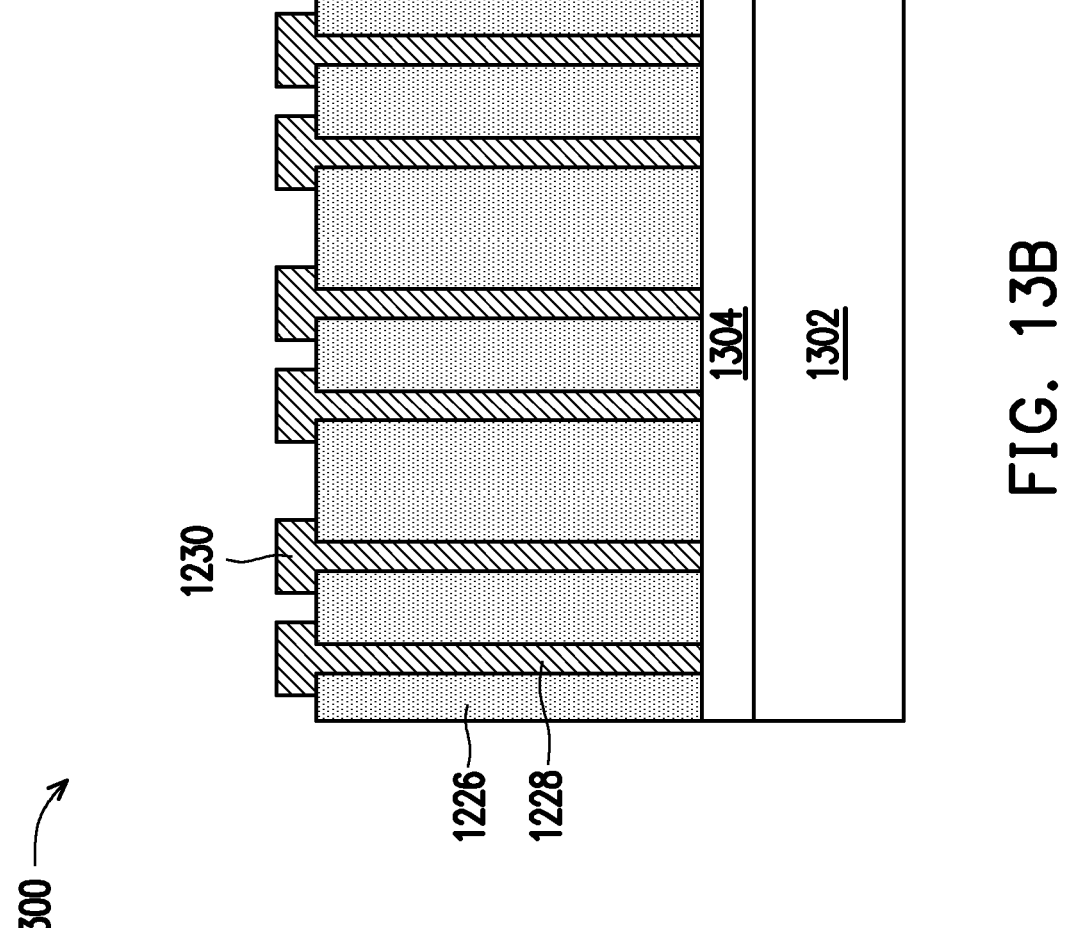
Figure 13C:
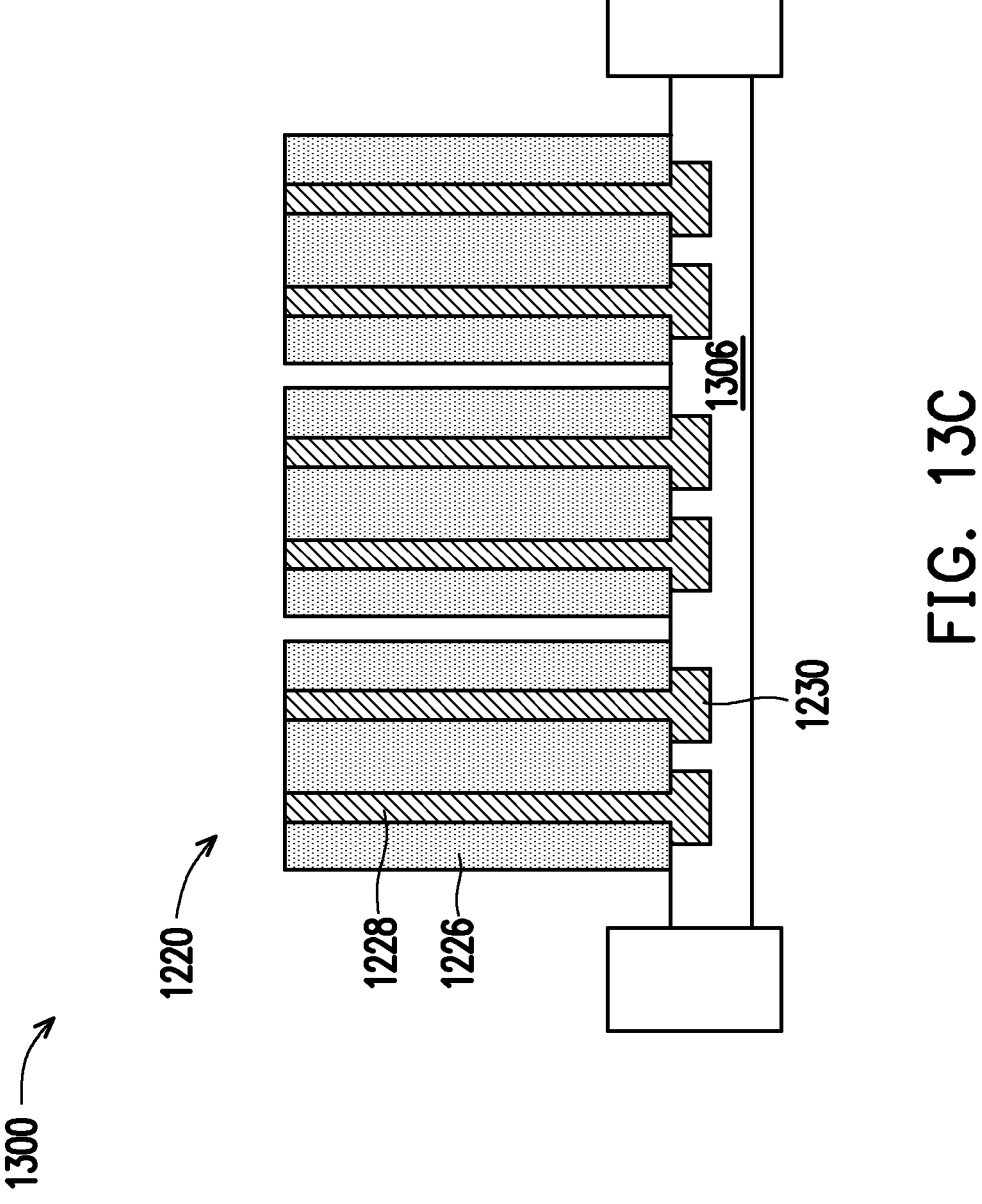

FIGS. 13A-13C are diagrams of an example implementation 1300 of forming a plurality of TIV packages 1220 described herein. The TIV packages 1220 may be manufactured (e.g., pre-manufactured) prior to being placed into a semiconductor device package (e.g., the semiconductor device package 1200). Pre-manufacturing the interconnect structure packages may enable the interconnects of the interconnect structure packages to be formed to smaller dimensions and greater density in that pre-manufacturing the interconnect structure packages is not subjected to process variations that may occur in backend packaging of the semiconductor device package.

As shown in FIG. 13A, one or more operations in the example implementation 1300 may be performed in connection with a carrier substrate 1302. An LTHC release layer 1304 may be included on the carrier substrate 1302 to enable the TIV packages 1220 to be removed from the carrier substrate 1302 after manufacturing of the TIV packages 1220.

As further shown in FIG. 13A, TIV structures 1228 may be formed over the carrier substrate 1302. The connection tool set 115 may form the TIV structures 1228 using a CVD technique, a PVD technique, an ALD technique, an electroplating technique, another deposition technique described above in connection with FIG. 1, and/or a deposition technique other than as described above in connection with FIG. 1.

As shown in FIG. 13B, an encapsulation layer 1226 may be formed around the TIV structures 1228 such that the TIV structures 1228 are encapsulated or surrounded (e.g., in a top down view) by the encapsulation layer 1226. The RDL tool set 105 may form the encapsulation layer 1226 using a CVD technique, a PVD technique, an ALD technique, an electroplating technique, another deposition technique described above in connection with FIG. 1, and/or a deposition technique other than as described above in connection with FIG. 1.

As further shown in FIG. 13B, metal bumps 1230 may be formed on the TIV structures 1228. The connection tool set 115 deposits the conductive material of the metal bumps 1230 using a CVD technique, a PVD technique, an ALD technique, an electroplating technique, another deposition technique described above in connection with FIG. 1, and/or a deposition technique other than as described above in connection with FIG. 1. In some implementations, an annealing operation may be performed to reflow the metal bumps 1230 after deposition of the metal bumps 1230. The annealing operation may be performed to remove voids, seams, and/or other types of defects in the metal bumps 1230.

As shown in FIG. 13C, the TIV structures 1228 may be placed on a frame 1306 and may be diced, cut, and/or otherwise separated into TIV packages (or TIV dies) 1220 by the singulation tool set 125 (e.g., without forming a polymer layer over and around the metal bumps 1230). Each TIV package 1220 may include a plurality of the TIV structures 1228. TIV packages 1220 may then be packaged for storage and/or shipment to a semiconductor packaging facility for use in the manufacturing of semiconductor device packages such as the semiconductor device package 1200.

As indicated above, FIGS. 13A-13C are provided as an example. Other examples may differ from what is described with regard to FIGS. 13A-13C.

FIGS. 14A-14E are diagrams of an example implementation 1400 of forming a semiconductor device package 1200 that includes a plurality of TIV packages 1220 described herein. The TIV packages 1220 may be formed according to the example implementation 1300 described in connection with FIGS. 13A-13C.

Figure 14A:
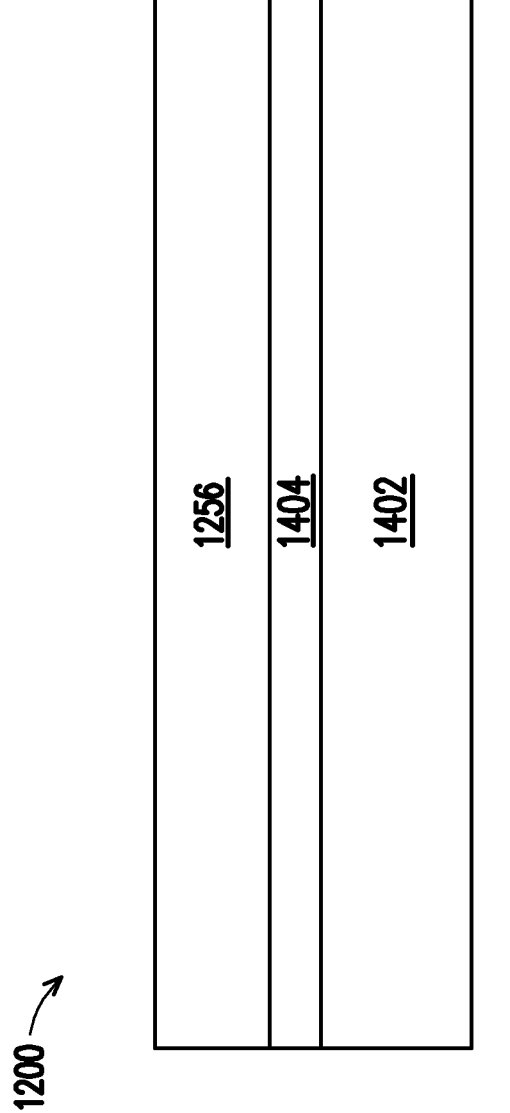
FIGS. 14A-14E are diagrams of an example implementation of forming a semiconductor device package that includes a plurality of TIV packages described herein.

As shown in FIG. 14A, portions of the example implementation 1400 may be performed in connection with a carrier substrate 1402. The carrier substrate 1402 may include a glass substrate, a silicon substrate, and/or another suitable carrier substrate. One or more layers may be included on the carrier substrate 1402, such as a light-to-heat conversion (LTHC) release layer 1404 that is formed over and/or on the carrier substrate 1402, and a DAF 1256 that is formed over and/or on the LTHC release layer 1404. The DAF 1256 may be configured to adhere components of the semiconductor device package 1200 to the carrier substrate 1402 for processing. The LTHC release layer 1404 may be configured to enable the semiconductor device package 1200 to be removed or debonded from the carrier substrate 1402 after processing.

Figure 14B:
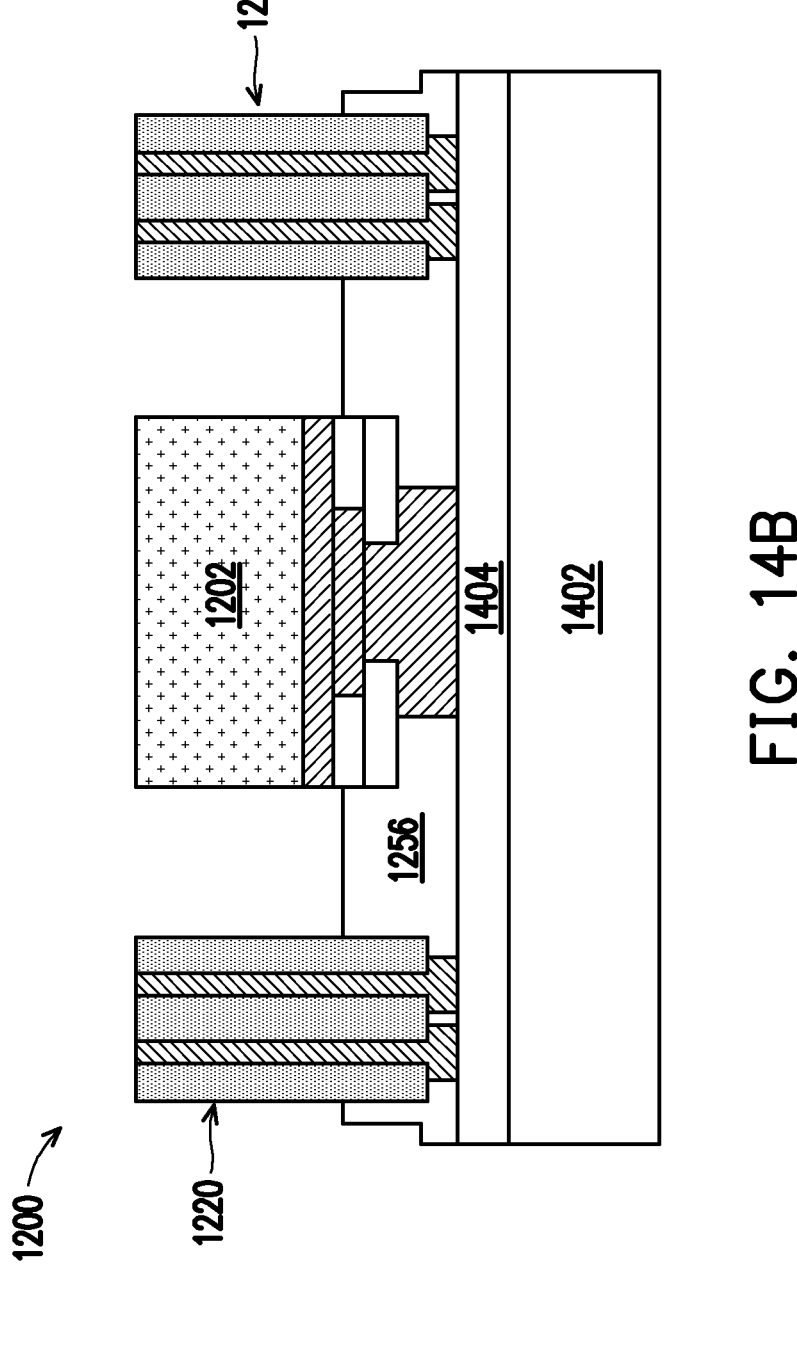

As shown in FIG. 14B, one or more TIV packages 1220 and a semiconductor die package 1202 may be placed on the carrier substrate 1402. The TIV packages 1220 and a semiconductor die package 1202 may be secured in place and adhered to the carrier substrate 1402 by the DAF 1256. In some implementations, die-attach tool set 130 may pick and place the TIV packages 1220 and the semiconductor die package 1202 into the DAF 1256 over the carrier substrate 1402 such that the metal bumps 1230 and the connector(s) 1216 are submerged in the DAF 1256. Thus, the die-attach tool set 130 may pick and place the TIV packages 1220 and the semiconductor die package 1202 into the DAF 1256 when the DAF 1256 is in a liquid state or a semi-liquid state. In some implementations, placing the TIV packages 1220 and the semiconductor die package 1202 into the DAF 1256 may cause the thickness of the DAF 1256 to increase, particularly around the TIV packages 1220 and around the semiconductor die package 1202.

In some implementations, the TIV packages 1220 may be placed onto the carrier substrate 1402 prior to the semiconductor die package 1202, and the semiconductor die package 1202 may be placed onto the carrier substrate 1402 after the TIV packages 1220 are placed onto the carrier substrate 1402. Alternatively, the semiconductor die package 1202 may be placed first, and then the TIV packages 1220 may be placed.

Figure 14C:
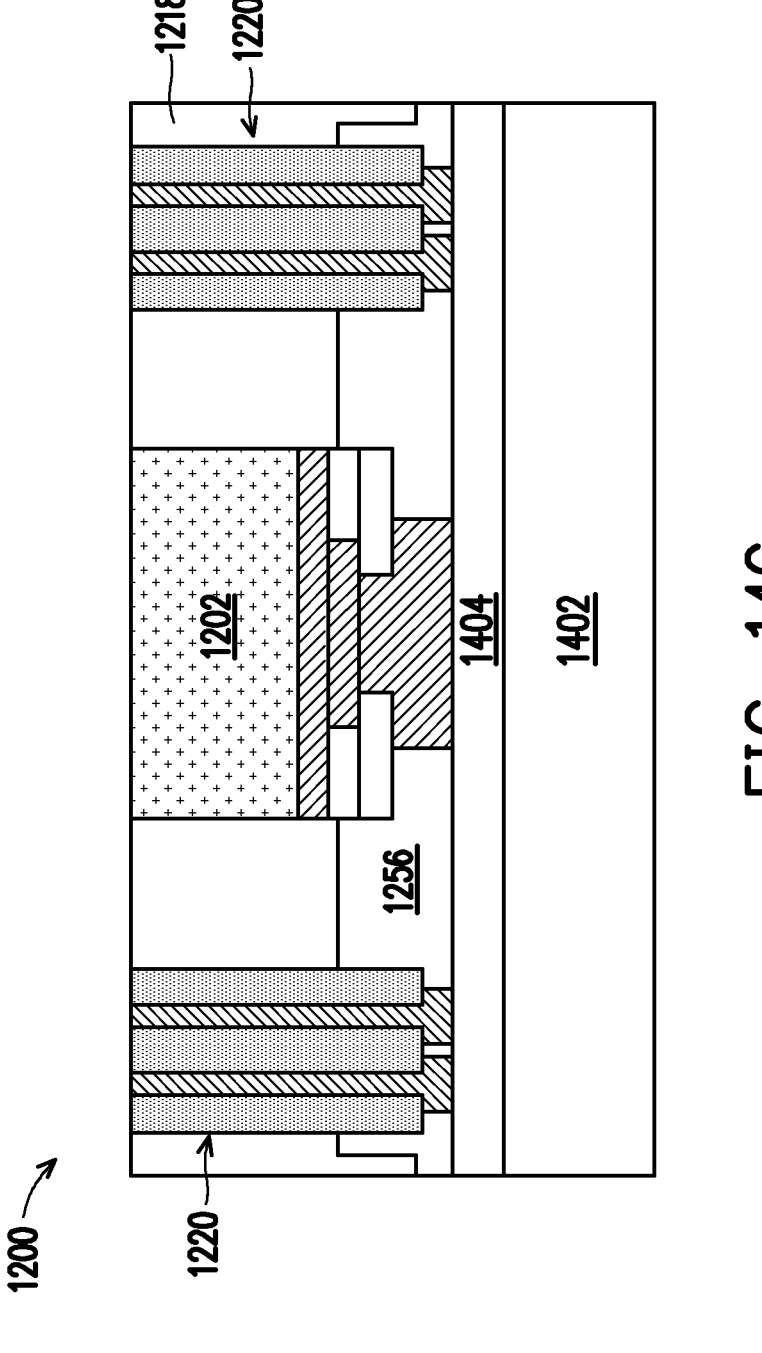

As shown in FIG. 14C, an encapsulation layer 1218 may be formed over the DAF 1256. The encapsulation tool set 135 may deposit the molding compound of the encapsulation layer 1218 around the TIV packages 1220 and around the semiconductor die package 1202 such that, in a top-down view of the semiconductor device package 1200, the TIV packages 1220 and the semiconductor die package 1202 are encapsulated and/or surrounded by the encapsulation layer 1218. The encapsulation tool set 135 may deposit the encapsulation layer 1218 by compression molding, transfer molding, or by another suitable technique. The molding compound of the encapsulation layer 1218 may be applied in liquid or semi-liquid form and then subsequently cured.

The planarization tool set 110 may subsequently perform a planarization operation to remove and planarize an upper surface of the encapsulation layer 1218 that is formed over the tops of the TIV packages 1220 and/or over the top of the semiconductor die package 1202. This exposes the tops of the TIV packages 1220 and the top of the semiconductor die package 1202 through the encapsulation layer 1218.

Figure 14D:
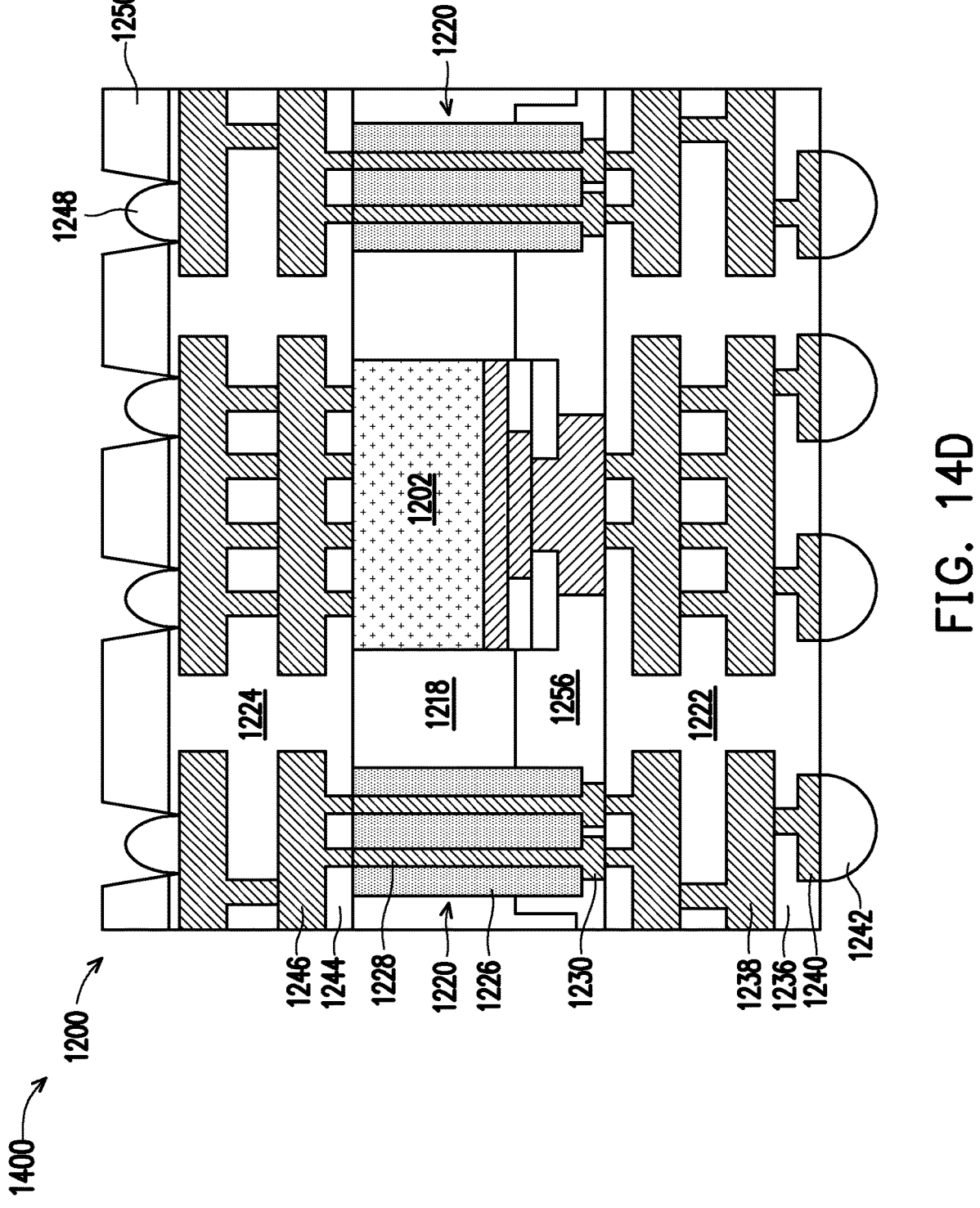
Figure 14E:
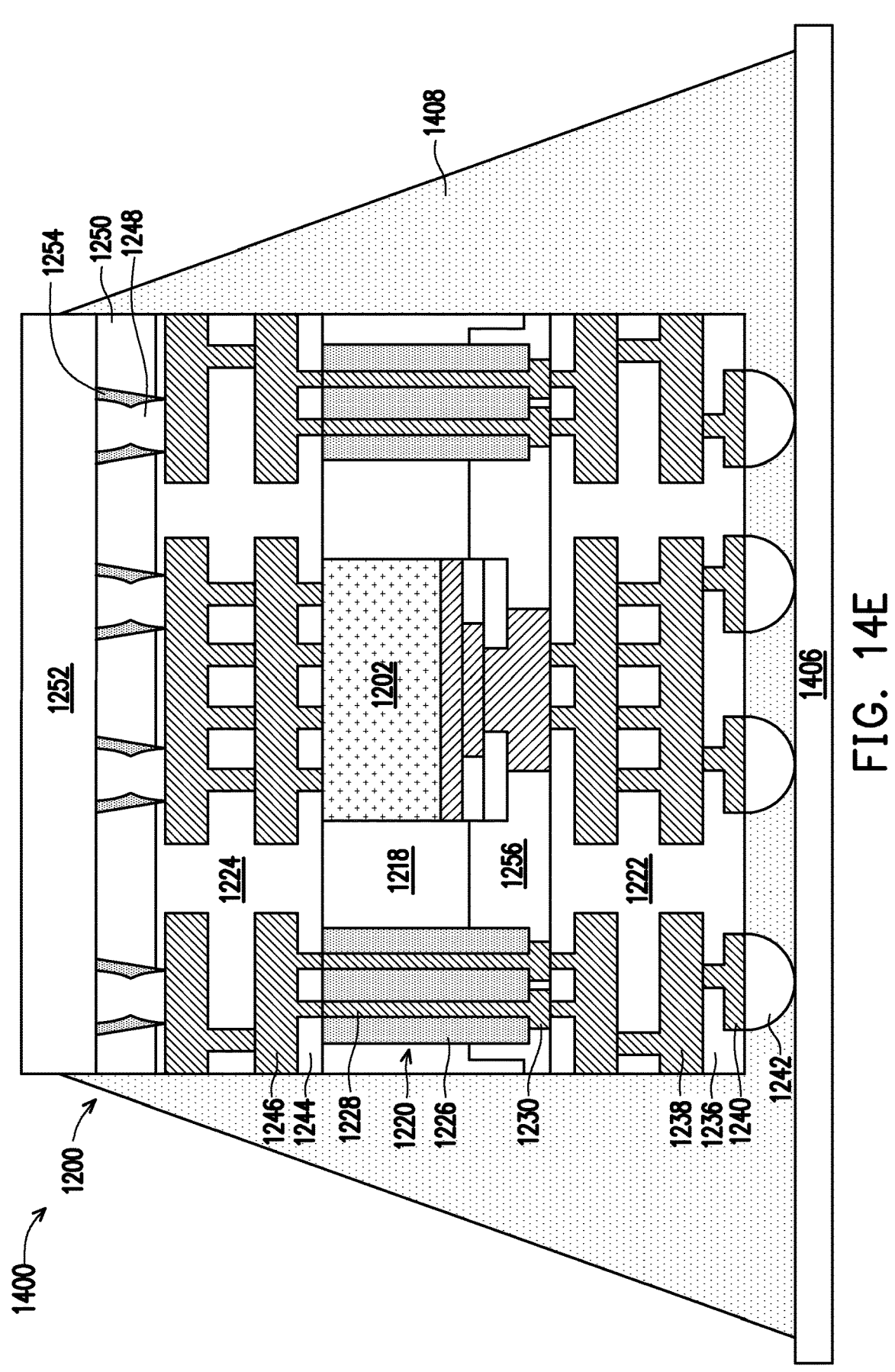

As shown in FIG. 14D, similar processing operations as those shown in FIGS. 5E-5M may be performed to form the components 1222, 1224 and 1236-1250 in the semiconductor device package 1200. As shown in FIG. 14E, the semiconductor die package 1252 may be attached to the redistribution structure 1224, and an underfill material 1254 may be dispensed in between the connectors 1248 and the BEL film 1250. Alternatively, the operations that are illustrated and described in connection with FIG. 14E are omitted, and the semiconductor device package 1200 is prepared for finishing at a subsequent manufacturer or end user. At the end user, the semiconductor device package 1200 may be attached to a PCB 1406 using the SMT tool set 145, and an underfill 1408 may be dispensed around the semiconductor device package 1200.

As indicated above, FIGS. 14A-14E are provided as an example. Other examples may differ from what is described with regard to FIGS. 14A-14E.

Figure 15:
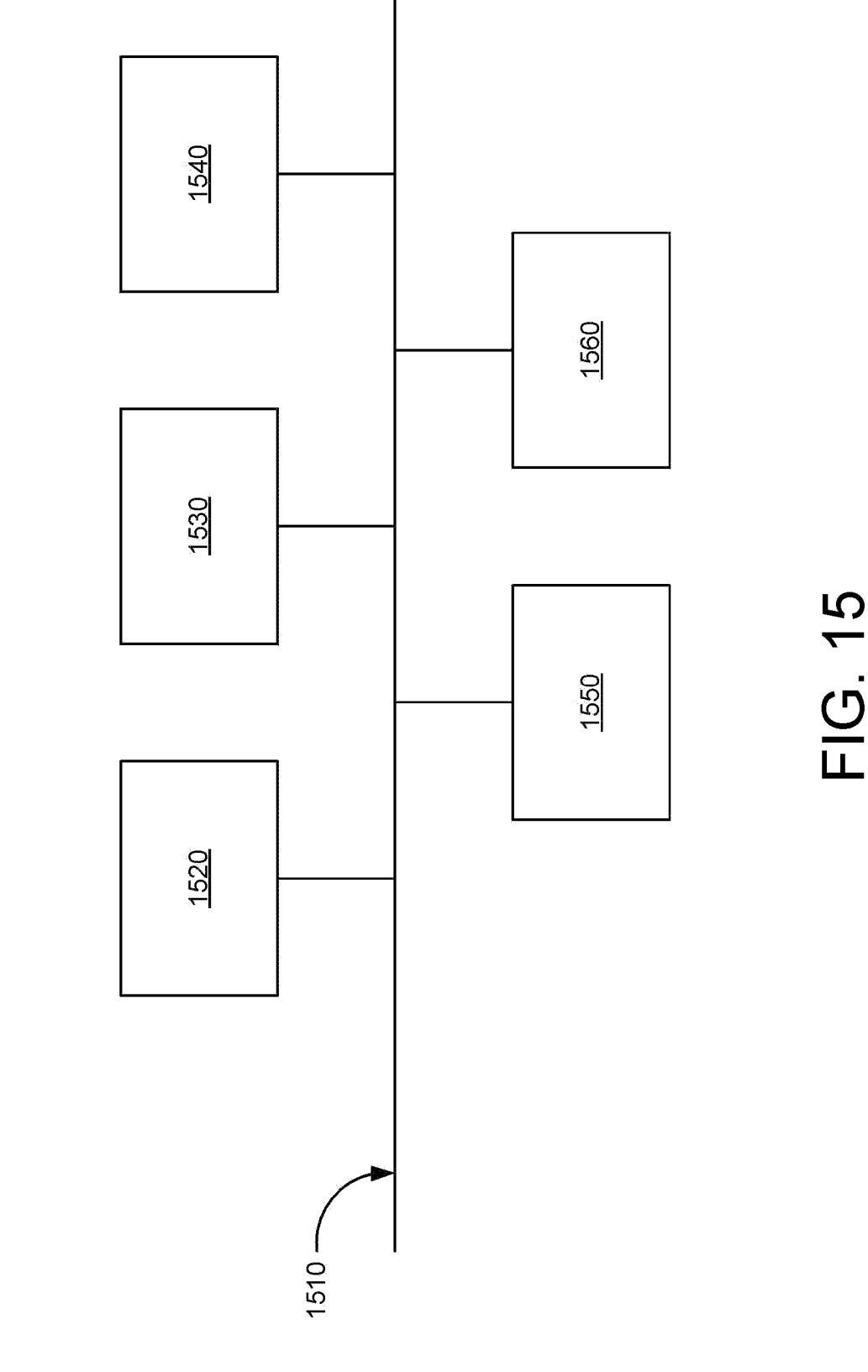
FIG. 15 is a diagram of example components of a device described herein.

FIG. 15 is a diagram of example components of a device 1500 described herein. In some implementations, one or more of the semiconductor processing tool sets 105-150, the transport tool set 155, one or more of the semiconductor processing tools 202-212, and/or the wafer/die transport tool 214 may include one or more devices 1500 and/or one or more components of device 1500. As shown in FIG. 15, device 1500 may include a bus 1510, a processor 1520, a memory 1530, an input component 1540, an output component 1550, and a communication component 1560.

Bus 1510 may include one or more components that enable wired and/or wireless communication among the components of device 1500. Bus 1510 may couple together two or more components of FIG. 15, such as via operative coupling, communicative coupling, electronic coupling, and/or electric coupling. Processor 1520 may include a central processing unit, a graphics processing unit, a microprocessor, a controller, a microcontroller, a digital signal processor, a field-programmable gate array, an application-specific integrated circuit, and/or another type of processing component. Processor 1520 is implemented in hardware, firmware, or a combination of hardware and software. In some implementations, processor 1520 may include one or more processors capable of being programmed to perform one or more operations or processes described elsewhere herein.

Memory 1530 may include volatile and/or nonvolatile memory. For example, memory 1530 may include random access memory (RAM), read only memory (ROM), a hard disk drive, and/or another type of memory (e.g., a flash memory, a magnetic memory, and/or an optical memory). Memory 1530 may include internal memory (e.g., RAM, ROM, or a hard disk drive) and/or removable memory (e.g., removable via a universal serial bus connection). Memory 1530 may be a non-transitory computer-readable medium.

Memory 1530 stores information, instructions, and/or software (e.g., one or more software applications) related to the operation of device 1500. In some implementations, memory 1530 may include one or more memories that are coupled to one or more processors (e.g., processor 1520), such as via bus 1510.

Input component 1540 enables device 1500 to receive input, such as user input and/or sensed input. For example, input component 1540 may include a touch screen, a keyboard, a keypad, a mouse, a button, a microphone, a switch, a sensor, a global positioning system sensor, an accelerometer, a gyroscope, and/or an actuator. Output component 1550 enables device 1500 to provide output, such as via a display, a speaker, and/or a light-emitting diode. Communication component 1560 enables device 1500 to communicate with other devices via a wired connection and/or a wireless connection. For example, communication component 1560 may include a receiver, a transmitter, a transceiver, a modem, a network interface card, and/or an antenna.

Device 1500 may perform one or more operations or processes described herein. For example, a non-transitory computer-readable medium (e.g., memory 1530) may store a set of instructions (e.g., one or more instructions or code) for execution by processor 1520. Processor 1520 may execute the set of instructions to perform one or more operations or processes described herein. In some implementations, execution of the set of instructions, by one or more processors 1520, causes the one or more processors 1520 and/or the device 1500 to perform one or more operations or processes described herein. In some implementations, hardwired circuitry is used instead of or in combination with the instructions to perform one or more operations or processes described herein. Additionally, or alternatively, processor 1520 may be configured to perform one or more operations or processes described herein. Thus, implementations described herein are not limited to any specific combination of hardware circuitry and software.

The number and arrangement of components shown in FIG. 15 are provided as an example. Device 1500 may include additional components, fewer components, different components, or differently arranged components than those shown in FIG. 15. Additionally, or alternatively, a set of components (e.g., one or more components) of device 1500 may perform one or more functions described as being performed by another set of components of device 1500.

FIG. 16 is a flowchart of an example process 1600 associated with forming a semiconductor device package that includes a plurality of interconnect structure packages. In some implementations, one or more process blocks of FIG. 16 are performed by a one or more semiconductor processing tools (e.g., one or more of the semiconductor processing tool sets 105-150, one or more of the semiconductor processing tools 202-212). Additionally, or alternatively, one or more process blocks of FIG. 16 may be performed by one or more components of device 1500, such as processor 1520, memory 1530, input component 1540, output component 1550, and/or communication component 1560.

As shown in FIG. 16, process 1600 may include forming a plurality of interconnect structure packages (block 1610). For example, one or more semiconductor processing tools may form a plurality of interconnect structure packages (e.g., TSV packages 320, TSV packages 620, TIV packages 920, TIV packages 1220), as described herein. In some implementations, each plurality of interconnect structure packages include a plurality of interconnect structures (e.g., TSV structures 328, TSV structures 628, TIV structures 928, TIV structures 1228).

As further shown in FIG. 16, process 1600 may include attaching the plurality of interconnect structure packages to a carrier substrate (block 1620). For example, one or more semiconductor processing tools may attach the plurality of interconnect structure packages to a carrier substrate (e.g., a carrier substrate 502, a carrier substrate 802, a carrier substrate 1102, a carrier substrate 1402), as described herein.

As further shown in FIG. 16, process 1600 may include attaching a semiconductor die package to the carrier substrate such that the plurality of interconnect structure packages are adjacent to one or more sides of the semiconductor die package (block 1630). For example, one or more semiconductor processing tools may attach a semiconductor die package (e.g., a semiconductor die package 302, a semiconductor die package 602, a semiconductor die package 902, a semiconductor die package 1202) to the carrier substrate such that the plurality of interconnect structure packages are adjacent to one or more sides of the semiconductor die package, as described herein.

As further shown in FIG. 16, process 1600 may include forming an encapsulation layer around the plurality of interconnect structure packages and around the semiconductor die package (block 1640). For example, one or more semiconductor processing tools may form an encapsulation layer (e.g., an encapsulation layer 318, an encapsulation layer 618, an encapsulation layer 918, an encapsulation layer 1218) around the plurality of interconnect structure packages and around the semiconductor die package, as described herein.

Process 1600 may include additional implementations, such as any single implementation or any combination of implementations described below and/or in connection with one or more other processes described elsewhere herein.

In a first implementation, forming the plurality of interconnect structure packages include forming a plurality of recesses (e.g., recesses 404, recesses 704) in a silicon substrate (e.g., a substrate 402, a substrate 702), forming an oxide liner (e.g., an oxide liner 334, an oxide liner 634) in the plurality of recesses such that sidewalls and bottom surfaces of the plurality of recesses are lined with the oxide liner, forming a plurality of TSV structures (e.g., TSV structures 328, TSV structures 628) in the plurality of recesses over the oxide liner, and dicing the silicon substrate into the plurality of interconnect structure packages after forming the plurality of TSV structures.

In a second implementation, alone or in combination with the first implementation, forming the plurality of interconnect structure packages includes forming, for an interconnect structure package of the plurality of interconnect structure packages, a plurality of conductive connection structures (e.g., metal bumps 330) prior to dicing the silicon substrate into the plurality of interconnect structure packages, where the plurality of conductive connection structures are formed on a subset of TSV structures (e.g., TSV structures 328), of the plurality of TSV structures, associated with the interconnect structure package, and forming, for the interconnect structure package, a polymer layer (e.g., a polymer layer 332) around the plurality of conductive connection structures prior to dicing the silicon substrate into the plurality of interconnect structure packages, and where attaching the plurality of interconnect structure packages to the carrier substrate includes placing the interconnect structure package on a die attach film (e.g., a DAF 506) that is over the carrier substrate.

In a third implementation, alone or in combination with one or more of the first and second implementations, forming the plurality of interconnect structure packages includes forming, for an interconnect structure package of the plurality of interconnect structure packages, a plurality of conductive connection structures (e.g., metal bumps 630) prior to dicing the silicon substrate into the plurality of interconnect structure packages, where the plurality of conductive connection structures are formed on a subset of TSV structures (e.g., TSV structures 628), of the plurality of TSV structures, associated with the interconnect structure package, and where attaching the plurality of interconnect structure packages to the carrier substrate includes placing the plurality of conductive connection structures, of the interconnect structure package, into a die attach film (e.g., a DAF 656) that is over the carrier substrate such that the plurality of conductive connection structures are submerged in the die attach film.

In a fourth implementation, alone or in combination with one or more of the first through third implementations, forming the plurality of interconnect structure packages comprises forming a plurality of TIV structures (e.g., TIV structures 928, TIV structures 1228) on a carrier substrate (e.g., a carrier substrate 1002, a carrier substrate 1302), encapsulating the plurality of TIV structures in another encapsulation layer (e.g., an encapsulation layer 926, an encapsulation layer 1226) that includes a molding compound, and separating, after encapsulating the plurality of TIV structures in the other encapsulation layer, the plurality of TIV structures into the plurality of interconnect structure packages, where each of the plurality of interconnect structure packages includes a subset of the plurality of TIV structures.

In a fifth implementation, alone or in combination with one or more of the first through fourth implementations, forming the plurality of interconnect structure packages includes forming a plurality of conductive connection structures (e.g., metal bumps 930) on the plurality of TIV structures prior to separating the plurality of TIV structures into the plurality of interconnect structure packages, and forming a polymer layer (e.g., a polymer layer 932) around the plurality of conductive connection structures prior to separating the plurality of TIV structures into the plurality of interconnect structure packages.

Although FIG. 16 shows example blocks of process 1600, in some implementations, process 1600 includes additional blocks, fewer blocks, different blocks, or differently arranged blocks than those depicted in FIG. 16. Additionally, or alternatively, two or more of the blocks of process 1600 may be performed in parallel.

In this way, interconnect structure packages (e.g., TSV packages, TIV packages) may be pre-manufactured as opposed to forming TIVs directly on a carrier substrate during a manufacturing process for a semiconductor die package at backend packaging facility. The interconnect structure packages may be placed onto a carrier substrate during manufacturing of a semiconductor device package, and a bottom semiconductor die package may be placed on the carrier substrate adjacent to the interconnect structure packages. A molding compound layer may be formed around and in between the interconnect structure packages and the bottom semiconductor die package.

As described in greater detail above, some implementations described herein provide a semiconductor device package. The semiconductor device package includes a redistribution structure, including one or more dielectric layers and a plurality of metallization layers included in the one or more dielectric layers. The semiconductor device package includes a plurality of connection structures attached to a first side of the redistribution structure. The semiconductor device package includes a semiconductor die package over a second side of the redistribution structure opposing the first side. The semiconductor device package includes TSV packages over the second side of the redistribution structure and adjacent to the semiconductor die package.

As described in greater detail above, some implementations described herein provide a semiconductor device package. The semiconductor device package includes a redistribution structure, including one or more dielectric layers and a plurality of metallization layers included in the one or more dielectric layers. The semiconductor device package includes a plurality of connection structures attached to a first side of the redistribution structure. The semiconductor device package includes a semiconductor die package over a second side of the redistribution structure opposing the first side. The semiconductor device package includes one or more TIV packages over the second side of the redistribution structure and adjacent to the semiconductor die package.

As described in greater detail above, some implementations described herein provide a method. The method includes forming a plurality of interconnect structure packages, where each plurality of interconnect structure packages includes a plurality of interconnect structures. The method includes attaching the plurality of interconnect structure packages to a carrier substrate. The method includes attaching a semiconductor die package to the carrier substrate such that the plurality of interconnect structure packages are adjacent to one or more sides of the semiconductor die package. The method includes forming an encapsulation layer around the plurality of interconnect structure packages and around the semiconductor die package.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A method, comprising:
forming a plurality of interconnect structure packages,
wherein each of the plurality of interconnect structure packages comprises a plurality of interconnect structures;
attaching the plurality of interconnect structure packages to a carrier substrate;
attaching a semiconductor die package to the carrier substrate such that the plurality of interconnect structure packages are adjacent to one or more sides of the semiconductor die package; and
forming an encapsulation layer around the plurality of interconnect structure packages and around the semiconductor die package,
wherein forming the plurality of interconnect structure packages comprises:
forming a plurality of recesses in a silicon substrate;

forming a plurality of through silicon via (TSV) structures in the plurality of recesses;
dicing the silicon substrate into the plurality of interconnect structure packages after forming the plurality of TSV structures; and
forming, for an interconnect structure package of the plurality of interconnect structure packages, a plurality of conductive connection structures prior to dicing the silicon substrate into the plurality of interconnect structure packages,
wherein the plurality of conductive connection structures are formed on a subset of TSV structures of the plurality of TSV structures associated with the interconnect structure package.
2. The method of claim 1, wherein forming the plurality of interconnect structure packages further comprises:
forming an oxide liner in the plurality of recesses such that sidewalls and bottom surfaces of the plurality of recesses are lined with the oxide liner,
wherein the plurality TSV structures are formed in the plurality of recesses over the oxide liner.
3. The method of claim 1, wherein forming the plurality of interconnect structure packages further comprises:
forming, for the interconnect structure package, a polymer layer around the plurality of conductive connection structures prior to dicing the silicon substrate into the plurality of interconnect structure packages; and
wherein attaching the plurality of interconnect structure packages to the carrier substrate comprises:
placing the interconnect structure package on a die attach film that is over the carrier substrate.
4. The method of claim 3, wherein a release layer is formed between the carrier substrate and the die attach film.
5. The method of claim 1,
wherein attaching the plurality of interconnect structure packages to the carrier substrate comprises:
placing the plurality of conductive connection structures, of the interconnect structure package, into a die attach film that is over the carrier substrate such that the plurality of conductive connection structures are submerged in the die attach film.
6. The method of claim 1, wherein forming the interconnect structure package further comprises performing an annealing operation after forming the plurality of TSV structures to reflow the plurality of TSV structures.
7. The method of claim 1, wherein forming the interconnect structure package further comprises performing an annealing operation after forming the plurality of conductive connection structures to reflow the plurality of conductive connection structures.
8. A method, comprising:
forming an interconnect structure package;
attaching the interconnect structure package to a carrier substrate,
wherein the interconnect structure package comprises a plurality of interconnect structures, and
wherein attaching the interconnect structure package to the carrier substrate comprises securing the interconnect structure package to a die attach film formed on the carrier substrate;
securing a semiconductor die package to the die attach film,
wherein the semiconductor die package is adjacent to a side of the interconnect structure package; and
forming an encapsulation layer around the interconnect structure package and around the semiconductor die package;

US 12,660,656 B2

35
36 wherein forming the interconnect structure package comprises:

forming a release layer on an additional carrier substrate;

forming the plurality of interconnect structures on the release layer; and depositing an additional encapsulation layer on the release layer and around the plurality of interconnect structures.

9. The method of claim 8, wherein forming the interconnect structure package further comprises:

forming a plurality of conductive structures on the plurality of interconnect structures; and depositing a polymer layer on the plurality of conductive structures.

10. The method of claim 9, wherein forming the interconnect structure package further comprises performing an annealing operation after forming the plurality of conductive structures to reflow the plurality of conductive structures.

11. The method of claim 8, wherein the additional encapsulation layer comprises a molding compound.

12. The method claim 8, further comprising forming a redistribution structure over the interconnect structure package, semiconductor die package, and the encapsulation layer.

13. A method, comprising:

forming a plurality of interconnect structure packages;

mounting the plurality of interconnect structure packages on a carrier substrate, wherein the plurality of interconnect structure packages comprise a plurality of interconnect structures;

mounting a semiconductor die package on the carrier substrate adjacent to at least one of the plurality of interconnect structure packages;

depositing an encapsulation layer around the plurality of interconnect structure packages and the semiconductor die package; and forming a redistribution structure over the plurality of interconnect structure packages, semiconductor die package, and the encapsulation layer, wherein forming the plurality of interconnect structure packages comprises:

etching a semiconductor substrate to form a plurality of recesses in the semiconductor substrate;

depositing conductive material in the plurality of recesses to form the plurality of interconnect structures;

forming a plurality of connection structures on the plurality of interconnect structures; and dicing the semiconductor substrate into the plurality of interconnect structure packages after forming the plurality of connection structures.

14. The method of claim 13, wherein the redistribution structure comprises a plurality of metallization structures connected to the plurality of interconnect structures.

15. The method of claim 13, wherein forming the plurality of interconnect structure packages further comprises:

depositing a liner layer on sidewalls and bottom surfaces of the plurality of recesses, wherein the conductive material is deposited in the plurality of recesses on the liner layer.

16. The method of claim 13, wherein mounting the plurality of interconnect structure packages on the carrier substrate and mounting the semiconductor die package on the carrier substrate comprises submerging at least a portion of the plurality of interconnect structure packages and at least a portion of the semiconductor die package in a die attach film, and wherein the die attach film is on the carrier substrate.

17. The method of claim 1, wherein the die attach film is in one of a semi-liquid state or a liquid state when at least the portion of the plurality of interconnect structure packages and at least the portion of the semiconductor die package are submerged in the die attach film.

18. The method of claim 13, wherein forming the plurality of interconnect structure packages further comprises forming a polymer layer around the plurality of connection structures prior to dicing the semiconductor substrate into the plurality of interconnect structure packages.

19. The method of claim 13, wherein forming the plurality of interconnect structure packages further comprises performing an annealing operation after forming the plurality of interconnect structures to reflow the plurality of interconnect structures.

20. The method of claim 13, wherein mounting the plurality of interconnect structure packages on the carrier substrate comprises adhering the plurality of interconnect structure packages to the carrier substrate through a die attach film.

* * * * *